United States Patent
Lai et al.

(10) Patent No.: US 12,040,365 B1
(45) Date of Patent: Jul. 16, 2024

(54) INCORPORATING NITROGEN IN DIPOLE ENGINEERING FOR MULTI-THRESHOLD VOLTAGE APPLICATIONS IN STACKED DEVICE STRUCTURES

(71) Applicant: Taiwan Semiconductor Manufacturing Company, Ltd., Hsin-Chu (TW)

(72) Inventors: Pei Ying Lai, Hsinchu (TW); Cheng-Chieh Lin, Kaohsiung (TW); Hsueh-Ju Chen, Taipei (TW); Tsung-Da Lin, Hsinchu (TW); Cheng-Hao Hou, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/392,150

(22) Filed: Dec. 21, 2023

Related U.S. Application Data

(63) Continuation of application No. 18/521,569, filed on Nov. 28, 2023.
(Continued)

(51) Int. Cl.
*H01L 29/40* (2006.01)
*H01L 21/02* (2006.01)
(Continued)

(52) U.S. Cl.
CPC ...... *H01L 29/401* (2013.01); *H01L 21/02329* (2013.01); *H01L 21/283* (2013.01);
(Continued)

(58) Field of Classification Search
CPC ........ H01L 29/42392; H01L 21/02329; H01L 21/823857; H01L 21/8221; H01L 21/8238;
(Continued)

(56) References Cited

U.S. PATENT DOCUMENTS

| | | | |
|---|---|---|---|
| 2012/0129330 A1* | 5/2012 | Kim ................ | H01L 21/823842 438/591 |
| 2019/0131394 A1* | 5/2019 | Reznicek .......... | H01L 21/30604 |

(Continued)

*Primary Examiner* — Alia Sabur
(74) *Attorney, Agent, or Firm* — Haynes and Boone, LLP

(57) ABSTRACT

Dipole engineering techniques are disclosed that incorporate dipole dopant and/or nitrogen into gate dielectrics (e.g., high-k dielectric layers thereof) to realize multi-threshold voltage transistor tuning of transistors. The dipole engineering techniques include (1) forming a dipole dopant source layer over gate dielectrics of some transistors, but not other transistors, (2) forming a mask over gate dielectrics of some transistors, but not other transistors, (3) performing a nitrogen-containing thermal drive-in process, and (4) removing the dipole dopant source layer and the mask after the nitrogen-containing thermal drive-in process. The nitrogen-containing thermal drive-in process diffuses nitrogen and dipole dopant (n-dipole dopant and/or p-dipole dopant) into unmasked gate dielectrics having the dipole dopant source layer formed thereon, nitrogen into unmasked gate dielectrics, and dipole dopant into masked gate dielectrics having the dipole dopant source layer formed thereon. Masked gate dielectrics without the dipole dopant source layer formed thereon remain undoped.

20 Claims, 28 Drawing Sheets

Related U.S. Application Data

(60) Provisional application No. 63/486,542, filed on Feb. 23, 2023.

(51) Int. Cl.
    *H01L 21/283*     (2006.01)
    *H01L 21/3115*     (2006.01)
    *H01L 21/822*     (2006.01)
    *H01L 21/8234*     (2006.01)
    *H01L 21/8238*     (2006.01)
    *H01L 27/092*     (2006.01)
    *H01L 29/423*     (2006.01)
    *H01L 29/66*     (2006.01)

(52) U.S. Cl.
    CPC ...... *H01L 21/3115* (2013.01); *H01L 21/8221* (2013.01); *H01L 21/823462* (2013.01); *H01L 21/823857* (2013.01); *H01L 27/0922* (2013.01); *H01L 29/42392* (2013.01); *H01L 29/66439* (2013.01)

(58) Field of Classification Search
    CPC ............... H01L 27/092; H01L 27/0922; H01L 21/823462
    See application file for complete search history.

(56) References Cited

U.S. PATENT DOCUMENTS

| | | | | |
|---|---|---|---|---|
| 2021/0183857 A1* | 6/2021 | Hafez | ............... | H01L 29/78696 |
| 2022/0199620 A1* | 6/2022 | Thomas | .......... | H01L 21/823807 |
| 2023/0197728 A1* | 6/2023 | Thomas | .......... | H01L 21/823842 |
| | | | | 257/365 |

* cited by examiner

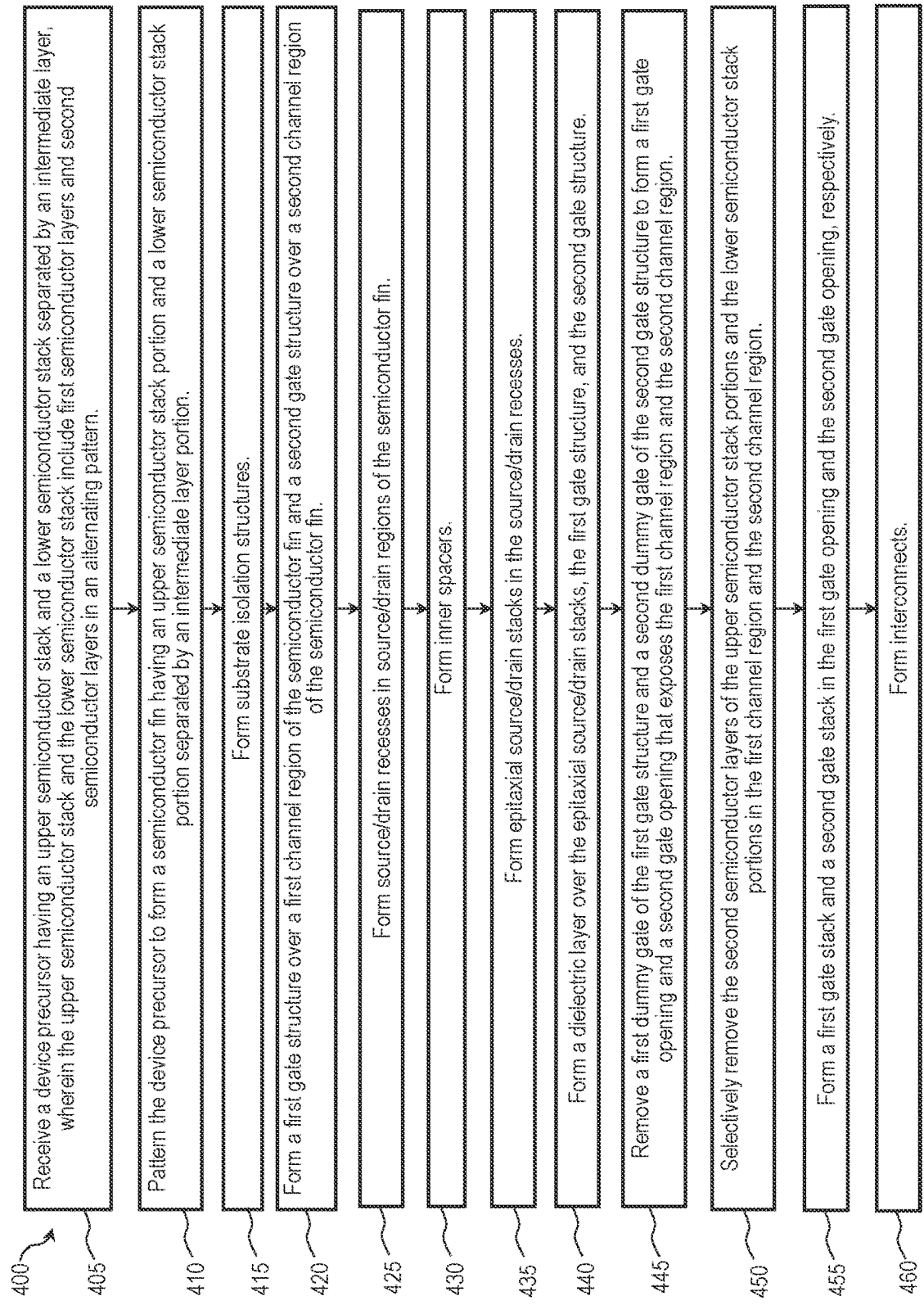

INCORPORATING NITROGEN IN DIPOLE ENGINEERING FOR MULTI-THRESHOLD VOLTAGE APPLICATIONS IN STACKED DEVICE STRUCTURES

This is a continuation application of U.S. patent application Ser. No. 18/521,569, filed Nov. 28, 2023, which is a non-provisional application of and claims benefit of U.S. Provisional Patent Application Ser. No. 63/486,542, filed Feb. 23, 2023, the entire disclosures of which are incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advancement is directed to providing ICs with transistors having multiple threshold voltages (Vt), which can boost performance of some transistors of an IC while reducing power consumption of other transistors of the IC. However, providing multiple threshold voltages has been challenging for multigate devices, such as fin-like field effect transistors, gate-all-around transistors including nanowires and/or nanosheets, and other types of multigate devices, because multigate devices are becoming very small, which leaves minimal room for tuning their threshold voltages using different work function metals. Though dipole engineering may provide multigate devices with multiple threshold voltages while minimizing and/or eliminating the need for using different work function metals, dipole engineering techniques present challenges as device stacking is implemented to realize further scaling. Accordingly, although existing threshold voltage tuning techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7 is a flow chart of a method for fabricating a stacked device structure, such as stacked device structure of FIGS. 1A-1C, according to various aspects of the present disclosure.

DETAILED DESCRIPTION

Figure 1A:
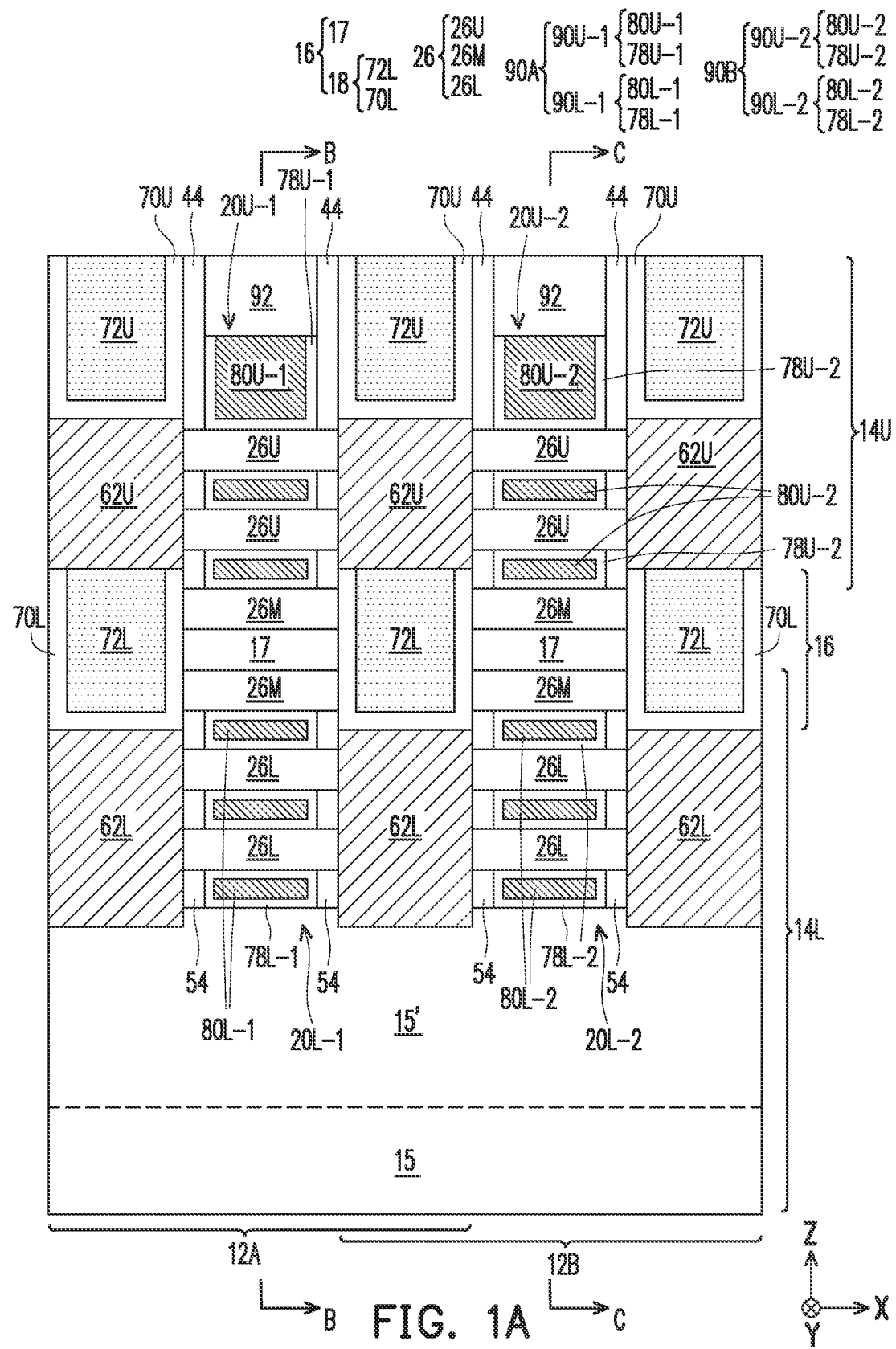
FIG. 1A is a cross-sectional view of a stacked device structure, in portion or entirety, according to various aspects of the present disclosure.

The present disclosure relates generally to stacked device structures, such as transistor stacks having n-type transistors and p-type transistors (i.e., complementary field effect transistors (CFETs)), and more particularly, to methods for tuning threshold voltages (including dipole engineering techniques) of transistors of stacked device structures.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Stacked transistor structures provide further density reduction for advanced integrated circuit (IC) technology nodes (particularly as they advance to 3 nm (N3) and below), especially when the stacked transistor structures include multigate devices, such as fin-like field effect transistors (FinFETs), gate-all-around (GAA) transistors including nanowires and/or nanosheets, other types of multigate devices, etc. Stacked transistor structures vertically stack transistors. For example, a transistor stack may include a first transistor (e.g., a top transistor) disposed over a second transistor (e.g., a bottom transistor). The transistor stack provides a complementary field effect transistor (CFET) when the first transistor and the second transistor are of opposite conductivity type (i.e., an n-type transistor and a p-type transistor).

An IC may include numerous transistor stacks. Providing the IC with transistors having multiple threshold voltages (Vt) can maximize its performance and/or reliability, for example, by boosting speed/performance of some transistors of the IC while reducing power consumption of other transistors of the IC. However, providing multigate devices with multiple threshold voltages is challenging because multigate devices are becoming very small, which leaves minimal room for tuning their threshold voltages using different work function metals. Dipole engineering may flexibly provide multigate devices with different threshold voltages by incorporating dipole dopants into gate dielectrics thereof and minimize and/or eliminate the need for using different work function metals. This may obviate the need of patterning work function metals, making dipole engineering very suitable for nano-sized transistors, such as FinFETs and GAA transistors. Although existing dipole engineering techniques have been generally adequate for their intended purposes, they have not been entirely satisfactory in all respects.

The present disclosure provides volume-less dipole engineering techniques that incorporate dipole dopant and/or nitrogen into gate dielectrics (e.g., high-k dielectric layers thereof) to realize multi-threshold voltage tuning of transistors. According to various aspects of the present disclosure, dipole engineering techniques disclosed herein include (1) forming a dipole dopant source layer over gate dielectrics of some transistors, but not other transistors, (2) forming a nitrogen-blocking mask over gate dielectrics of some transistors, but not other transistors, (3) performing a nitrogen-containing thermal drive-in process (e.g., a dipole drive-in anneal), and (4) removing the dipole dopant source layer and the nitrogen-blocking mask after the nitrogen-containing thermal drive-in process. The nitrogen-containing thermal drive-in process diffuses nitrogen and dipole dopant into unmasked gate dielectrics having the dipole dopant source layer formed thereon, nitrogen into unmasked gate dielectrics, and dipole dopant into masked gate dielectrics having the dipole dopant source layer formed thereon. Masked gate dielectrics without the dipole dopant source layer formed thereon remain undoped. Further, because providing the gate dielectrics with different compositions (e.g., different dipole dopant concentrations and/or different nitrogen concentrations) may provide transistors with different threshold voltages, gate electrodes of the transistors may include a same work function metal. For example, p-type transistors and n-type transistors may have gate dielectrics with different compositions and/or configurations but gate electrodes with the same compositions and/or configurations (e.g., the gate electrodes of both the p-type transistors and the n-type transistors may include a p-type work function layer or an n-type work function). This may obviate the need of patterning work function metals, making the disclosed dipole engineering techniques very suitable for nano-sized transistors, such as FinFETs and GAA transistors. Different embodiments may have different advantages, and no particular advantage is required of any embodiment. Details of improved gate stacks for transistors of stacked device structures and methods of fabrication and/or design thereof are described herein.

Figure 1B:
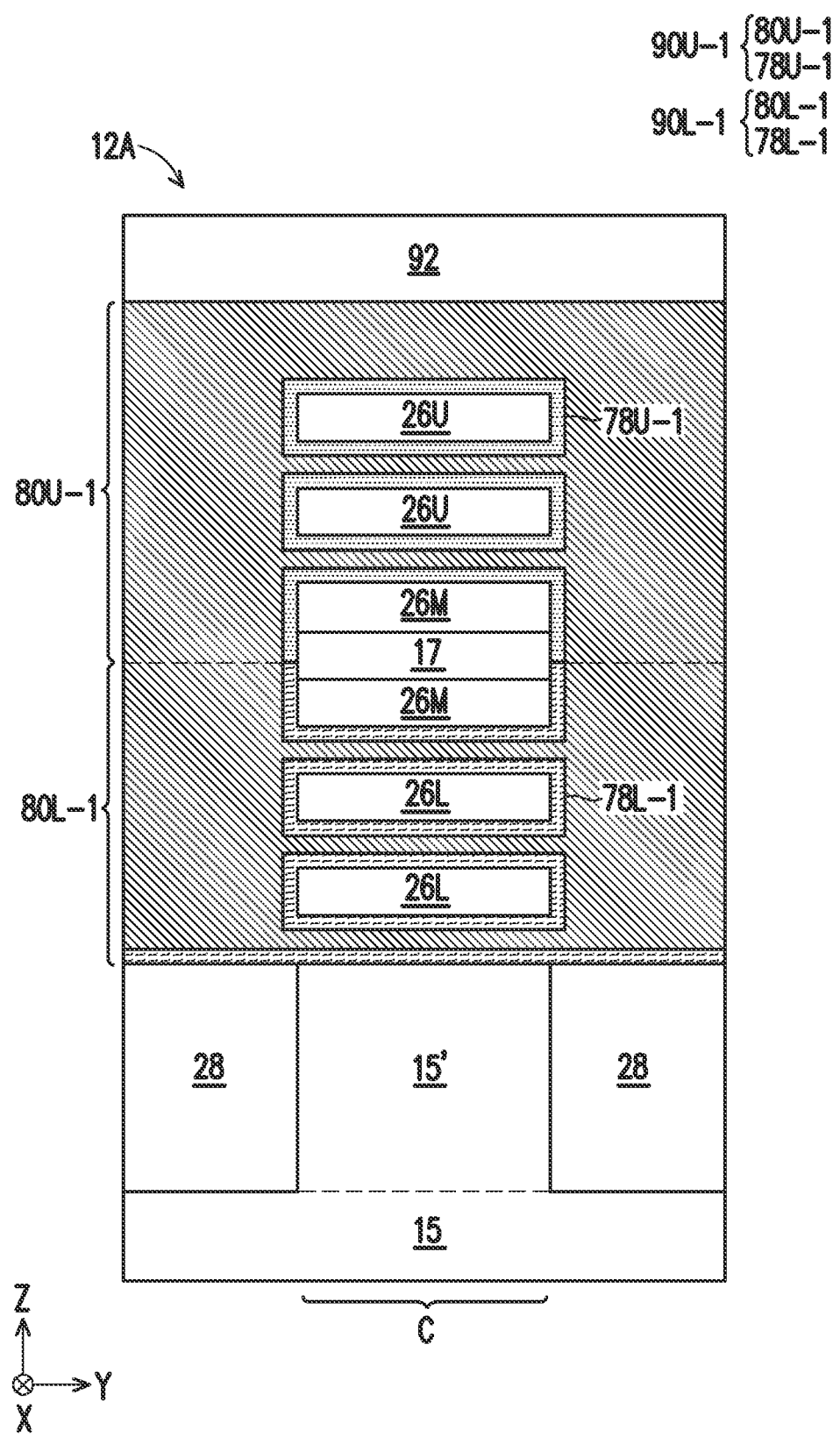
FIG. 1B and FIG. 1C are cross-sectional views of the stacked device structure of FIG. 1A, in portion or entirety, according to various aspects of the present disclosure.
Figure 1C:
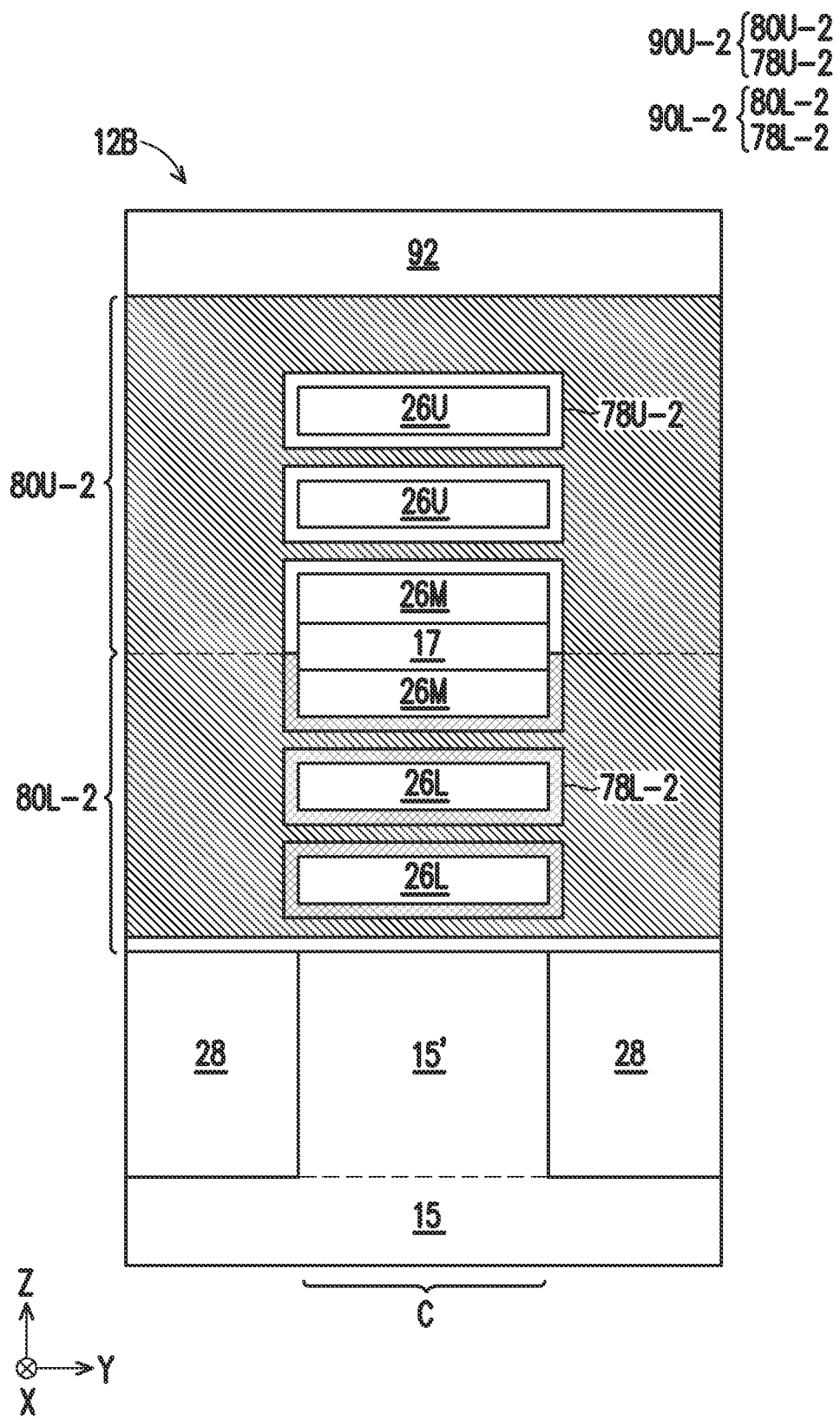

FIG. 1A is a cross-sectional view of a stacked device structure 10, in portion or entirety, according to various aspects of the present disclosure. FIG. 1B and FIG. 1C are cross-sectional views of stacked device structure 10, in portion or entirety, along line B-B and line C-C, respectively, of FIG. 1A according to various aspects of the present disclosure. Stacked device structure 10 includes a device stack 12A and a device stack 12B. Device stack 12A and device stack 12B each include a respective upper device 14U vertically stacked over a respective lower device 14L. Device 14U and device 14L are disposed over a substrate 15, and an isolation structure 16 is disposed between and separates device 14U and device 14L. Isolation structure 16 includes isolation structures 17 and insolation structures 18. In some embodiments, device 14U and device 14L are stacked back-to-front. For example, as described further below, isolation structure 16 (e.g., isolation structures 17 thereof) may bond and/or attach a backside of device 14U to a frontside of device 14L, and isolation structure 16 may be referred to as a bonding layer/structure. In some embodiments, stacked device structure 10 is fabricated monolithically and may be referred to as a monolithic stacked device structure. In some embodiments, stacked device structure 10 is fabricated sequentially and may be referred to as a sequential stacked device structure. FIGS. 1A-1C has been simplified for the sake of clarity to better understand the inventive concepts of the present disclosure. Additional features may be added in stacked device structure 10, and some of the features described below may be replaced, modified, or eliminated in other embodiments of stacked device structure 10.

In FIGS. 1A-1C, devices 14U and devices 14L include at least one electrically functional device. For example, device stack 12A is a transistor stack having an upper transistor 20U-1 and a lower transistor 20L-1, and device stack 12B is a transistor stack having an upper transistor 20U-2 and a lower transistor 20L-2. Transistor 20U-1 may be separated and/or electrically isolated from transistor 20L-1 by isolation structure 16, and transistor 20U-2 may be separated and/or electrically isolated from transistor 20L-2 by isolation structure 16. In the depicted embodiment, transistor 20U-1 and transistor 20L-1 are of an opposite conductivity type, and transistor 20U-2 and transistor 20L-2 are of an opposite conductivity type. For example, transistor 20U-1 and transistor 20U-2 are p-type transistors, and transistor 20L-1 and transistor 20L-2 are n-type transistors, or vice versa. In such embodiments, transistor 20U-1 and transistor 20L-1 form a first CFET (e.g., device stack 12A may be referred to as the first CFET), and transistor 20U-2 and transistor 20L-2 form a second CFET (e.g., device stack 12B may be referred to as the second CFET). In some embodiments, transistor 20U-1 and transistor 20L-1 are of a same conductivity type, and/or transistor 20U-2 and transistor 20L-2 are of a same conductivity type. For example, transistor 20U-1 and transistor 20L-1 and/or transistor 20U-2 and transistor 20L-2 are of both n-type transistors or both p-type transistors.

Devices 14U include various features and/or components, such as semiconductor layers 26U, semiconductor layers 26M, gate spacers 44, inner spacers 54, epitaxial source/drains 62U, a contact etch stop layer (CESL) 70U, an interlayer dielectric (ILD) layer 72U, gate dielectrics (e.g., a gate dielectric 78U-1 and a gate dielectric 78L-1), gate electrodes (e.g., a gate electrode 80U-1 and a gate electrode 80L-1), and hard masks 92. Gate dielectric 78U-1 and gate electrode 80U-1 collectively form an upper gate stack 90U-1, and gate dielectric 78L-1 and gate electrode 80L-1 collectively form a lower gate stack 90L-1. Gate stack 90U-1 and gate stack 90L-1 are collectively referred to as a gate 90A of device stack 12A, and gate 90A may provide a metal gate or a high-k/metal gate of the first CFET. Gate stack 90U-1 is separated from gate stack 90L-1 by a respective isolation structure 17 (and semiconductor layers 26M, in the depicted embodiment), and epitaxial source/drains 62U of devices 14U are separated from epitaxial source/drains 62L of devices 14L by isolation structures 18.

Devices 14L include various features and/or components, such as mesas 15' (e.g., extensions of substrate 15), semiconductor layers 26L, semiconductor layers 26M, substrate isolation structures 28, inner spacers 54, epitaxial source/drains 62L, a CESL 70L, an ILD layer 72L, gate dielectrics (e.g., a gate dielectric 78U-2 and a gate dielectric 78L-2), and gate electrodes (e.g., a gate electrode 80U-2 and a gate electrode 80L-2). Gate dielectric 78U-2 and a gate electrode 80U-2 collectively form an upper gate stack 90U-2, and gate dielectric 78L-2 and gate electrode 80L-2 collectively form a lower gate stack 90L-2. Gate stack 90U-2 and gate stack 90L-2 are collectively referred to as a gate 90B of device stack 12B, and gate 90B may provide a metal gate or a high-k/metal gate of the second CFET. Gate stack 90U-2 is separated from gate stack 90L-2 by a respective isolation structure 17 (and semiconductor layers 26M, in the depicted embodiment), and epitaxial source/drains 62L of devices 14L are separated from epitaxial source/drains 62U of devices 14L by isolation structures 18.

Transistor 20L-1 and transistor 20L-2 are configured as GAA transistors. For example, each of transistor 20L-1 and transistor 20L-2 has two channels (for example, nanowires, nanosheets, nanobars, etc.) provided by semiconductor layers 26L (also referred to as channel layers or channels), which are suspended over substrate 15 and extend between respective source/drains, such as epitaxial source/drains 62L. In some embodiments, transistor 20L-1 and/or transistor 20L-2 includes more or less channels (and thus more or less semiconductor layers 26L). Transistor 20L-1 has gate stack 90L-1 disposed over its semiconductor layers 26L and between its epitaxial source/drains 62L, and transistor 20L-2 has gate stack 90L-2 disposed over its semiconductor layers 26L and between its epitaxial source/drains 62L. Along a gate widthwise direction (FIG. 1A), gate stack 90L-1 and gate stack 90L-2 are over a respective top semiconductor layer 26L, between respective semiconductor layers 26L, and between a respective bottom semiconductor layer 26L and substrate 15 (e.g., mesa 15' thereof). Along a gate lengthwise direction (FIG. 1B and FIG. 1C), gate stack 90L-1 and gate stack 90L-2 wrap around respective semiconductor layers 26L. During operation of the GAA transistors, current may flow through respective semiconductor layers 26L and between respective epitaxial source/drains 62L. In the depicted embodiment, transistor 20L-1 and transistor 20L-2 have a common epitaxial source/drain 62L, such as middle epitaxial source/drain 62L depicted in FIG. 1A. In some embodiments, transistor 20L-1 and transistor 20L-2 do not have a common epitaxial source/drain 62L. Each of transistor 20L-1 and transistor 20L-2 further has semiconductor layers 26M (also referred to as dummy channel layers or dummy channels) suspended over substrate 15 and extending between respective isolation structures 18. A respective isolation structure 17 is disposed between semiconductor layers 26M of transistor 20L-1 and transistor 20U-1, and a respective isolation structure 17 is disposed between semiconductor layers 26M of transistor 20L-2 and transistor 20U-2. Further, each of transistor 20L-1 and transistor 20L-2 has inner spacers 54 disposed between its gate stack (e.g., gate stack 90L-1 or gate stack 90L-2) and its epitaxial source/drains 62L.

Transistor 20U-1 and transistor 20U-2 are also configured as GAA transistors. For example, each of transistor 20U-1 and transistor 20U-2 has two channels (for example, nanowires, nanosheets, nanobars, etc.) provided by semiconductor layers 26U (also referred to as channel layers or channels), which are suspended over substrate 15 and extend between respective source/drains, such as epitaxial source/drains 62U. In some embodiments, transistor 20U-1 and/or transistor 20U-2 includes more or less channels (and thus more or less semiconductor layers 26U). Transistor 20U-1 has gate stack 90U-1 disposed over its semiconductor layers 26U and between its epitaxial source/drains 62U, and transistor 20U-2 has gate stack 90U-2 disposed over its semiconductor layers 26U and between its epitaxial source/drains 62U. Along a gate widthwise direction (FIG. 1A), gate stack 90U-1 and gate stack 90U-2 are over a respective top semiconductor layer 26U, between respective semiconductor layers 26U, and between a respective bottom semiconductor layer 26U and a respective semiconductor layer 26M. Along a gate lengthwise direction (FIG. 1B and FIG. 1C), gate stack 90U-1 and gate stack 90U-2 wrap around respective semiconductor layers 26U. During operation of the GAA transistors, current may flow through respective semiconductor layers 26U and between respective epitaxial source/drains 62U. In the depicted embodiment, transistor 20U-1 and transistor 20U-2 have a common epitaxial source/drain 62U, such as middle epitaxial source/drain 62U depicted in FIG. 1A. In some embodiments, transistor 20U-1 and transistor 20U-2 do not have a common epitaxial source/drain 62U. Further, each of transistor 20U-1 and transistor 20U-2 has gate spacers 44 disposed along sidewalls of an upper portion of its gate stack (e.g., gate stack 90L-1 or gate stack 90L-2), inner spacers 54 disposed between its gate stack and its epitaxial source/drains 62U, and hard masks 92 disposed over its gate stack and between its gate spacers 44. Hard masks 92 may be considered a portion of the gate stacks.

Isolation structure 16 has isolation structures 17 and isolation structures 18 between channel regions and source/drain regions, respectively, of devices 14L and devices 14U. For example, isolation structures 17 are between channel regions of lower transistors (e.g., transistor 20L-1) and channel regions of upper channels (e.g., transistor 20U-1) (e.g., between channels and/or gates thereof), and isolation structures 18 are between source/drain regions of lower transistors (e.g., transistor 20L-1) and source/drain regions of upper channels (e.g., transistor 20U-1). In the depicted embodiment, isolation structures 17 are between semiconductor layers 26M of lower transistors and upper transistors, and isolation structures 18 are between epitaxial source/drains 62L of lower transistors and epitaxial source/drains 62U of upper transistors. Accordingly, isolation structures 17 may provide electrical isolation of channels and/or gates of stacked devices, and isolation structures 18 may provide electrical isolation of source/drains of stacked devices. Isolation structures 17 and isolation structures 18 may include a single layer or multiple layers. Isolation structures 17 and isolation structures 18 include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). Isolation structures 17 and isolation structures 18 may include the same or different materials and/or configurations. In the depicted embodiment, a thickness of isolation structures 17 is less than a thickness of isolation structures 18, and a configuration of isolation structures 17 is different than a configuration of isolation structures 18. In some embodiments, isolation structures 18 include CESL 70L and ILD layer 72L, such as depicted (i.e., each isolation structure 18 is formed by a respective portion of CESL 70L and a respective portion of ILD layer 72L).

Substrate 15, semiconductor layers 26U, semiconductor layers 26M, and semiconductor layers 26L include an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 15 semiconductor layers 26U, semiconductor layers 26M, and semiconductor layers 26L include silicon. In some embodiments, semiconductor layers 26U and semiconductor layers 26L include different semiconductor materials, such as silicon and silicon germanium, respectively, or vice versa. In such embodiments, semiconductor layers 26M of upper transistors and semiconductor layers 26M of lower transistors may include different materials. In some embodiments, substrate 15 is a semiconductor-on-insulator substrate, such as a silicon-on-insulator substrate, a silicon germanium-on-insulator substrate, or a germanium-on-insulator substrate. Substrate 15 (including mesas 15' extending therefrom) may include various doped regions, such as p-wells and n-wells. The n-wells are doped with n-type dopants, such as phosphorus, arsenic, other n-type dopant, or a combination thereof. The p-wells are doped with p-type dopants, such as boron, indium, other p-type dopant, or a combination thereof. In some embodiments, semiconductor layers 26U, semiconductor layers 26M, and semiconductor layers 26L, or a combination thereof include p-type dopants, n-type dopants, or a combination thereof. For ease of description herein, semiconductor layers 26U, semiconductor layers 26M, and semiconductor layers 26L may be referred to collectively as semiconductor layers 26.

Substrate isolation structures 28 electrically isolate active device regions and/or passive device regions. For example, substrate isolation structures 28 separate and electrically isolate an active region of device stack 12A, such as mesa 15' and/or epitaxial source/drains 62L thereof, from other device regions and/or devices. Substrate isolation structures 28 includes silicon oxide, silicon nitride, silicon oxynitride, other suitable isolation material (including, silicon, oxygen, nitrogen, carbon, other suitable isolation constituent, or a combination thereof), or a combination thereof. Substrate isolation structures 28 may have a multilayer structure. For example, substrate isolation structures 28 include a bulk dielectric (e.g., an oxide layer) over a dielectric liner (e.g., silicon nitride, silicon oxide, silicon oxynitride, silicon oxycarbonitride, or a combination thereof). In another example, substrate isolation structures 28 include a bulk dielectric over a doped liner, such as a boron silicate glass (BSG) liner and/or a phosphosilicate glass (PSG) liner. Dimensions and/or characteristics of substrate isolation structures 28 are configured to provide shallow trench isolation (STI) structures, deep trench isolation (DTI) structures, local oxidation of silicon (LOCOS) structures, other suitable isolation structures, or a combination thereof. In FIGS. 1A-1C, substrate isolation structures 28 may be STIs.

Gate spacers 44 are disposed along sidewalls of top portions of upper gate stacks (e.g., gate stack 90U-1 and gate stack 90U-2), inner spacers 54 are disposed under gate spacers 44 along sidewalls of upper gate stacks 90U and/or lower gate stacks (e.g., gate stack 90L-1 and gate stack 90L-2), and fin/mesa spacers may be disposed along sidewalls of mesas 15'. Inner spacers 54 are between semiconductor layers 26U, between semiconductor layers 26L, between bottom semiconductor layers 26U and semiconductor layers 26M, between top semiconductor layers 26L and semiconductor layers 26M, and between bottom semiconductor layers 26M and mesas 15'. Gate spacers 44, inner spacers 54, and fin spacers include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). Gate spacers 44, inner spacers 44, and fin spacers may include different materials and/or different configurations (e.g., different numbers of layers). In some embodiments, gate spacers 44, inner spacers 54, fin spacers, or a combination thereof have a multilayer structure. In some embodiments, gate spacers 44 and/or fin spacers include more than one set of spacers, such as seal spacers, offset spacers, sacrificial spacers, dummy spacers, main spacers, or a combination thereof. The various sets of spacers may have different compositions.

Each of gate 90A and gate 90B is disposed between respective epitaxial source/drain stacks. Each epitaxial source/drain stack includes a respective epitaxial source/drain 62U, a respective epitaxial source/drain 62L, and a respective insolation structure 18 therebetween. Epitaxial source/drains 62L and epitaxial source/drains 62U may be doped with n-type dopants and/or p-type dopants. In some embodiments, epitaxial source/drains 62L and/or epitaxial source/drains 62U include silicon doped with carbon, phosphorous, arsenic, other n-type dopant, or a combination thereof (e.g., Si:C epitaxial source/drains, Si:P epitaxial source/drains, or Si:C:P epitaxial source/drains). In some embodiments, epitaxial source/drains 62L and/or epitaxial source/drains 62U include silicon germanium or germanium, which is doped with boron, other p-type dopant, or a combination thereof (e.g., Si:Ge:B epitaxial source/drains). Epitaxial source/drains 62L and epitaxial source/drains 62U may have the same or different compositions and/or materials depending on configurations of their respective transistors. For example, where upper transistors are PFETs and lower transistors are NFETs, such as in the depicted embodiment, epitaxial source/drains 62L may include silicon doped with phosphorous and/or carbon, and epitaxial source/drains 62U may include silicon germanium doped with boron. In some embodiments, epitaxial source/drains 62L and/or epitaxial source/drains 62U include more than one epitaxial semiconductor layer, where the epitaxial semiconductor layers may include the same or different materials and/or the same or different dopant concentrations. In some embodiments, epitaxial source/drains 62L and/or epitaxial source/drains 62U include materials and/or dopants that achieve desired tensile stress and/or compressive stress in adjacent channel regions (e.g., formed by semiconductor layers 26U and semiconductor layers 26L). As used herein, source/drain region, epitaxial source/drain, epitaxial source/drain feature, etc. may refer to a source of a device (e.g., transistor 20U-1, transistor 20L-1, transistor 20U-2, or transistor 20L-2), a drain of a device (e.g., transistor 20U-1, transistor 20L-1, transistor 20U-2, or transistor 20L-2), or a source and/or a drain of multiple devices.

ILD layer 72U and ILD layer 72L include a dielectric material including, for example, silicon oxide, carbon doped silicon oxide, silicon nitride, silicon oxynitride, tetraethyl orthosilicate (TEOS)-formed oxide, BSG, PSG, borophosphosilicate glass (BPSG), fluorosilicate glass (FSG), xerogel, aerogel, amorphous fluorinated carbon, parylene, benzocyclobutene-based (BCB) dielectric material, polyimide, other suitable dielectric material, or a combination thereof. In some embodiments, ILD layer 72U and/or ILD layer 72L include a dielectric material having a dielectric constant that is less than a dielectric constant of silicon dioxide (e.g., k<3.9). In some embodiments, ILD layer 72U and/or ILD layer 72L includes a dielectric material having a dielectric constant that is less than about 2.5 (i.e., an extreme low-k (ELK) dielectric material), such as porous silicon oxide, silicon carbide, carbon-doped oxide (e.g., an SiCOH-based material (having, for example, Si—CH$_3$ bonds)), or a combination thereof, each of which is tuned/configured to have a dielectric constant less than about 2.5. CESL 70L and CESL 70U include a dielectric material that is different than the dielectric material of ILD layer 72U and ILD layer 72L, respectively. For example, where ILD layer 72U and ILD layer 72L include a low-k dielectric material (e.g., porous silicon oxide), CESL 70L and CESL 70U may include silicon and nitrogen and/or carbon, such as silicon nitride, silicon carbonitride, or silicon oxycarbonitride. In some embodiments, CESL 70L and/or CESL 70U may include metal and oxygen, nitrogen, carbon, or a combination thereof. ILD layer 72U, ILD layer 72L CESL 70L, CESL 70U, or a combination thereof may have a multilayer structure.

Gate dielectric 78U-1, gate dielectric 78L-1, gate dielectric 78U-2, and gate dielectric 78L-2 each include at least one dielectric gate layer, such as interfacial layers and/or high-k dielectric layers, which are described further below. Gate electrode 80U-1, gate electrode 80L-1, gate electrode 80U-2, and gate electrode 80L-2 each include at least one electrically conductive gate layer, such as a work function layer, a metal fill (bulk) layer, additional layers (e.g., a barrier layer and/or one or more capping layers), or a combination thereof, which are described further below. In the depicted embodiment, gate electrode 80U-1, gate electrode 80L-1, gate electrode 80U-2, and gate electrode 80L-2 include each include a work function layer. The work function layer includes work function metal(s) and/or alloys thereof, such as Ti, Ta, Al, Ag, Mn, Zr, W, Ru, Mo, TiC, TiAl, TiAlC, TiAlSiC, TaC, TaCN, TaSiN, TiSiN, TiN, TaN, TaSN, WN, WCN, ZrSi$_2$, MoSi$_2$, TaSi$_2$, NiSi$_2$, TaAl, TaAlC, TaSiAlC, TiAlN, or a combination thereof. In some embodiments, the work function layer of gate electrode 80U-1, gate electrode 80L-1, gate electrode 80U-2, and gate electrode 80L-2 is a same type of work function layer (e.g., n-metal or p-metal). In some embodiments, gate electrode 80U-1 and gate electrode 80U-2 each include a first work function layer, and gate electrode 80L-1 and gate electrode 80L-2 each include a second work function layer. The first work function layer and the second work function layer may include different type work function layers (e.g., p-metal and n-metal, respectively). In some embodiments, the metal fill layer includes Al, W, Cu, Ti, Ta, TiN, TaN, polysilicon, other metal(s), alloys thereof, or a combination thereof. In some embodiments, the barrier layer includes a material that prevents or eliminates diffusion and/or reaction of constituents between adjacent layers and/or promotes adhesion between adjacent layers, such as between the work function layer and the metal layer. The barrier layer may include metal and nitrogen, such as titanium nitride, tantalum nitride, tungsten nitride (e.g., W$_2$N), titanium silicon nitride (TiSiN), tantalum silicon nitride (TaSiN), other suitable metal nitride, or a combination thereof.

Hard masks 92 include a material that is different than ILD layer 72U and/or subsequently formed ILD layers to achieve etch selectivity during subsequent etching processes. In some embodiments, hard masks 92 include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or a combination thereof. In some embodiments, hard masks 92 include metal and oxygen and/or nitrogen, such as aluminum oxide (e.g., AlO or Al$_2$O$_3$), aluminum nitride (e.g., AlN), aluminum oxynitride (e.g., AlON), zirconium oxide, zirconium nitride, hafnium oxide (e.g., HfO or HfO$_2$), zirconium aluminum oxide (e.g., ZrAlO), other metal oxide, other metal nitride, or a combination thereof.

FIGS. 2A-2J are cross-sectional views of a stacked device structure, such as stacked device structure 10 of FIGS. 1A-1C, in portion or entirety, at various stages of a method for fabricating gates thereof, such as gate 90A and gate 90B, according to various aspects of the present disclosure. The method for fabricating gates described with reference to FIGS. 2A-2J implements a dipole engineering technique (FIGS. 2B-2I) that achieves different threshold voltages for multiple transistors by incorporating dipole dopant and/or nitrogen into gate dielectrics thereof. For example, the disclosed dipole engineering technique may provide four transistors (e.g., transistor 20U-1, transistor 20L-1, transistor 20U-2, and transistor 20L-2) with different threshold voltages. The cross-sectional views of FIGS. 2A-2J are taken (cut) along a gate lengthwise direction (e.g., a y-direction), like the cross-sectional views of FIG. 1B and FIG. 1C, and the cross-sectional views may be referred to as y-cut views. FIGS. 2A-2J have been simplified for the sake of clarity to better understand the inventive concepts of the present disclosure. For example, because the method for fabricating the gates is described with reference to forming the gates around channel layers (i.e., semiconductor layers 26U and semiconductor layers 26L), some features of stacked device structure 10 are omitted in FIG. 2A-2J, such as semiconductor layers 26M, isolation structures 17 therebetween, mesas 15', substrate isolation structures 28, and substrate 15. Additional features may be added in stacked device structure 10 of FIGS. 2A-2J, and some of the features described below can be replaced, modified, or eliminated in other embodiments of stacked device structure 10 of FIGS. 2A-2J.

Figure 2A:
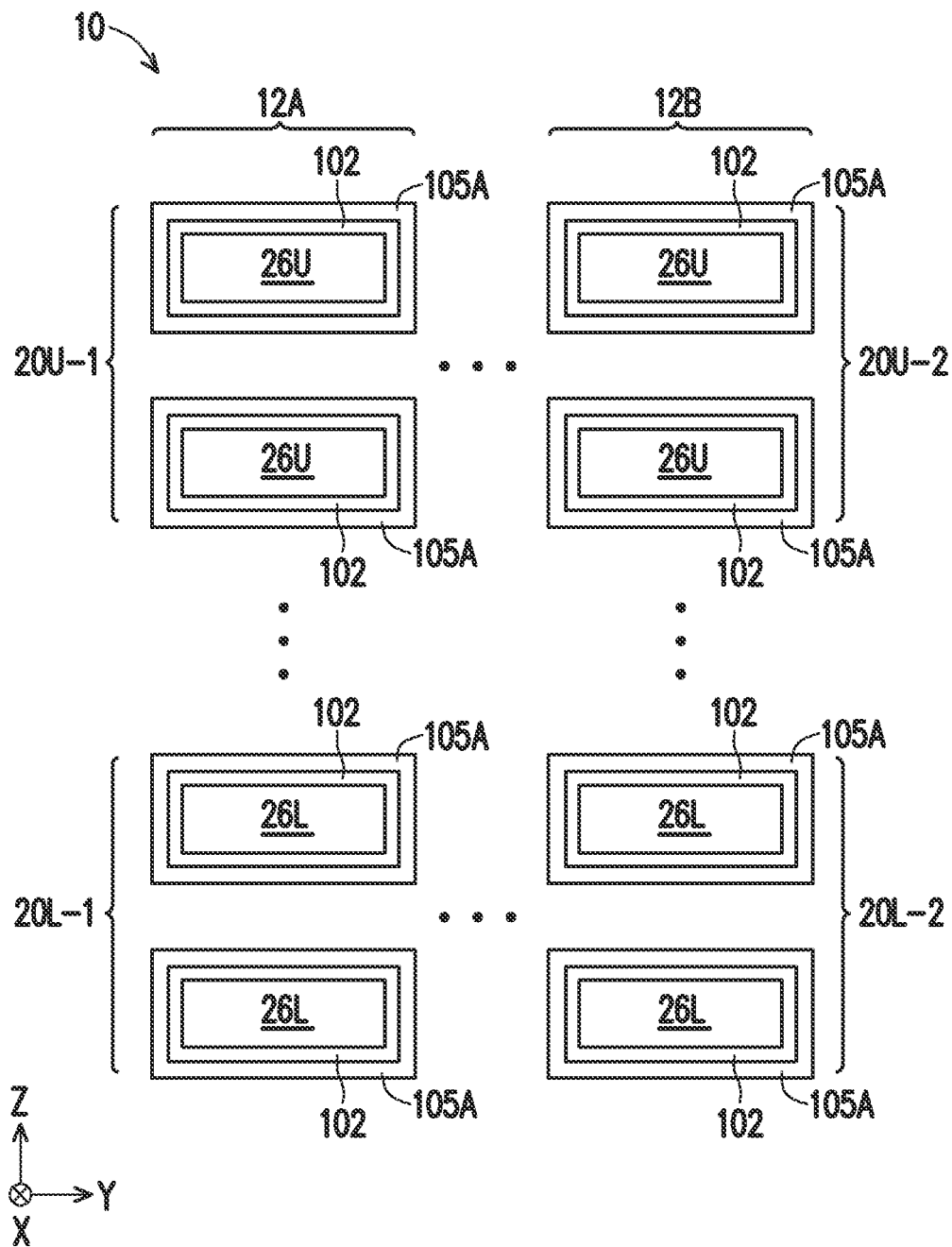
FIGS. 2A-2J are cross-sectional views of a stacked device structure, such as the stacked device structure of FIGS. 1A-1C, in portion or entirety, at various stages of a method for fabricating gates thereof, according to various aspects of the present disclosure.

Referring to FIG. 2A, interfacial layers 102 may be formed over semiconductor layers 26U and semiconductor layers 26L. Interfacial layers 102 surround semiconductor layers 26U and semiconductor layers 26L, and interfacial layers 102 cover tops of mesas 15'. In some embodiments, interfacial layers 102 wrap tops of mesas 15', such as where tops of substrate isolation structures 28 are lower than tops of mesas 15'. In the X-Z plane (e.g., FIG. 1A), interfacial layers 102 may cover tops and bottoms of semiconductor layers 26U, tops and bottoms of semiconductor layers 26L, and tops of mesas 15'. Interfacial layers 102 are formed by thermal oxidation, chemical oxidation, atomic layer deposition (ALD), chemical vapor deposition (CVD), other suitable process, or a combination thereof. In some embodiments, interfacial layers 102 form on semiconductor surfaces (e.g., semiconductor layers 26), but not dielectric surfaces (e.g., substrate isolation structures 28 and/or isolation structures 17). In some embodiments, interfacial layers 102 are formed during a gate replacement process, interfacial layers 102 partially fill gate openings (e.g., a first gate opening in device stack 12A and a second gate opening in device 12B, each of which exposes respective semiconductor layers 26), and interfacial layers 102 partially fill gaps between semiconductor layers 26 and/or gaps between semiconductor layers 26 and mesas 15'. In some embodiments, interfacial layers 102 may be formed over and wrap semiconductor layers 26M, which are separated by isolation structures 17. In such embodiments, interfacial layers 102 are not formed on isolation structures 17.

Interfacial layers 102 include a dielectric material, such as $SiO_2$, $SiGeO_x$, HfSiO, SiON, other dielectric material, or a combination thereof. In some embodiments, interfacial layers 102 are group IV-based oxide layers, which generally refer to oxides of a group IV-based material (i.e., a material that includes at least one group IV element, such as Si, Ge, C, etc.). In some embodiments, interfacial layers 102 are group III-V-based oxide layers, which generally refer to oxides of a group III-V-based material (i.e., a material that includes at least one group III element, such as Al, Ga, In, B, etc., and at least one group V element, such as N, P, As, Sb, etc.). In some embodiments, a thickness of interfacial layers 102 is about 0.5 nm to about 2 nm. In the depicted embodiment, interfacial layers 102 have a substantially uniform thickness.

In FIG. 2A, high-k dielectric layers 105A are also formed over semiconductor layers 26U and semiconductor layers 26L. In the depicted embodiment, high-k dielectric layers 105A are formed over interfacial layers 102, and high-k dielectric layers 105A are formed over semiconductor layers 26U and semiconductor layers 26L of both device stack 12A and device stack 12B. Transistor 20U-1, transistor 20L-1, transistor 20U-2, and transistor 20L-2 thus each include a respective interfacial layer 102 and a respective high-k dielectric layer 105A. High-k dielectric layers 105A surround semiconductor layers 26U and semiconductor layers 26L, and high-k dielectric layers 105A cover tops of mesas 15'. In some embodiments, high-k dielectric layers 105A wrap tops of mesas 15'. In the X-Z plane (e.g., FIG. 1A), high-k dielectric layers 105A may cover tops and bottoms of semiconductor layers 26U, tops and bottoms of semiconductor layers 26L, and tops of mesas 15'. Further, in the X-Z plane, high-k dielectric layers 105A formed over topmost semiconductor layers 26U may have a u-shaped profile. High-k dielectric layers 105A are formed by ALD, CVD, physical vapor deposition (PVD), an oxide-based deposition process, other suitable process, or a combination thereof. In some embodiments, high-k dielectric layers 105A are formed during a gate replacement process, high-k dielectric layers 105A partially fill gate openings (e.g., the first gate opening in device stack 12A and the second gate opening in device 12B), and high-k dielectric layers 105A partially fill gaps between semiconductor layers 26 and/or gaps between semiconductor layers 26 and mesas 15'. In some embodiments, high-k dielectric layers 105A may be formed over and wrap semiconductor layers 26M, which are separated by isolation structures 17. In such embodiments, high-k dielectric layers 105A may also be formed on isolation structures 17, such that high-k dielectric layers 105A surround middle portions of channel stacks, which may include a respective isolation structure 17 disposed between respective semiconductor layers 26M.

High-k dielectric layers 105A have a substantially uniform thickness, and a thickness of high-k dielectric layers 105A is greater than a thickness of interfacial layers 102. In some embodiments, a thickness of high-k dielectric layers 105A is about 1 nm to about 5 nm. High-k dielectric layers 105A include a high-k dielectric material, which generally refers to dielectric materials having a dielectric constant that is greater than a dielectric constant of silicon dioxide (k≈3.9), such as $HfO_2$, HfSiO, $HfSiO_4$, HfSiON, HfLaO, HfTaO, HfSiO, HfZrO, $HfAlO_x$, ZrO, $ZrO_2$, $ZrSiO_2$, AlO, AlSiO, $Al_2O_3$, TiO, $TiO_2$, LaO, LaSiO, $LaO_3$, $La_2O_3$, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, $HfO_2$—$Al_2O_3$, other high-k dielectric material, or a combination thereof. In some embodiments, high-k dielectric layers 105A are hafnium-based oxide (e.g., $HfO_2$) layers or zirconium-based oxide (e.g., $ZrO_2$) layers. In some embodiments, high-k dielectric layers 105A have multilayer structures.

Figure 2B:
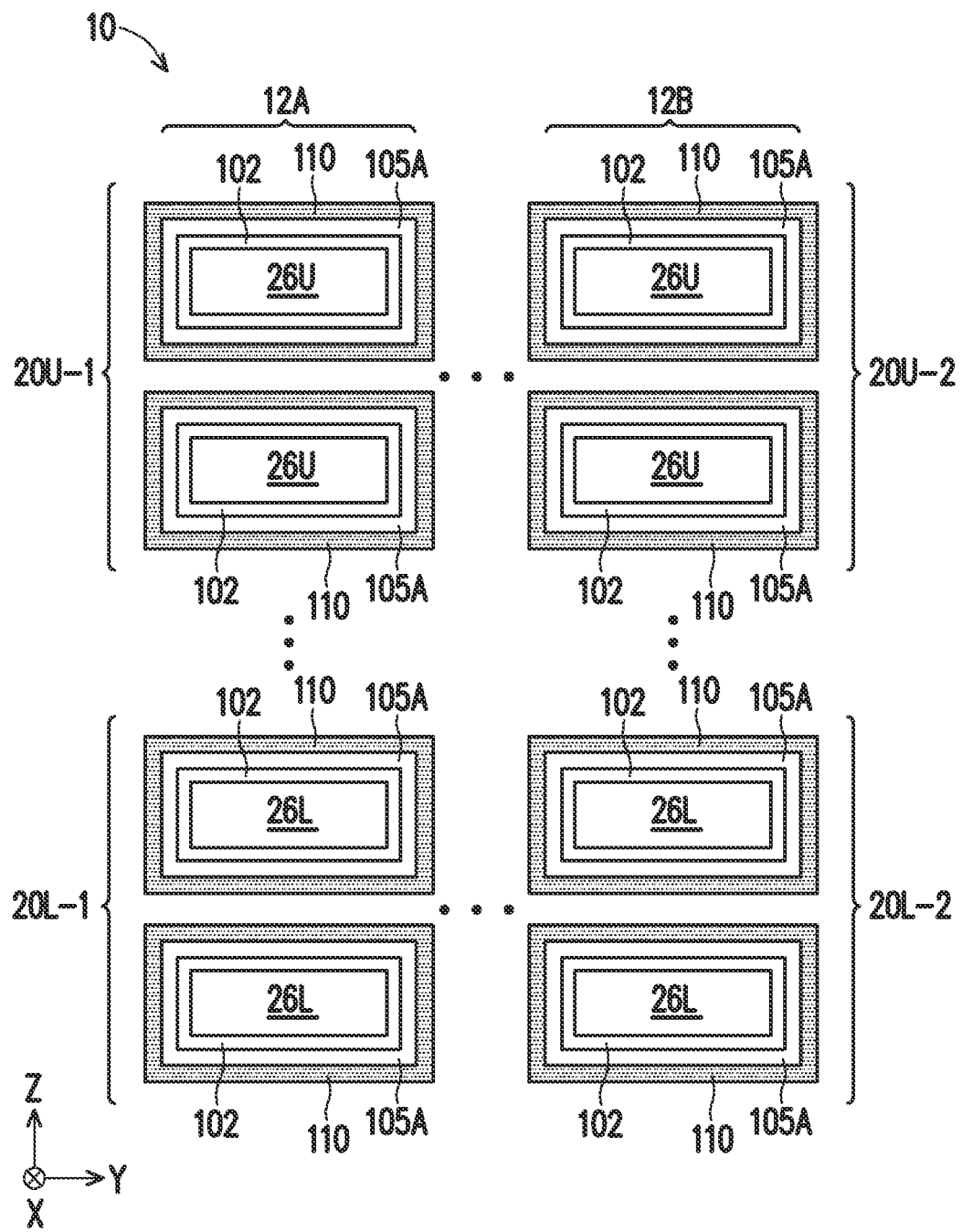

Referring to FIG. 2B, dipole dopant source layers 110 are formed over high-k dielectric layers 105A. In the depicted embodiment, dipole dopant source layers 110 are formed over semiconductor layers 26U and semiconductor layers 26L of both device stack 12A and device stack 12B. Transistor 20U-1, transistor 20L-1, transistor 20U-2, and transistor 20L-2 thus each include a respective dipole dopant source layer 110. Dipole dopant source layers 110 surround semiconductor layers 26U and semiconductor layers 26L, and dipole dopant source layers 110 cover tops of mesas 15'. In some embodiments, dipole dopant source layers 110 wrap tops of mesas 15'. In the X-Z plane (e.g., FIG. 1A), dipole dopant source layers 110 may cover tops and bottoms of semiconductor layers 26U, tops and bottoms of semiconductor layers 26L, and tops of mesas 15'. Dipole dopant source layers 110 are formed by ALD, CVD, other suitable process, or a combination thereof. In some embodiments, dipole dopant source layers 110 are formed during a gate replacement process, dipole dopant source layers 110 partially fill the gate openings (e.g., the first gate opening in device stack 12A and the second gate opening in device 12B), and dipole dopant source layers 110 partially fill gaps between semiconductor layers 26 and/or gaps between semiconductor layers 26 and mesas 15'. In some embodiments, dipole dopant source layers 110 may be formed over high-k dielectric layers 105A that are disposed on semiconductor layers 26M and isolation structures 17.

Dipole dopant source layers 110 are dielectric layers that includes n-dipole dopant(s) that may be driven into high-k dielectric layers 105A to change a threshold voltage of transistor 20U-1, transistor 20L-1, transistor 20U-2, transistor 20L-2, or a combination thereof. For example, driving n-dipole dopant into high-k dielectric layers 105A of n-type transistors (e.g., transistor 20L-1 and transistor 20L-2) may decrease threshold voltages thereof. Dipole dopant source layers 110 include n-dipole dopant (e.g., a metal) and oxygen, nitrogen, carbon, or a combination thereof (e.g., a non-metal). The n-dipole dopant is lanthanum (La), yttrium (Y), lutetium (Lu), strontium (Sr), erbium (Er), magnesium (Mg), other suitable n-dipole dopant, or a combination thereof. In some embodiments, the n-dipole dopant is lanthanum, and dipole dopant source layers 110 are lanthanum oxide layers (e.g., $LaO_x$ layers, such as $La_2O_3$ layers) or lanthanum nitride layers (e.g., $LaN_x$ layers). In some embodiments, the n-dipole dopant is strontium, and dipole dopant source layers 110 are strontium oxide layers (e.g., $SrO_x$ layers). In some embodiments, the n-dipole dopant is yttrium, and dipole dopant source layers 110 are yttrium oxide layers (e.g., $YO_x$ layers). In some embodiments, the n-dipole dopant is lutetium, and dipole dopant source layers 110 are lutetium oxide layers (e.g., $LuO_x$ layers).

Dipole dopant source layers 110 have a substantially uniform thickness. In some embodiments, a thickness of dipole dopant source layers 110 is about 0.5 nm to about 1.5 nm. If dipole dopant source layers 110 are too thin (such as less than 0.5 nm), they may not uniformly cover high-k dielectric layers 105A, which may affect uniformity of dipole engineering of high-k dielectric layers 105A and/or uniformity of threshold voltage tuning of transistors (i.e., non-uniform threshold voltage tuning may occur). If dipole dopant source layers 110 are too thick (such as greater than 1.5 nm), they may be difficult to remove and thus undesirably remain in gate stacks of transistors. For example, if too thick, remnants of a dipole dopant source layer may remain between channel layers (e.g., dipole dopant source layer 110 may remain in gaps between semiconductor layers 26). This may affect subsequent fabrication, for example, by leaving insufficient space for a gate electrode between the semiconductor layers 26 and/or cause a transistor including remnants of a dipole dopant source layer to have different electrical characteristics than intended (e.g., different threshold voltage). Further, compositions and thicknesses of dipole dopant source layers 110 may be designed based on a desired amount of threshold voltage tuning. For example, thicker dipole dopant source layers 110 may provide greater threshold voltage changes in the transistors. In some embodiments, dipole dopant source layers 110 have a multilayer structure, where a composition and a thickness of each layer may be designed to achieve desired threshold voltage tuning of the transistors.

Figure 2C:
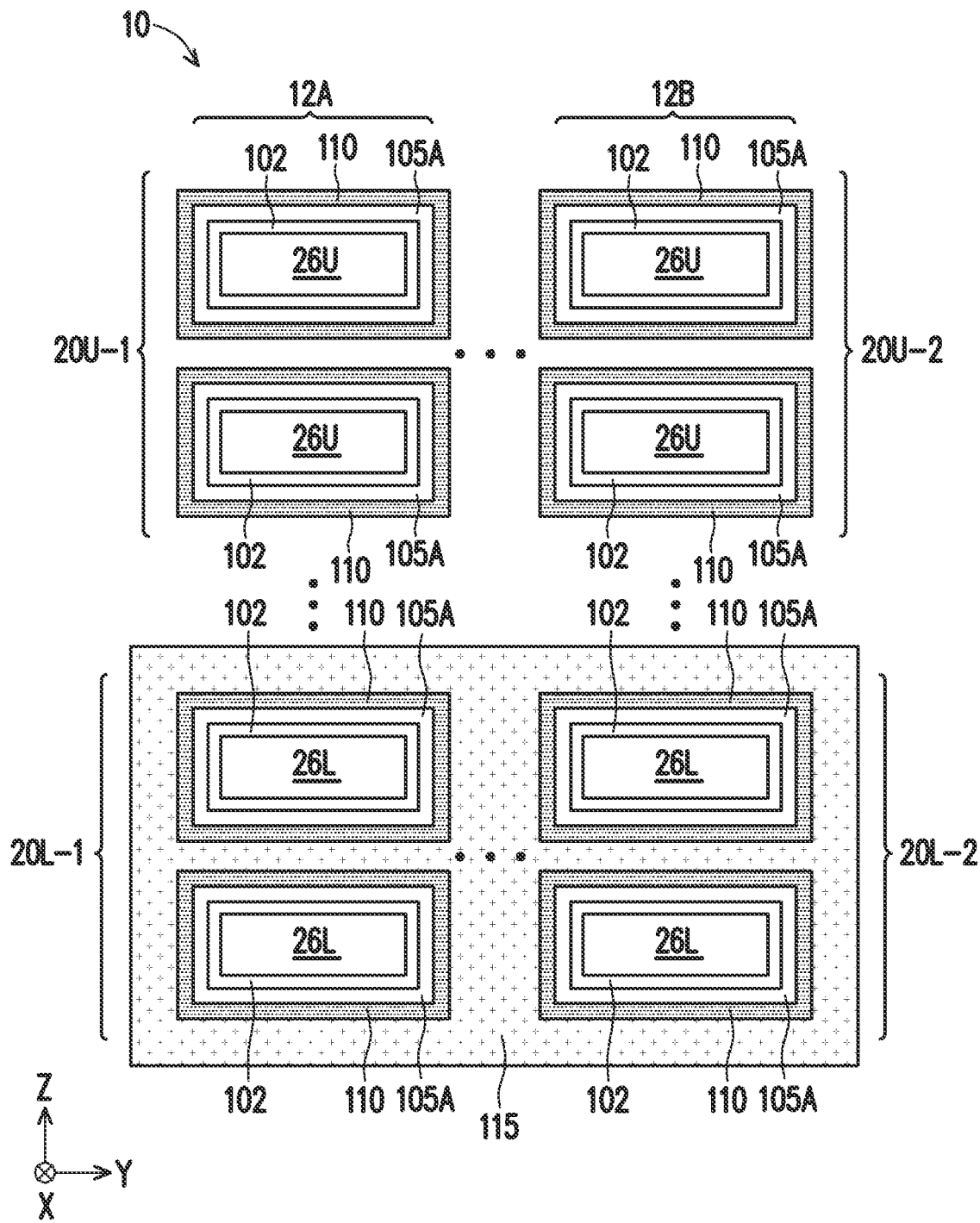
Figure 2D:
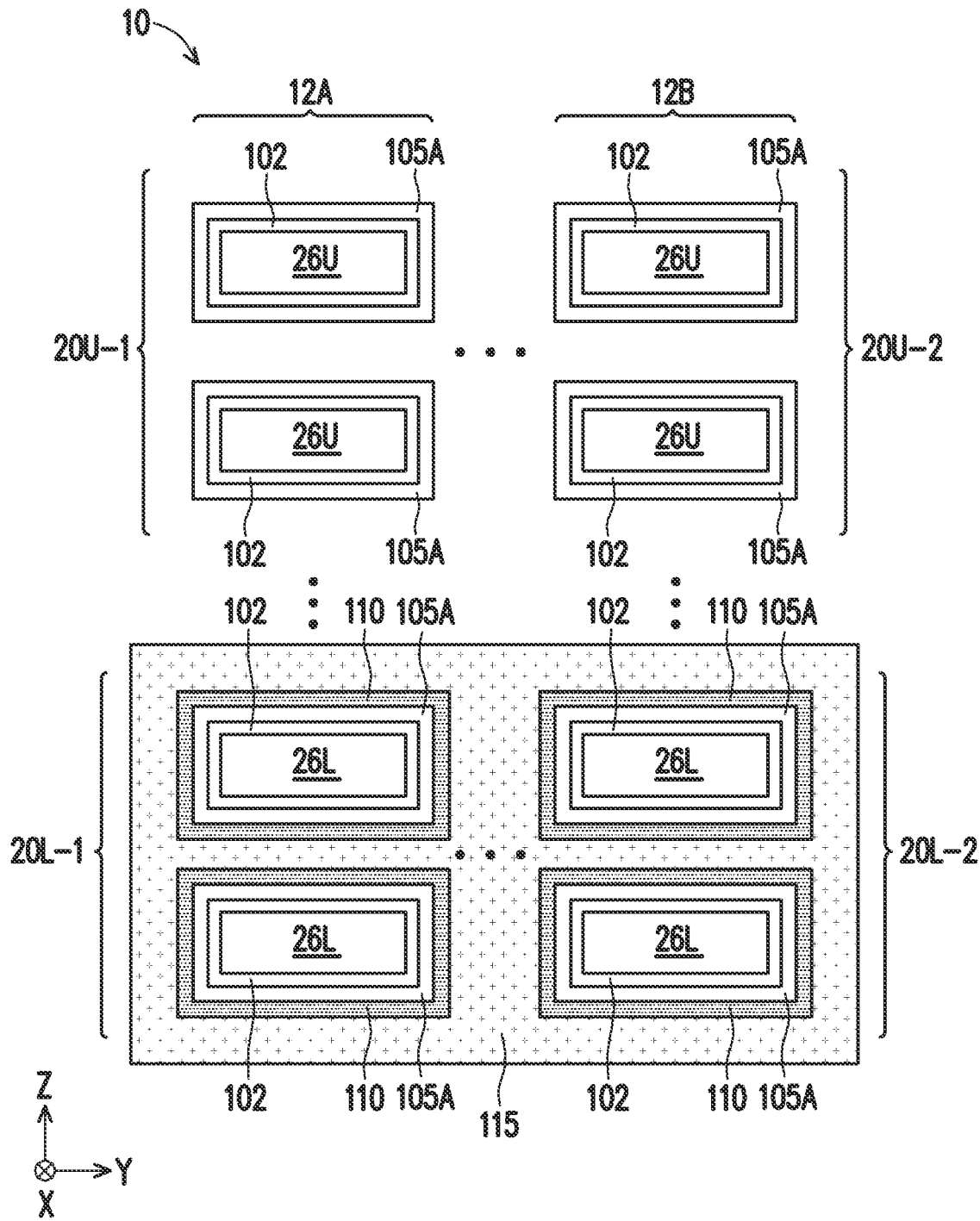
Figure 2E:
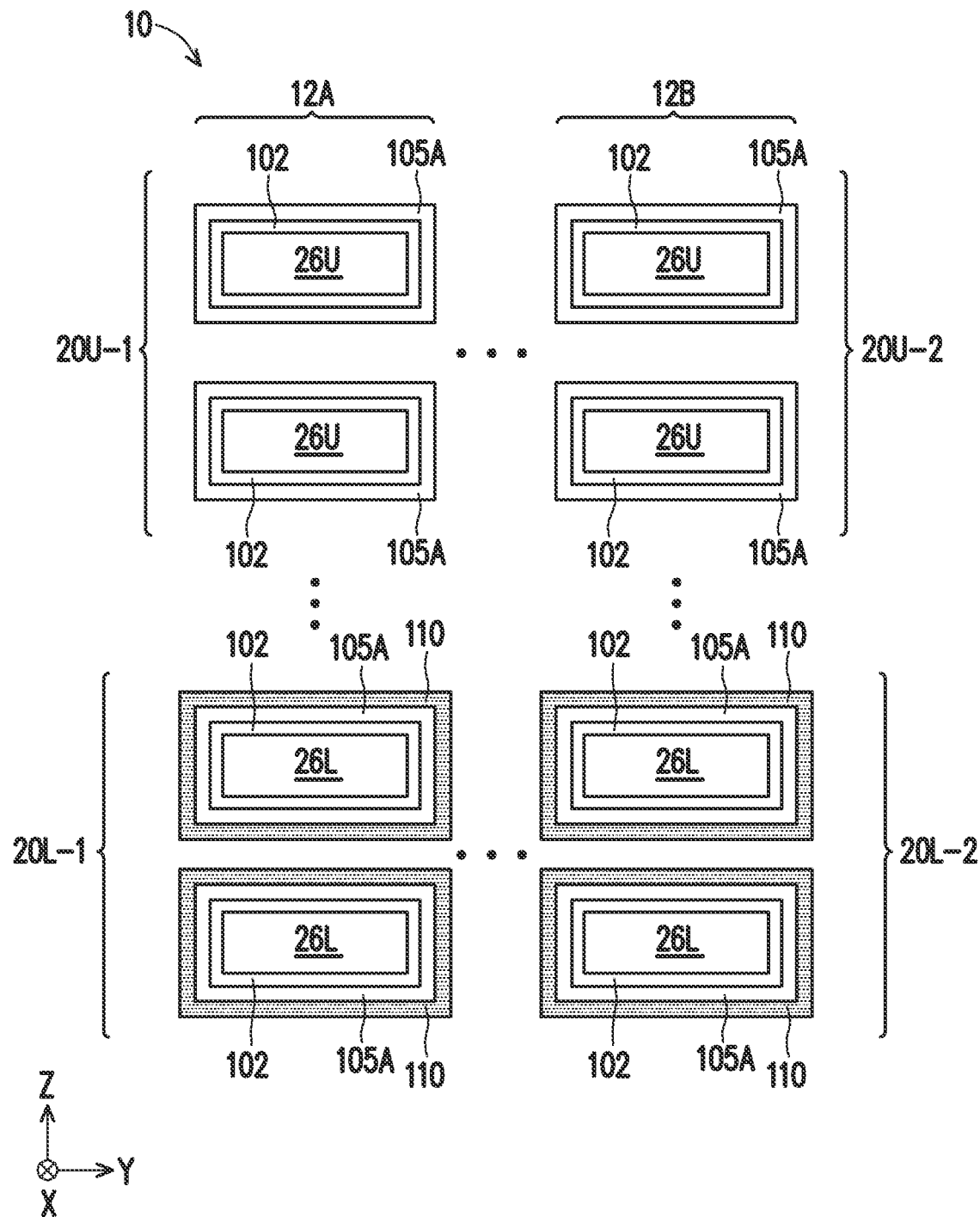

Referring to FIGS. 2C-2E, dipole dopant source layers 110 are removed from upper transistors (e.g., transistor 20U-1 and transistor 20U-2), for example, by forming a patterning layer 115 that covers dipole dopant source layers 110 of lower transistors (e.g., transistor 20L-1 and transistor 20L-2) and exposes dipole dopant source layers 110 of upper transistors (FIG. 2C), selectively removing the exposed dipole dopant source layers 110 (FIG. 2D), and selectively removing patterning layer 115 (FIG. 2E). In the depicted embodiment, dipole dopant source layers 110 are removed from over high-k dielectric layers 105A of p-type transistors (e.g., transistor 20U-1 and transistor 20U-2). In FIG. 2C, patterning layer 115 may be formed by depositing a dummy fill layer that covers dipole dopant source layers 110 of upper transistors and lower transistors and recessing (e.g., etching back) the dummy fill layer to expose dipole dopant source layers 110 of upper transistors. A composition of dummy fill layer is different than a composition of dipole dopant source layers 110 and high-k dielectric layers 105A to enable selective removal/etching thereof. In some embodiments, the dummy fill layer is a dielectric material that includes silicon and oxygen, carbon, hydrogen, nitrogen, or a combination thereof. For example, the dummy fill layer may be a silicon oxide layer or a silicon oxycarbide layer. The dummy fill layer may be formed by ALD, CVD, other suitable process, or a combination thereof. In some embodiments, the dummy fill layer is formed by a spin-on deposition process. In some embodiments, the recessing etches the dummy fill layer with no (or negligible) etching of dipole dopant source layers 110. In some embodiments, patterning layer 115 is formed during a gate replacement process, the dummy fill layer fills the gate openings (e.g., the first gate opening in device stack 12A and the second gate opening in device 12B) after deposition, and the dummy fill layer partially fills the gate openings after recessing.

In FIG. 2D, an etching process may selectively remove dipole dopant source layers 110 with respect to high-k dielectric layers 105A. For example, the etching process etches dipole dopant source layers 110 with no (or negligible) etching of high-k dielectric layers 105A. In some embodiments, an etchant of the etching process etches dipole dopant source layers 110 (e.g., metal oxide layers having a first composition (e.g., including La, Sr, Y, Lu, other n-dipole dopant, or a combination thereof)) at a higher rate than high-k dielectric layers 105A (e.g., metal oxide layers having a second composition that is different than the first composition (e.g., including Hf, Zr, Ti, Ta, La, other high-k dielectric metal, or a combination thereof)). The etching process is a dry etch, a wet etch, other suitable etch, or a combination thereof.

In FIG. 2E, an etching process may selectively remove patterning layer 115 with respect to high-k dielectric layers 105A and dipole dopant source layers 110. For example, the etching process etches patterning layer 115 with no (or negligible) etching of high-k dielectric layers 105A and dipole dopant source layers 110. In some embodiments, an etchant of the etching process etches patterning layer 115 (e.g., a dielectric material that includes silicon and oxygen, carbon, hydrogen, nitrogen, or a combination thereof) at a higher rate than high-k dielectric layers 105A (e.g., metal oxide layers having the second composition) and dipole dopant source layers 110 (e.g., metal oxide layers having the first composition). The etching process is a dry etch, a wet etch, other suitable etch, or a combination thereof.

Figure 2F:
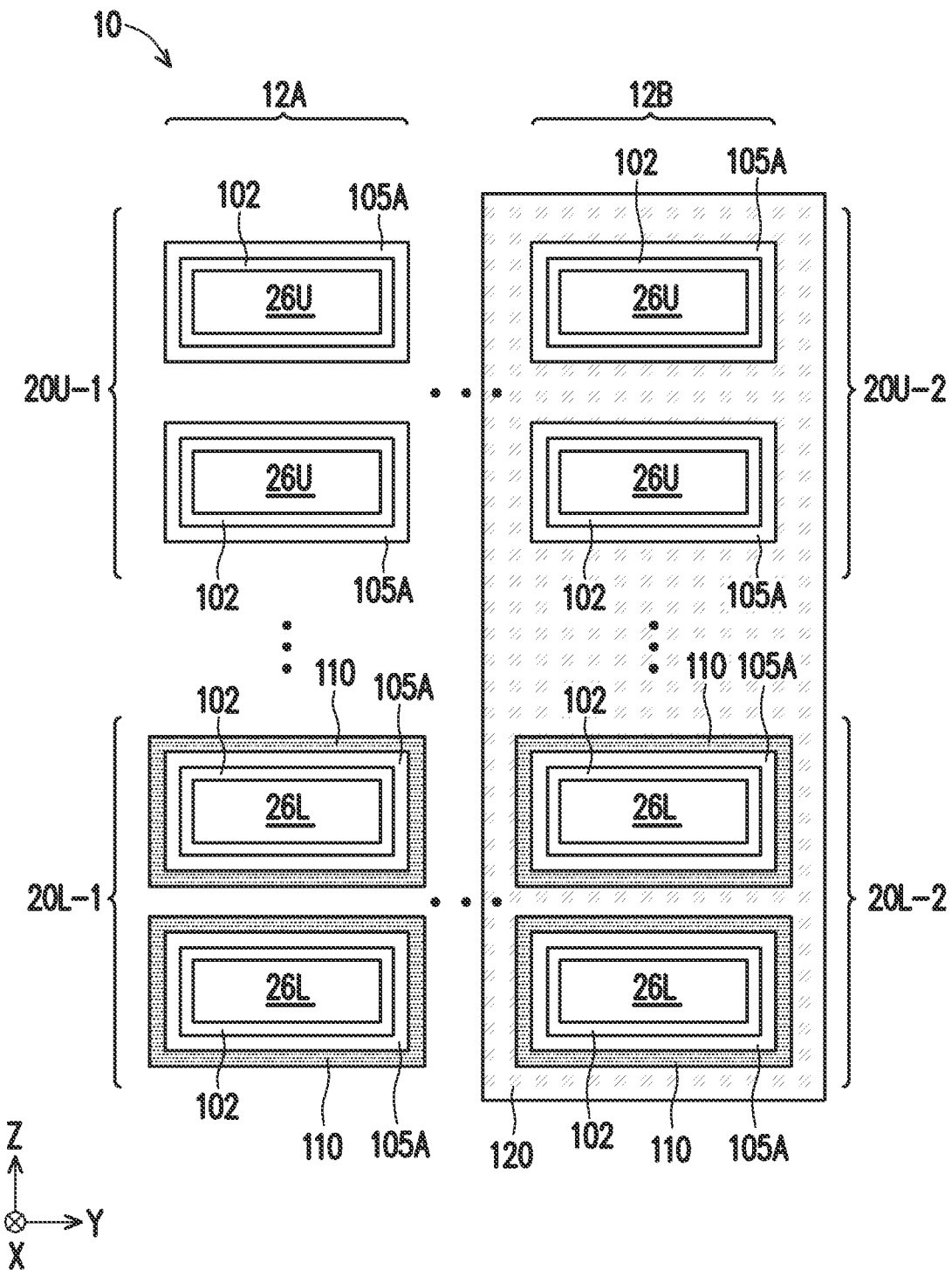

Because dipole dopant source layers 110 are removed from over high-k dielectric layers 105A of upper transistors but not from over high-k dielectric layers 105A of lower transistors, n-dipole dopant will be driven into high-k dielectric layers 105A of lower transistors but not into high-k dielectric layers 105A of upper transistors during a thermal drive-in process (FIG. 2G), which will change threshold voltages of lower transistors relative to threshold voltages of upper transistors. Referring to FIG. 2F, to further adjust threshold voltages of the transistors, a mask 120 (e.g., a hard mask) is formed that will cover some transistors but not other transistors during the thermal drive-in process. For example, mask 120 is formed in device stack 12B, and mask 120 covers high-k dielectric layers 105A of transistor 20U-2 and dipole dopant source layers 110 of transistor 20L-2. In some embodiments, mask 120 is formed by depositing a hard mask material over device stack 12A and device stack 12B and performing a patterning process to remove the hard mask material from device stack 12A, thereby exposing high-k dielectric layers 105A of transistor 20U-1 and dipole dopant source layers 110 of transistor 20L-1. The patterning process may include performing a lithography process to form a patterned resist layer that covers the hard mask material over device stack 12B and exposes the hard mask material over device stack 12A (e.g., the patterned resist layer has an opening therein that overlaps device stack 12A) and performing an etching process to selectively remove the hard mask material. A composition and/or a thickness of mask 120 is configured to block and/or prevent nitrogen from reaching and/or diffusing into high-k dielectric layers 105A of device stack 12B during the thermal drive-in process. Further, the composition of mask 120 is different than a composition of high-k dielectric layers 105A and dipole dopant source layers 110 to enable selective removal/etching thereof. In some embodiments, mask 120 includes metal and oxygen and/or nitrogen (i.e., mask 120 is a metal oxide mask and/or a metal nitride mask). For example, mask 120 may include aluminum and oxygen and/or nitrogen, and mask 120 may be an aluminum oxide mask (e.g., an $Al_2O_3$ layer), an aluminum oxynitride mask (e.g., an AlON layer), an aluminum nitride mask (e.g., an AlN layer), or a combination thereof.

Figure 2G:
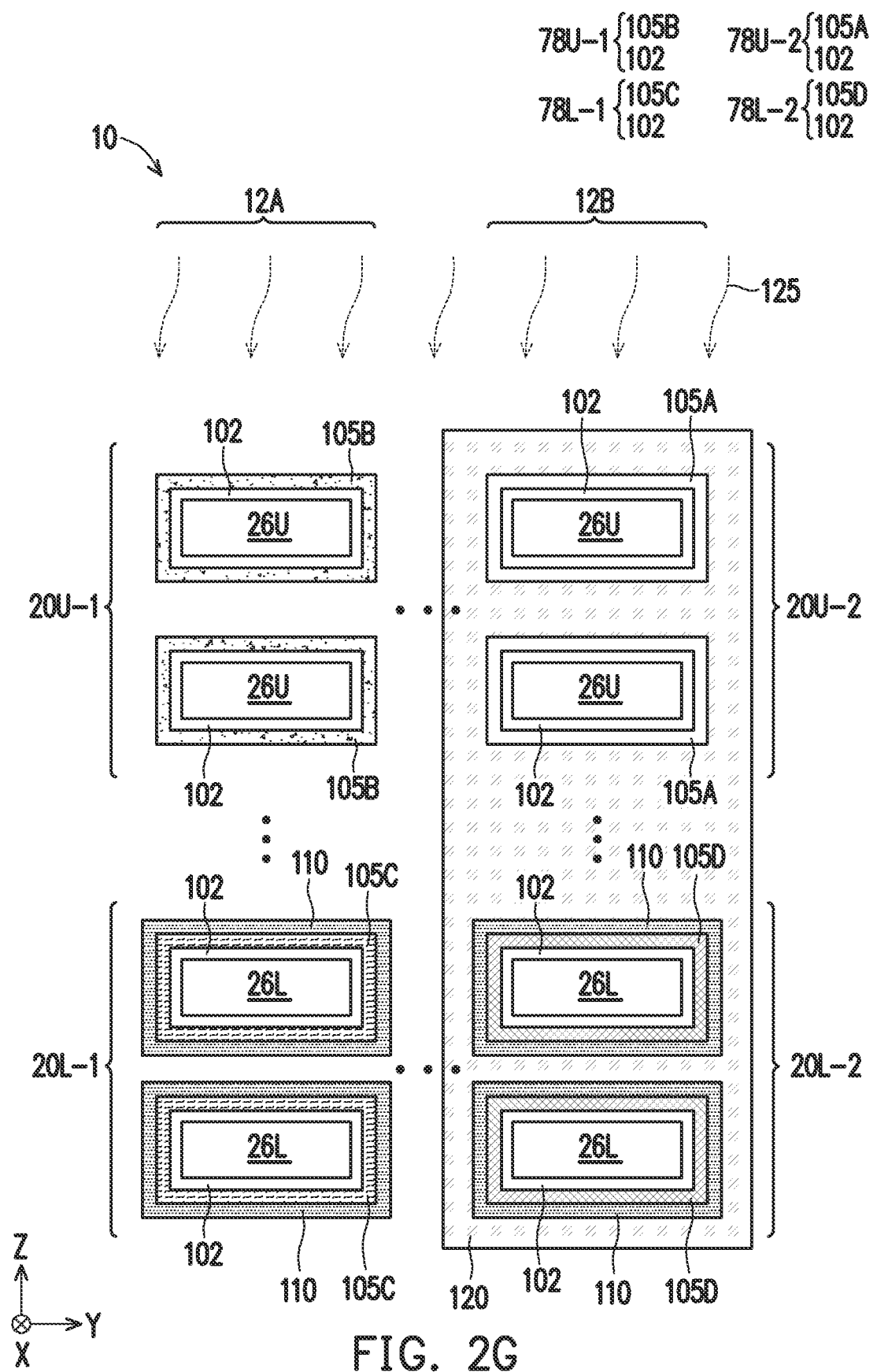

Referring to FIG. 2G, a thermal drive-in process 125 (also referred to as a dipole anneal) is performed in a nitrogen-containing ambient. Thermal drive-in process 125 drives (diffuses) n-dipole dopant from dipole dopant source layers 110 into high-k dielectric layers 105A of lower transistors (e.g., transistor 20L-1 and transistor 20L-2) and drives (diffuses) nitrogen into high-k dielectric layers 105A of unmasked transistors (e.g., transistor 20U-1 and transistor 20L-1). Thermal drive-in process 125 may also diffuse n-dipole dopant from dipole dopant source layers 110 into interfacial layers 102 of lower transistors and/or diffuse nitrogen into interfacial layers 102 of unmasked transistors. Thermal drive-in process 125 may be an annealing process, such as a rapid thermal annealing (RTA), a millisecond annealing (MSA), a microsecond annealing (μSA), a microwave annealing, a laser annealing, a spike annealing, a soak annealing, a furnace annealing, other suitable annealing process, or a combination thereof. In the depicted embodiment, the nitrogen-containing ambient includes $NH_3$ and $N_2$. For example, thermal drive-in process 125 is an $NH_3/N_2$ soak anneal or an $NH_3/N_2$ spike anneal. Parameters of thermal drive-in process 125 (e.g., drive-in temperature, time, ambient, pressure, etc.) are tuned to provide high-k dielectric layers 105 with desired dipole dopant concentrations and/or profiles and desired nitrogen concentrations and/or profiles. For example, higher temperatures and/or higher times may result in higher dipole dopant concentrations and/or higher nitrogen concentrations in high-k dielectric layers 105A. In some embodiments, a drive-in temperature of thermal drive-in process 125 is about 500° C. to about 1,000° C. In some embodiments, a drive-in time is about 0.2 seconds to about 120 seconds. Thermal drive-in parameters, such as temperature, are selected to ensure thermal drive-in process 125 does not adversely affect existing structures/features of the transistors and is yet sufficient to cause n-dipole dopant to migrate/diffuse into high-k dielectric layers 105A of lower transistors and cause nitrogen to migrate/diffuse into high-k dielectric layers 105A of unmasked transistors.

Because thermal drive-in process 125 diffuses nitrogen and n-dipole dopant into unmasked high-k dielectric layers 105A having dipole dopant source layers 110 formed thereon, nitrogen into unmasked high-k dielectric layers 105A, and n-dipole dopant into masked high-k dielectric layers 105A having dipole dopant source layers 110 formed thereon, high-k dielectric layers 105A of transistor 20U-1 become high-k dielectric layers 105B (i.e., high-k dielectric layers doped with nitrogen), high-k dielectric layers 105A of transistor 20L-1 become high-k dielectric layers 105C (i.e., high-k dielectric layers doped with n-dipole dopant and nitrogen), and high-k dielectric layers 105A of transistor 20L-2 become high-k dielectric layers 105D (i.e., high-k dielectric layers doped with n-dipole dopant), such as depicted in FIG. 2G. Because high-k dielectric layers 105A of transistor 20U-2 are masked and do not have dipole dopant source layers 110 formed thereon, a composition thereof is not changed by thermal drive-in process 125 (i.e., high-k dielectric layers 105A remain undoped). In some embodiments, high-k dielectric layers 105A include a high-k dielectric metal (e.g., Hf, Zr, Ti, Ta, La, other high-k dielectric metal, or a combination thereof) and oxygen; high-k dielectric layers 105B include the high-k dielectric metal, oxygen, and nitrogen; high-k dielectric layers 105C include the high-k dielectric metal, oxygen, nitrogen, and an n-dipole metal (e.g., La, Sr, Y, Lu, other n-dipole dopant, or a combination thereof); and high-k dielectric layers 105D include the high-k dielectric metal, oxygen, and the n-dipole metal. In such embodiments, high-k dielectric layers 105A do not include (i.e., are free of) nitrogen and the n-dipole dopant, high-k dielectric layers 105B do not include the n-dipole dopant, and high-k dielectric layers 105D do not include nitrogen. In some embodiments, the nitrogen concentrations and/or the dipole dopant concentrations in high-k dielectric layers 105A-105D may have gradient profiles. For example, a nitrogen concentration in high-k dielectric layer 105B and/or high-k dielectric layer 105C may increase from tops thereof to bottoms thereof, which interface with interfacial layers 102 and/or semiconductor layers 26. In another example, an n-dipole concentration in high-k dielectric layer 105C and/or high-k dielectric layer 105D may increase from tops thereof to bottoms thereof, which interface with interfacial layers 102 and/or semiconductor layers 26. The present disclosure contemplates other profiles of nitrogen and/or n-dipole dopant in high-k dielectric layers 105A-105D.

Transistors of stacked device structure 10 are thus provided with different gate dielectrics (i.e., gate dielectrics having different compositions) that adjust their threshold voltages relative to one another. For example, gate dielectric 78U-1 of transistor 20U-1 includes high-k dielectric layers 105B and interfacial layers 102, gate dielectric 78L-1 of transistor 20L-1 includes high-k dielectric layers 105C and interfacial layers 102, gate dielectric 78U-2 of transistor 20U-2 includes high-k dielectric layers 105A and interfacial layers 102, and gate dielectric 78L-2 of transistor 20L-2 includes high-k dielectric layers 105D and interfacial layers 102. In some embodiments, the n-dipole dopant and/or nitrogen is also diffused into interfacial layer 102, such that the transistors may also have different interfacial layers (i.e., interfacial layers having different compositions). In some embodiments, interfacial layers 102 of gate dielectric 78U-2 may include silicon and oxygen; interfacial layers 102 of gate dielectric 78U-1 may include silicon, oxygen, and nitrogen; interfacial layers 102 of gate dielectric 78L-1 may include silicon, oxygen, nitrogen, and the n-dipole metal; and interfacial layers 102 of gate dielectric 78L-2 may include silicon, oxygen, and the n-dipole metal.

Figure 2H:
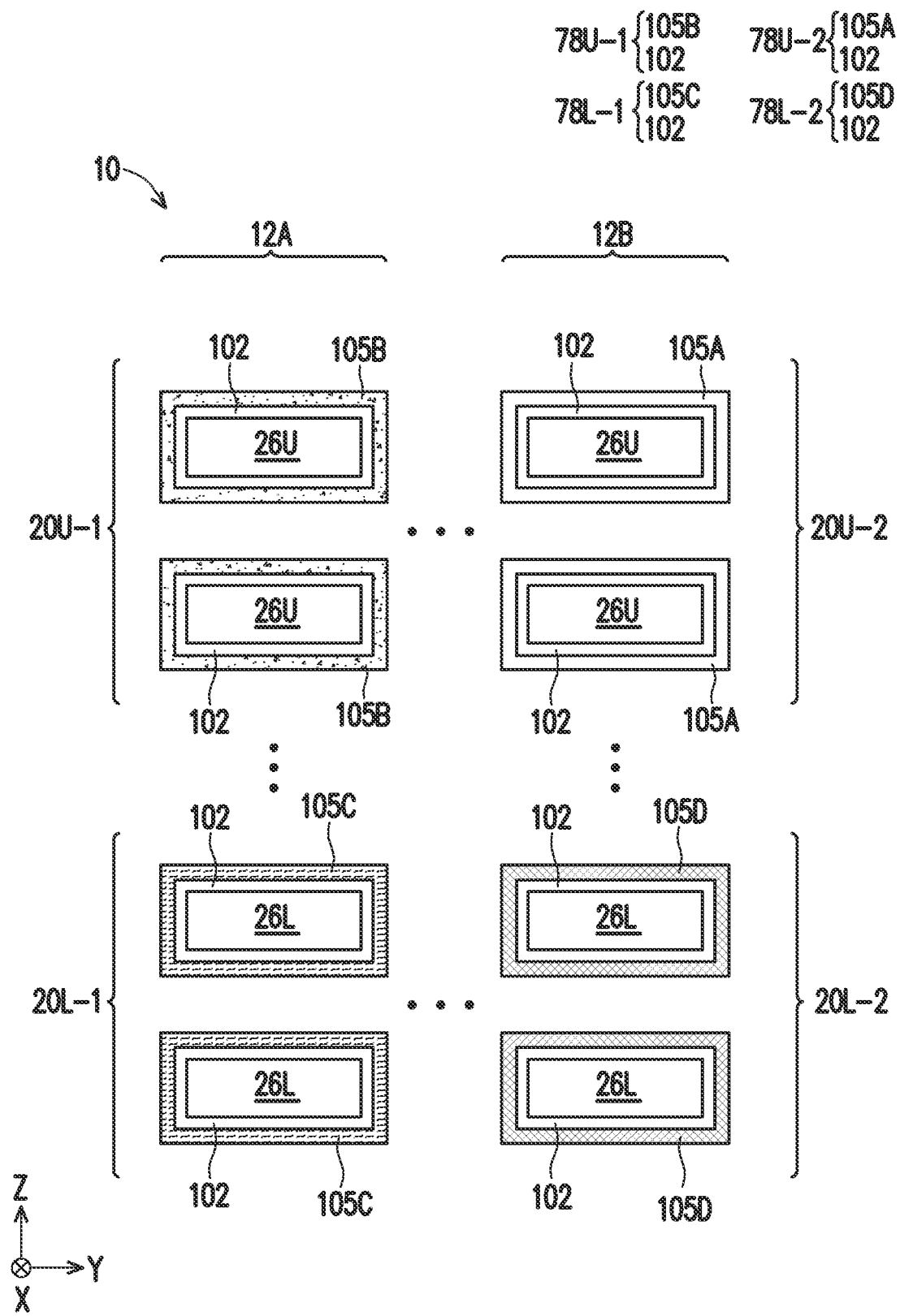

Referring to FIG. 2H, processing includes removing mask 120 and dipole dopant source layers 110 from stacked device structure 10. Because the disclosed dipole engineering process removes dipole dopant source layers 110 and mask 120, the disclosed dipole engineering process provides volume-free threshold voltage tuning of transistors. In other words, the disclosed dipole engineering process modulates threshold voltages of multiple transistors by driving n-dipole dopant, nitrogen, both, or neither into gate dielectrics (e.g., high-k dielectric layers thereof), but material layers used for such threshold voltage modulation do not remain and thus do not consume any volume of final gate stacks of the transistors. Using such process during a gate replacement process maximizes dimensions of the gate openings and/or gaps between semiconductor layers 26 for subsequent gate electrode formation/filling.

In some embodiments, a first etching process may selectively remove mask 120 with respect to high-k dielectric layers (e.g., high-k dielectric layers 105A and high-k dielectric layers 105B) and dipole dopant source layers 110, and a second etching process may selectively remove dipole dopant source layers 110 with respect to high-k dielectric layers 105A-105D. For example, the first etching process etches mask 120 with no (or negligible) etching of high-k dielectric layers 105A, high-k dielectric layers 105B, and dipole dopant source layers 110, and the second etching process etches dipole dopant source layers 110 with no (or negligible) etching of high-k dielectric layers 105A-105D. In some embodiments, an etchant of the first etching process etches mask 120 (e.g., a dielectric material that includes silicon and oxygen, carbon, hydrogen, nitrogen, or a combination thereof) at a higher rate than high-k dielectric layers 105A, high-k dielectric layers 105B, and dipole dopant source layers 110 (e.g., metal oxide layers having different compositions), and an etchant of the second etching process etches dipole dopant source layers 110 (e.g., metal oxide layers having the first composition) at a higher rate than high-k dielectric layers 105A-105D (e.g., metal oxide layers having different compositions, each of which is different than the first composition). The first etching process and/or the second etching process is a dry etch, a wet etch, other suitable etch, or a combination thereof.

Figure 2I:
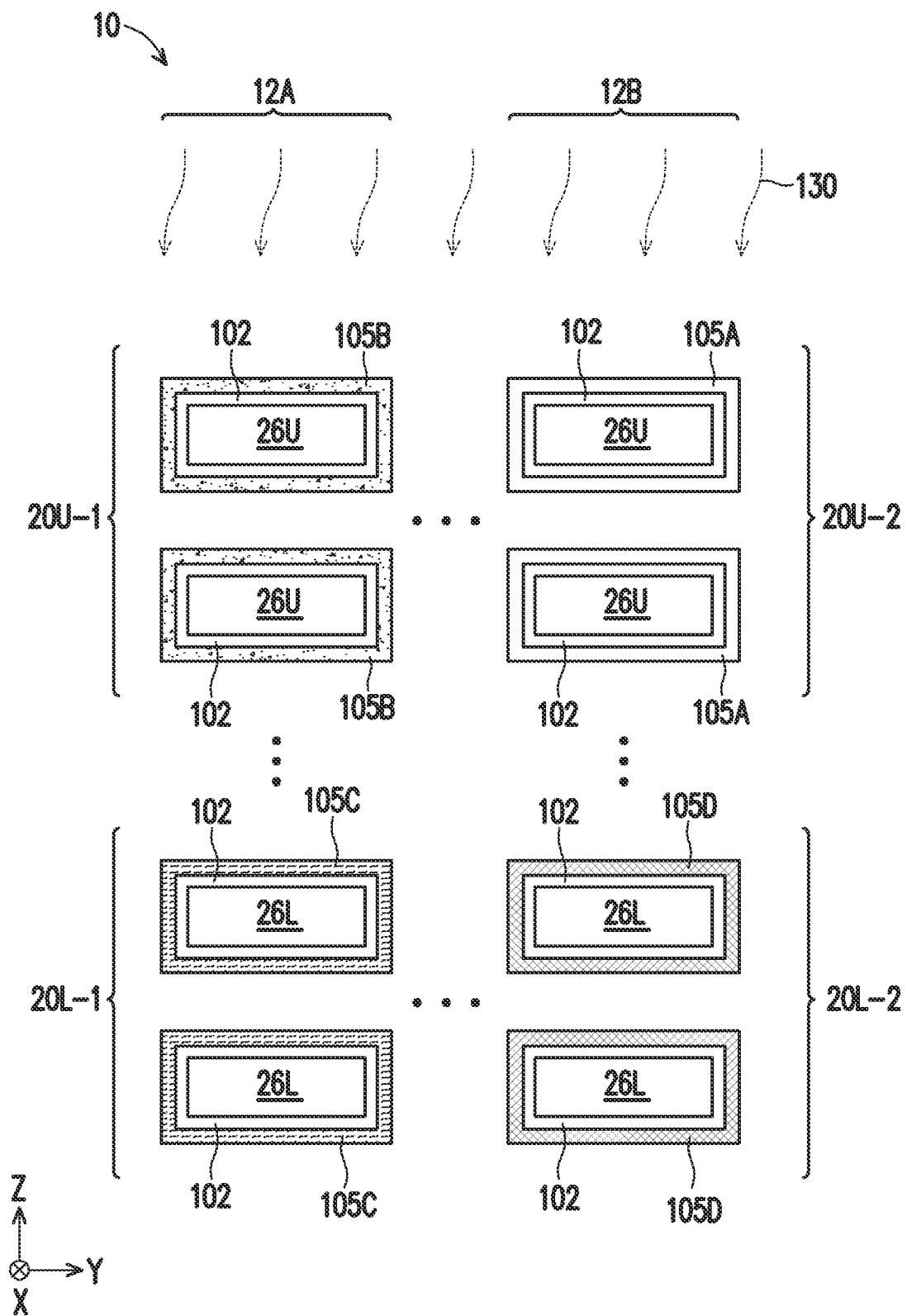

Referring to FIG. 2I, a thermal treatment 130 (also referred to as a post drive-in anneal) is performed to improve gate dielectric quality, such as that of gate dielectric 78U-1, gate dielectric 78U-2, gate dielectric 78L-1, and gate dielectric 78L-2. For example, thermal treatment 130 may reduce oxygen vacancies and/or other defects in high-k dielectric layers 105A-105D and/or interfacial layers 102, reduce and/or inhibit growth of high-k dielectric layers 105A-105D and/or interfacial layers 102, densify and/or increase crystallization of high-k dielectric layers 105A-105D and/or interfacial layers 102, remove impurities and/or constituents from high-k dielectric layers 105A-105D and/or interfacial layers 102, improve an interface between high-k dielectric layers 105A-105D and/or interfacial layers 102, improve an interface of the gate dielectrics with semiconductor layers 26, or a combination thereof. In some embodiments, thermal treatment 130 heats stacked device structure 10, features thereof (e.g., gate dielectrics thereof), an ambient/environment containing stacked device structure 10, or a combination thereof to a temperature that improves quality of the gate dielectrics. In the depicted embodiment, thermal treatment 130 is an annealing process, such as RTA, MSA, μSA, microwave annealing, laser annealing, spike annealing, soak annealing, furnace annealing, other suitable annealing process, or a combination thereof. Thermal treatment 130 may be performed in an inert gas ambient, including, for example, argon (Ar), helium (He), nitrogen ($N_2$), other inert gas, or a combination thereof. In the depicted embodiment, thermal treatment 130 is performed in a nitrogen-containing ambient that is different than the nitrogen-containing ambient in which nitrogen-containing thermal drive-in 125 is performed. For example, the nitrogen-containing ambient includes $N_2$, but not $NH_3$, and thermal treatment 130 may be an $N_2$ soak anneal or an $N_2$ spike anneal. Implementing $NH_3$ during a dipole anneal (e.g., nitrogen-containing thermal drive-in 125) has been observed to diffuse more nitrogen into gate dielectrics (e.g., high-k dielectric layers 105A), and thus achieve greater flatband voltage changes ($V_{FB}$), than that achieved from nitrogen diffused into gate dielectrics when $NH_3$ is implemented during a post drive-in anneal (e.g., thermal treatment 130). Implementing $NH_3$ during the dipole anneal thus enables greater threshold voltage changes and flexibility. Parameters of thermal treatment 130 (e.g., anneal temperature, anneal time, anneal ambient, pressure, etc.) may be configured to reduce and/or eliminate vacancies and/or other defects in the gate dielectrics. In some embodiments, an annealing temperature is about 500° C. to about 1,000° C. In some embodiments, the parameters are tuned to ensure that constituent (e.g., nitrogen) does not diffuse from a thermal process environment (e.g., an annealing ambient) into the gate dielectrics. In some embodiments, the parameters are tuned to cause constituent (e.g., nitrogen) to diffuse from a thermal process environment (e.g., an annealing ambient) into the gate dielectrics.

Figure 2J:
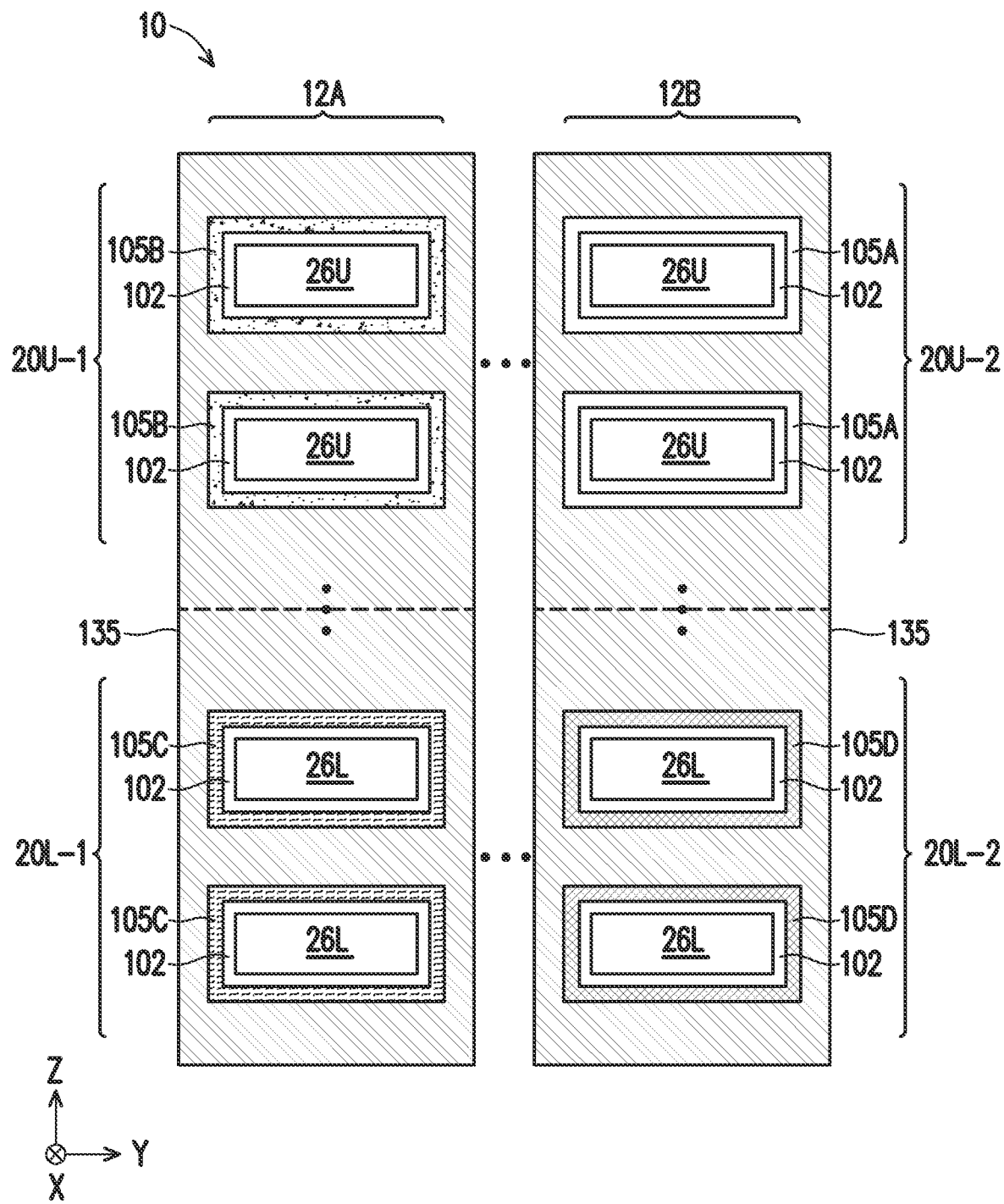

Referring to FIG. 2J, p-type work function metal (P-WFM) layers 135 are formed over high-k dielectric layers 105A-105D. P-WFM layers 135 are formed over and surround semiconductor layers 26U and semiconductor layers 26L of both device stack 12A and device stack 12B, and P-WFM layers 135 provide gate electrodes, or portions thereof, of upper transistors and lower transistors. For example, gate electrode 80U-1, gate electrode 80L-1, gate electrode 80U-2, and gate electrode 80L-2 each include a respective P-WFM layer 135 or portion thereof. P-WFM layers 135 also cover tops of mesas 15'. In some embodiments, P-WFM layers 135 wrap tops of mesas 15'. In the X-Z plane (e.g., FIG. 1A), P-WFM layers 135 may cover tops and bottoms of semiconductor layers 26U, tops and bottoms of semiconductor layers 26L, and tops of mesas 15'. Further, P-WFM layers 135 may be wrapped by high-k dielectric layers 105B and high-k dielectric layers 105A formed over topmost semiconductor layers 26U, such as by portions thereof having u-shaped profiles. In some embodiments, P-WFM layers 135 may be formed over and wrap semiconductor layers 26M. In such embodiments, P-WFM layers 135 may surround middle portions of channel stacks, which may include a respective isolation structure 17 disposed between respective semiconductor layers 26M.

P-WFM layers 135 (also referred to as p-metal layers) include a p-type work function material, which generally refers to an electrically conductive material tuned to have a p-type work function. The p-type work function material may include a metal with a sufficiently high effective work function, such as titanium, tantalum, ruthenium, molybdenum, tungsten, platinum, other p-metal, alloys thereof, or a combination thereof. In some embodiments, P-WFM layers 135 are titanium nitride layers, titanium carbide layers, titanium silicon nitride layers, tantalum nitride layers, tungsten carbonitride layers, or molybdenum layers. In some embodiments, P-WFM layers 135 have a multilayer structure (e.g., more than one P-WFM layer). P-WFM layers 135 are formed by ALD, CVD, PVD, plating, other suitable process, or a combination thereof. In some embodiments, a planarization process (e.g., CMP) removes excess P-WFM layers 135, such as that disposed over ILD layer 72U and/or CESL 72U.

In some embodiments, P-WFM layers 135 are formed during a gate replacement process, P-WFM layers 135 fill remainders of the gate openings (e.g., the first gate opening in device stack 12A and the second gate opening in device 12B), and P-WFM layers 135 fill remainders of gaps between semiconductor layers 26 and/or gaps between semiconductor layers 26 and mesas 15'. In some embodiments, P-WFM layers 135 are formed during a gate replacement process, and P-WFM layers 135 partially fill the gate openings. In such embodiments, metal fill layers and/or additional gate electrode layers may be formed over P-WFM layers 135 to fill remainders of the gate openings, and then, a planarization process may be performed to remove excess P-WFM layers 135, metal fill layers, additional gate electrode layers, or a combination thereof from over ILD layer 72U and/or CESL 70U. Further, in such embodiments, gate electrode 80U-1, gate electrode 80L-1, gate electrode 80U-2, and gate electrode 80L-2 each include a respective metal fill layer and/or a respective additional gate electrode layer, or portion thereof, and P-WFM layers 135 may partially fill or fill remainders of gaps between semiconductor layers 26 and/or gaps between semiconductor layers 26 and mesas 15'. In embodiments where P-WFM layers 135 partially fill the gaps, the metal fill layers and/or additional gate electrode layers may fill remainders of the gaps. The metal fill/bulk layers may include aluminum, tungsten, cobalt, copper, other suitable electrically conductive material, alloys thereof, or a combination thereof. The additional layers may include caps (e.g., a metal nitride cap and/or a silicon cap) and/or barrier layers (e.g., a metal nitride barrier).

In FIG. 2J, stacked device structure 10 thus has a first CFET (e.g., device stack 12A) and a second CFET (e.g., device stack 12B). The first CFET has a first p-type GAA transistor (e.g., transistor 20U-1) and a first n-type GAA transistor (e.g., transistor 20L-1), and the second CFET has a second p-type GAA transistor (e.g., transistor 20U-2) and a second n-type GAA transistor (e.g., transistor 20L-2). Gate electrodes of the p-type GAA transistors and the n-type GAA transistors include a same work function material (e.g., P-WFM layers 135), and gate dielectrics of the p-type GAA transistors and the n-type GAA transistors have different compositions. For example, a gate dielectric of the first p-type GAA transistor includes a high-k dielectric layer doped with nitrogen (e.g., high-k dielectric layer 105B), a gate dielectric of the second p-type GAA transistor includes an undoped high-k dielectric layer (i.e., without n-dipole dopant and nitrogen)(e.g., high-k dielectric layer 105A), a gate dielectric of the first n-type GAA transistor includes a high-k dielectric layer doped with nitrogen and n-dipole dopant (e.g., high-k dielectric layer 105C), and a gate dielectric of the second n-type GAA transistor includes a high-k dielectric layer doped with n-dipole dopant (e.g., high-k dielectric layer 105D). The first p-type GAA transistor has a first threshold voltage, the second p-type GAA transistor has a second threshold voltage, the first n-type GAA transistor has a third threshold voltage, and the second n-type GAA transistor has a fourth threshold voltage. The first threshold voltage, the second threshold voltage, the third threshold voltage, and the fourth threshold voltage are different.

Figure 3A:
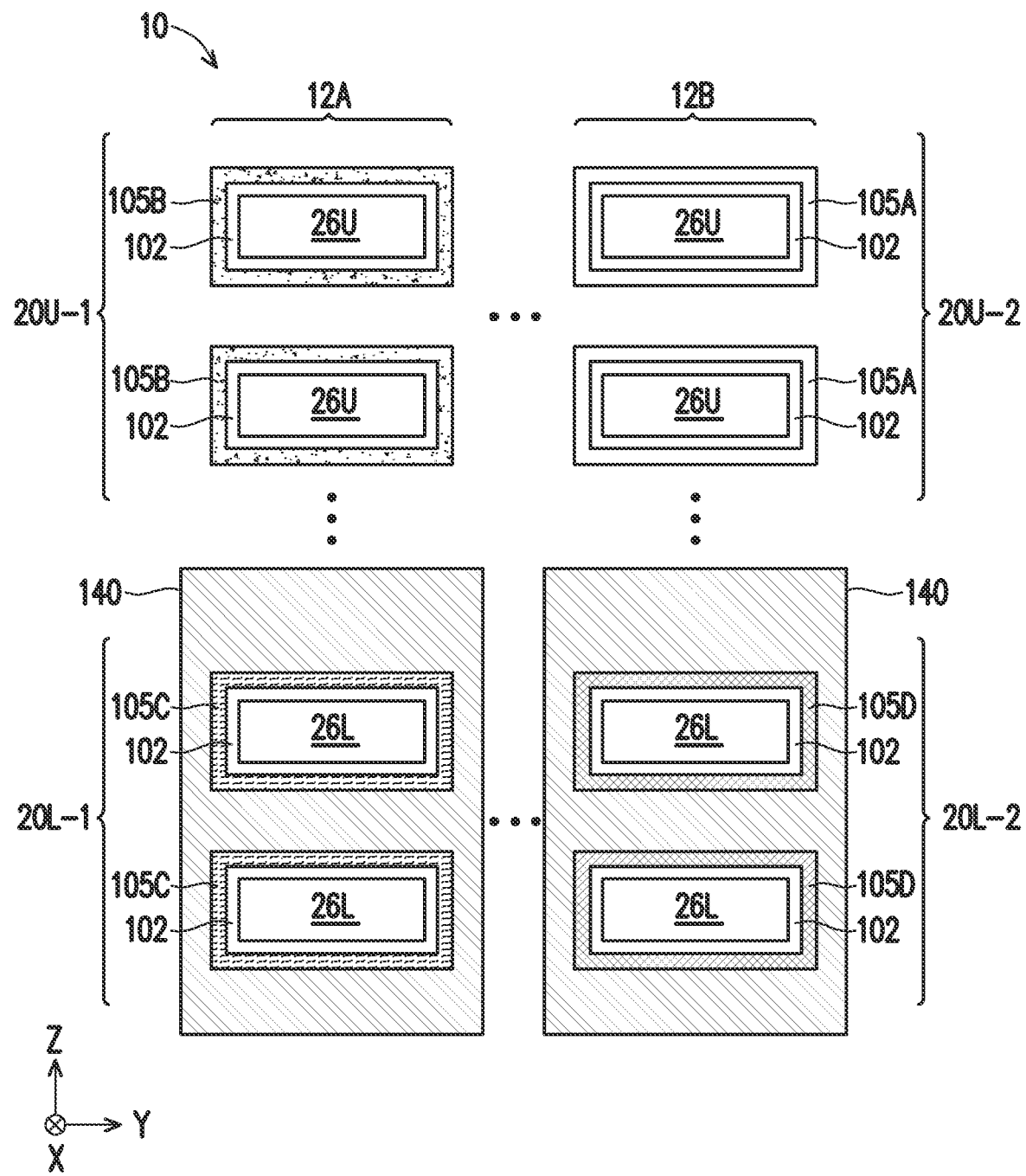
FIG. 3A and FIG. 3B are cross-sectional views of a stacked device structure, such as the stacked device structure of FIGS. 1A-1C, in portion or entirety, at a gate electrode formation stage according to various aspects of the present disclosure.
Figure 3B:
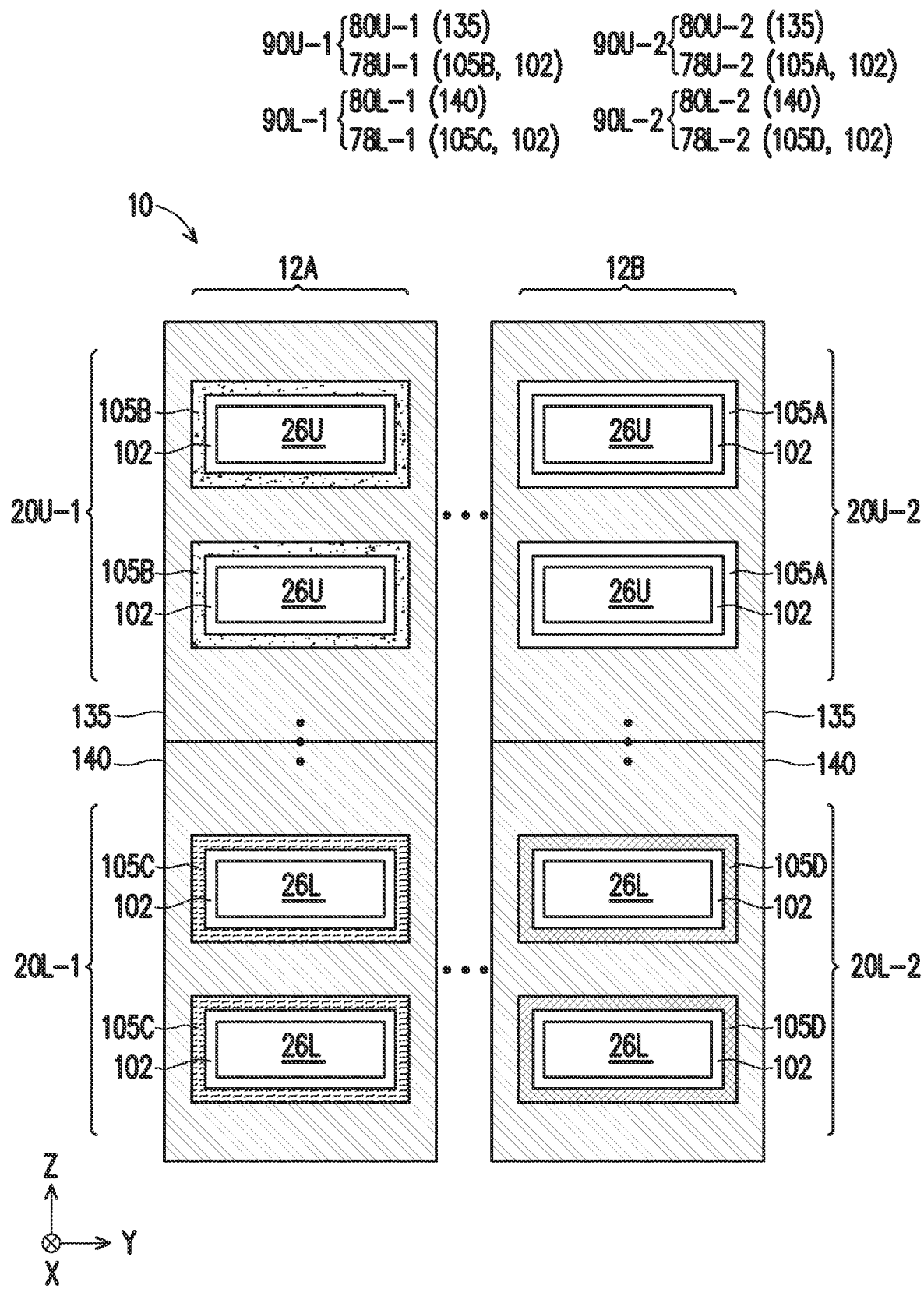

In some embodiments, gate electrodes of p-type transistors and n-type transistors include different type work function materials, such as provided in FIG. 3A and FIG. 3B. FIG. 3A and FIG. 3B are cross-sectional views of a stacked device structure, such as stacked device structure 10 of FIGS. 1A-1C, in portion or entirety, at a gate electrode formation stage according to various aspects of the present disclosure. The cross-sectional views of FIG. 3A and FIG. 3B are taken (cut) along a gate lengthwise direction (e.g., a y-direction), like the cross-sectional views of FIG. 1B and FIG. 1C. In FIG. 3A, stacked device structure 10 has undergone processing associated with FIGS. 2A-2I to provide high-k dielectric layers 105A-105D. Processing then continues with forming n-type work function metal (N-WFM) layers 140 over high-k dielectric layers of lower, n-type transistors (e.g., high-k dielectric layers 105C and high-k dielectric layers 105D) in FIG. 3A and forming P-WFM layers 135 over high-k dielectric layers of upper, p-type transistors (e.g., high-k dielectric layers 105B and high-k dielectric layers 105A) in FIG. 3B. FIG. 3A and FIG. 3B have been simplified for the sake of clarity to better understand the inventive concepts of the present disclosure. For example, some features of stacked device structure 10 are omitted in FIG. 3A and FIG. 3B, such as semiconductor layers 26M, isolation structures 17 therebetween, mesas 15', substrate isolation structures 28, and substrate 15. Additional features may be added in stacked device structure 10 of FIG. 3A and FIG. 3B, and some of the features described below can be replaced, modified, or eliminated in other embodiments of stacked device structure 10 of FIG. 3A and FIG. 3B.

In FIG. 3A, N-WFM layers 140 are formed over and surround semiconductor layers 26L of both device stack 12A and device stack 12B. N-WFM layers 140 provide gate electrodes, or portions thereof, of n-type transistors. For example, gate electrode 80L-1 and gate electrode 80L-2 each include a respective N-WFM layer 140 or portion thereof. N-WFM layers 140 may cover tops of mesas 15'. In some embodiments, N-WFM layers 140 wrap tops of mesas 15'. In the X-Z plane (e.g., FIG. 1A), N-WFM layers 140 may cover tops of semiconductor layers 26L, bottoms of semiconductor layers 26L, and tops of mesas 15'. In some embodiments, N-WFM layers 140 may be formed over and wrap semiconductor layers 26M of lower transistors. In such embodiments, N-WFM layers 140 may extend along sidewalls of semiconductor layers 26M of lower transistors and may further extend along sidewalls of isolation structures 17.

N-WFM layers 140 (also referred to as n-metal layers) include an n-type work function material, which generally refers to an electrically conductive material tuned to have an n-type work function. The n-type work function material may include a metal with a sufficiently low effective work function, such as aluminum, titanium, tantalum, zirconium, other n-metal, alloys thereof, or a combination thereof. In some embodiments, N-WFM layers 140 are titanium aluminum layers, titanium aluminum carbide layers, tantalum carbide layers, tantalum carbide nitride layers, tantalum silicon nitride, or a combination thereof. In some embodiments, N-WFM layers 140 have a multilayer structure, such as more than one N-WFM layer.

In FIG. 3B, P-WFM layers 135 are formed over and surround semiconductor layers 26U of both device stack 12A and device stack 12B, and P-WFM layers 135 provide gate electrodes, or portions thereof, of p-type transistors. For example, gate electrode 80U-1 and gate electrode 80U-2 each include a respective P-WFM layer 135 or portion thereof. In the X-Z plane, P-WFM layers 135 may cover tops and bottoms of semiconductor layers 26U. In some embodiments, P-WFM layers 135 may wrap semiconductor layers 26M of upper transistors. In such embodiments, P-WFM layers 135 may extend along sidewalls of semiconductor layers 26M of upper transistors and may further extend along sidewalls of isolation structures 17.

In some embodiments, forming N-WFM layers 140 and P-WFM layers 135 includes depositing an n-type work function material that covers high-k dielectric layers of upper transistors and lower transistors (e.g., high-k dielectric layers 105A-105D), recessing (e.g., etching back) the n-type work function material to expose high-k dielectric layers of upper transistors (e.g., high-k dielectric layers 105A and high-k dielectric layers 105B), and depositing a p-type work function material that covers the exposed high-k dielectric layers of upper transistors. N-WFM layers 140 are deposited by ALD, CVD, PVD, plating, other suitable process, or a combination thereof. In some embodiments, a planarization process (e.g., CMP) removes excess P-WFM layers 135 and/or N-WFM layers 140, such as that disposed over tops of ILD layer 72U and/or CESL 72U. In some embodiments, metal fill layers and/or additional gate electrode layers are formed over N-WFM layers 140 and P-WFM layers 135, and gate electrode 80U-1, gate electrode 80U-2, gate electrode 80L-1, gate electrode 80L-2 each include a respective metal fill layer and/or respective additional gate electrode layers, or portions thereof. In some embodiments, N-WFM layers 140 and P-WFM layers 135 are formed during a gate replacement process. In such embodiments, N-WFM layers 140 and P-WFM layers 135 may partially fill or fill remainders of the gate openings depending on whether the gate electrodes of gate 90A and gate 90B also include metal fill layers and/or additional gate electrode layers. In such embodiments, N-WFM layers 140 may fill or partially fill remainders of gaps between semiconductor layers 26L and gaps between semiconductor layers 26L and semiconductor layers 26M, and P-WFM layers 135 may fill or partially fill remainders of gaps between semiconductor layers 26U, gaps between semiconductor layers 26U and semiconductor layers 26M, gaps between semiconductor layers 26L and mesas 15', or a combination thereof.

FIGS. 4A-4I are cross-sectional views of a stacked device structure, such as stacked device structure 10 of FIGS. 1A-1C, in portion or entirety, at various stages of another method for fabricating gates thereof, such as gate 90A and gate 90B, according to various aspects of the present disclosure. The method for fabricating gates described with reference to FIGS. 4A-4I also implements a dipole engineering technique (FIGS. 4B-4H) that achieves different threshold voltages for multiple transistors by incorporating dipole dopant and/or nitrogen into gate dielectrics thereof. For example, the disclosed dipole engineering technique may provide four transistors (e.g., transistor 20U-1, transistor 20L-1, transistor 20U-2, and transistor 20L-2) with different threshold voltages. The cross-sectional views of FIGS. 4A-4I are taken (cut) along a gate lengthwise direction (e.g., a y-direction), like the cross-sectional views of FIG. 1B and FIG. 1C. FIGS. 4A-4I have been simplified for the sake of clarity to better understand the inventive concepts of the present disclosure. For example, because the method for fabricating the gates is described with reference to forming the gates around channel layers (i.e., semiconductor layers 26U and semiconductor layers 26L), some features are omitted in FIG. 4A-4I, such as semiconductor layers 26M, isolation structures 17 therebetween, mesas 15', substrate isolation structures 28, and substrate 15. Additional features may be added in stacked device structure 10 of FIGS. 4A-4I, and some of the features described below can be replaced, modified, or eliminated in other embodiments of stacked device structure 10 of FIGS. 4A-4I.

Figure 4A:
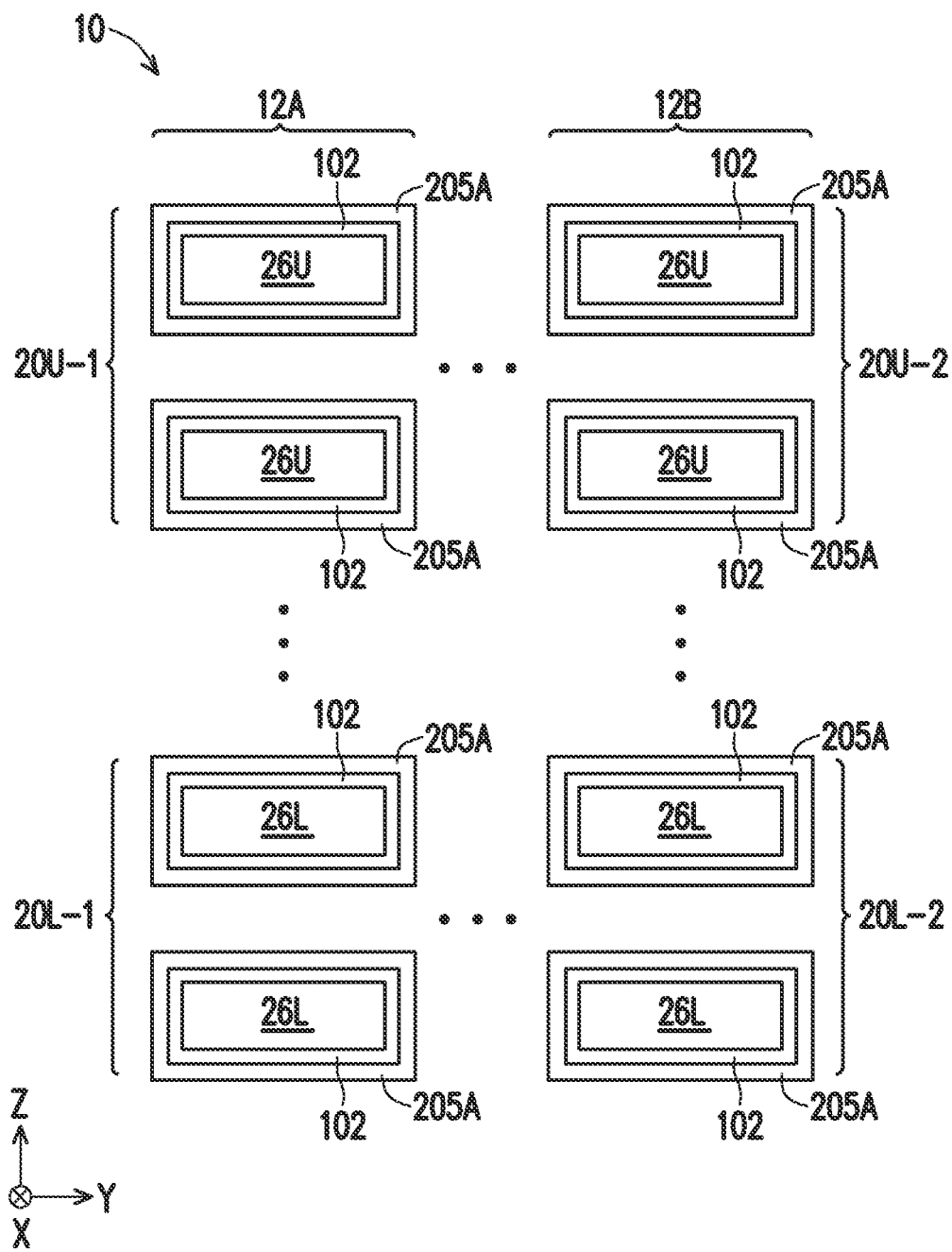
FIGS. 4A-4I are cross-sectional views of a stacked device structure, such as the stacked device structure of FIGS. 1A-1C, in portion or entirety, at various stages of another method for fabricating gates thereof, according to various aspects of the present disclosure.

Referring to FIG. 4A, interfacial layers 102 and high-k dielectric layers 205A are formed over semiconductor layers 26U and semiconductor layers 26L, such as described with reference to FIG. 2A. High-k dielectric layers 205A are similar to high-k dielectric layers 105A described with reference to FIG. 2A. For example, high-k dielectric layers 205A may be hafnium-based oxide (e.g., $HfO_2$) layers or zirconium-based oxide (e.g., $ZrO_2$) layers.

Figure 4B:
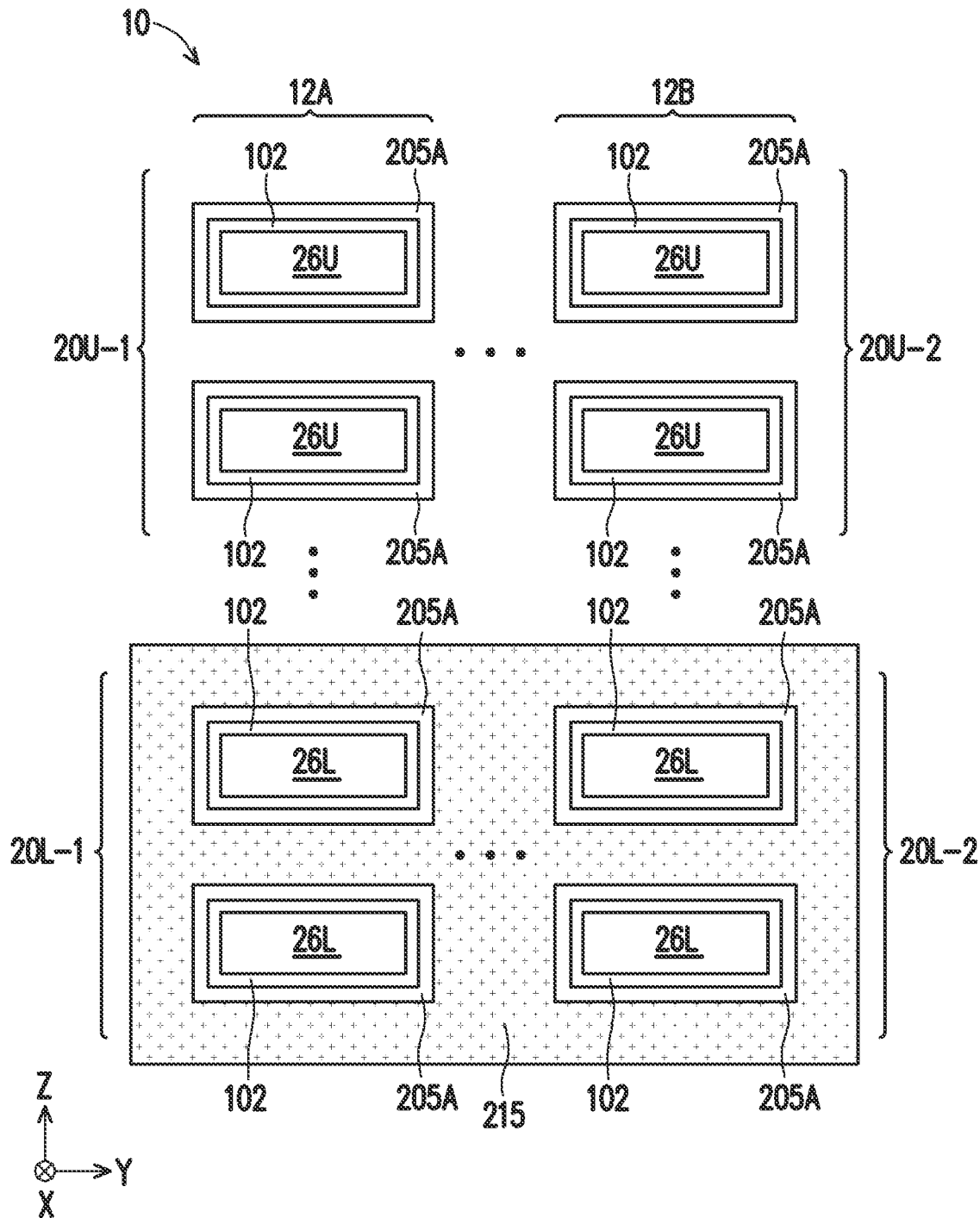
Figure 4C:
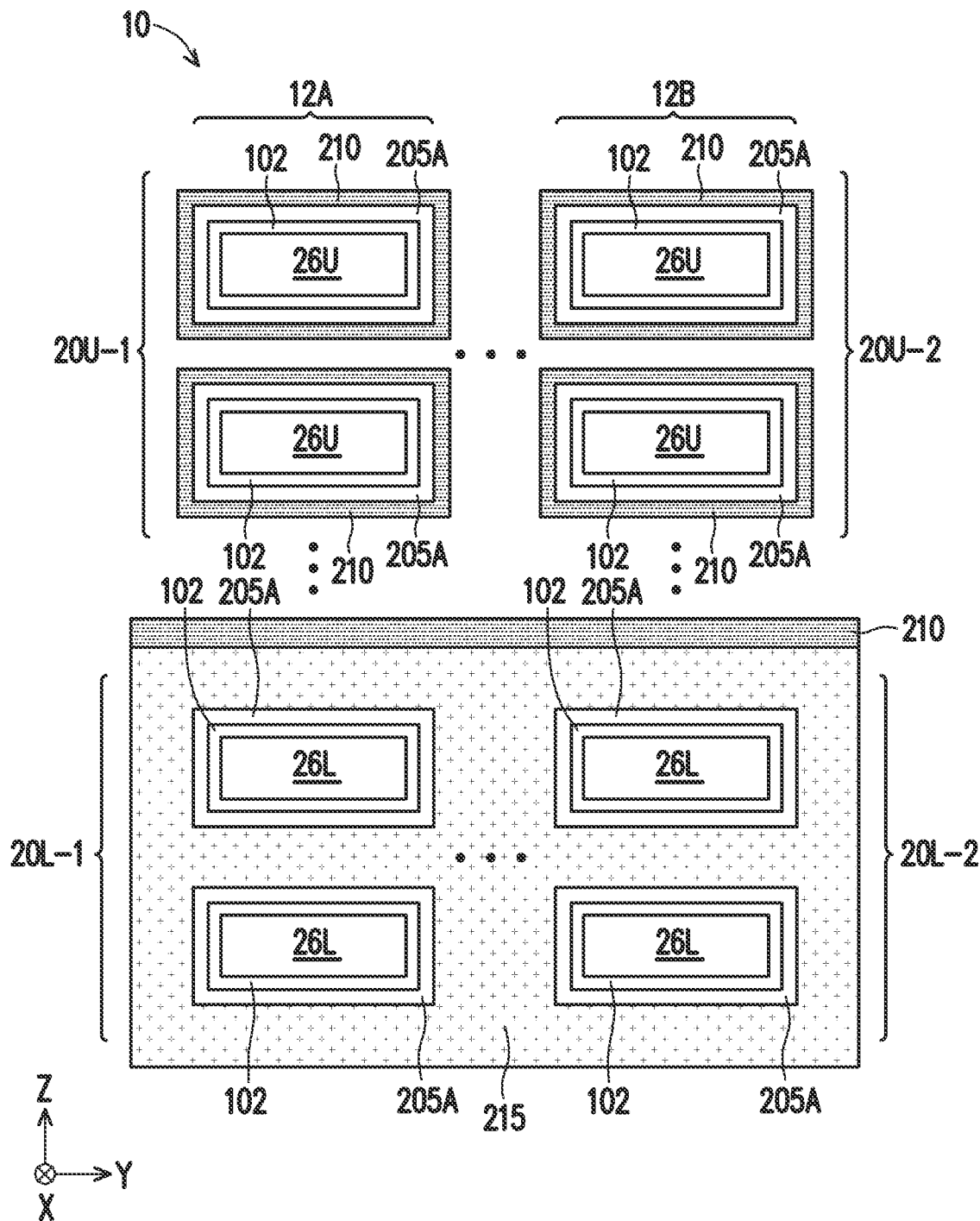
Figure 4D:
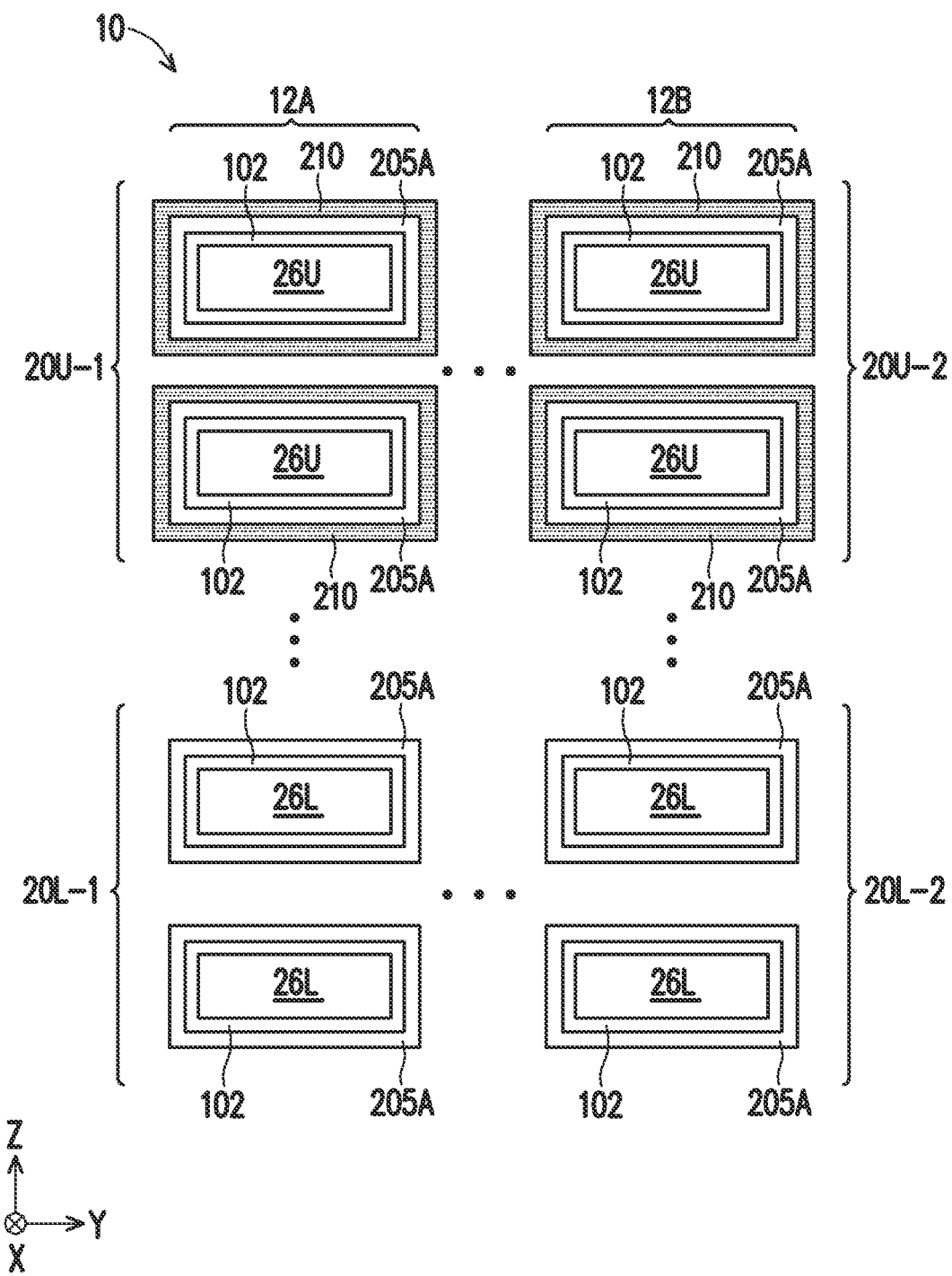

Referring to FIGS. 4B-4D, dipole dopant source layers 210 are formed over high-k dielectric layers 205A of upper transistors but not over high-k dielectric layers 205A of lower transistors. Dipole dopant (e.g., p-dipole dopant) will thus be driven into high-k dielectric layers 205A of upper transistors but not into high-k dielectric layers 205A of lower transistors during a subsequent thermal drive-in process (FIG. 4F), which will change threshold voltages of upper transistors relative to threshold voltages of lower transistors. In some embodiments, dipole dopant source layers 210 are formed over high-k dielectric layers 205A of upper transistors by forming a patterning layer 215 that covers high-k dielectric layers 205A of lower transistors (e.g., transistor 20L-1 and transistor 20L-2) and exposes high-k dielectric layers 205A of upper transistors (FIG. 4B), depositing dipole dopant source layers 210 over high-k dielectric layers 205A of upper transistors (FIG. 4C), and selectively removing patterning layer 215 (FIG. 4D). In the depicted embodiment, dipole dopant source layers 210 are formed over high-k dielectric layers 205A of p-type transistors (e.g., transistor 20U-1 and transistor 20U-2).

In FIG. 4B, patterning layer 215 may be formed by depositing a dummy fill layer that covers high-k dielectric layers 205A of upper transistors and lower transistors and recessing (e.g., etching back) the dummy fill layer to expose high-k dielectric layers 205A of upper transistors. A composition of dummy fill layer is different than a composition of high-k dielectric layers 205A and dipole dopant source layers 210 to enable selective removal/etching thereof. In some embodiments, the dummy fill layer is a dielectric material that includes silicon and oxygen, carbon, hydrogen, nitrogen, or a combination thereof. For example, the dummy fill layer may be a silicon oxide layer or a silicon oxycarbide layer. The dummy fill layer may be formed by ALD, CVD, other suitable process, or a combination thereof. In some embodiments, the dummy fill layer is formed by a spin-on deposition process. In some embodiments, the recessing is an etching process that etches the dummy fill layer with no (or negligible) etching of high-k dielectric layers 205A. In some embodiments, patterning layer 215 is formed during a gate replacement process, the dummy fill layer fills the gate openings after deposition, and the dummy fill layer partially fills the gate openings after the recessing.

In FIG. 4C, dipole dopant source layers 210 are formed over semiconductor layers 26U of both device stack 12A and device stack 12B. Transistor 20U-1 and transistor 20U-2 thus each include a respective dipole dopant source layer 210. Dipole dopant source layers 210 surround semiconductor layers 26U, and dipole dopant source layers 210 cover tops of patterning layer 215. In the X-Z plane (e.g., FIG. 1A), dipole dopant source layers 210 may cover tops and bottoms of semiconductor layers 26U. Dipole dopant source layers 210 are formed by ALD, CVD, other suitable process, or a combination thereof. In some embodiments, dipole dopant source layers 210 are formed during a gate replacement process, dipole dopant source layers 210 partially fill the gate openings, and dipole dopant source layers 210 partially fill gaps between semiconductor layers 26U and/or gaps between semiconductor layers 26U and semiconductor layers 26M. In some embodiments, dipole dopant source layers 210 may also be formed over high-k dielectric layers 205A that are disposed on semiconductor layers 26M of upper transistors and may extend along sidewalls of isolation structures 17 thereunder.

Dipole dopant source layers 210 are dielectric layers that includes p-dipole dopant(s) that may be driven into high-k dielectric layers 205A to change a threshold voltage of transistor 20U-1 and transistor 20U-2. For example, driving p-dipole dopant into high-k dielectric layers 205A of p-type transistors (e.g., transistor 20U-1 and transistor 20U-2) may decrease threshold voltages thereof. Dipole dopant source layers 210 include p-dipole dopant (e.g., a metal) and oxygen, nitrogen, carbon, or a combination thereof (e.g., a non-metal). The p-dipole dopant is aluminum (Al), titanium (Ti), zinc (Zn), other suitable p-dipole dopant, or a combination thereof. In some embodiments, the p-dipole dopant is aluminum, and dipole dopant source layers 210 are aluminum oxide layers (e.g., $AlO_x$ layers) or aluminum nitride layers (e.g., $AlN_x$ layers). In some embodiments, the p-dipole dopant is titanium, and dipole dopant source layers 210 are titanium nitride layers (e.g., $TiAl_xN_y$ layers) or titanium oxide layers (e.g., $TiO_x$ layers). In some embodiments, the p-dipole dopant is zinc, and dipole dopant source layers 210 are zinc oxide layers (e.g., $ZnO_x$ layers). In some embodiments, dipole dopant source layers 210 have multilayer structures. For example, dipole dopant source layers 210 have a bilayer aluminum-containing structure, such as an aluminum nitride layer disposed over an aluminum oxide layer. In another example, dipole dopant source layers 210 have a bilayer titanium-and-aluminum-containing structure, such as an aluminum nitride layer disposed over a titanium aluminum nitride layer. In another example, dipole dopant source layers 210 have a tri-layer titanium-and-aluminum-containing structure, such as a titanium aluminum nitride layer disposed between an aluminum nitride layer and an aluminum oxide layer.

Dipole dopant source layers 210 have a substantially uniform thickness. In some embodiments, a thickness of dipole dopant source layers 210 is about 0.5 nm to about 1.5 nm. If dipole dopant source layers 210 are too thin (such as less than 0.5 nm), they may not uniformly cover high-k dielectric layers 205A, which may affect uniformity of dipole engineering of high-k dielectric layers 205A and/or uniformity of threshold voltage tuning of transistors (i.e., non-uniform threshold voltage tuning may occur). If dipole dopant source layers 210 are too thick (such as greater than 1.5 nm), they may be difficult to remove and thus undesirably remain in gate stacks of transistors. For example, if too thick, remnants of a dipole dopant source layer may remain between channel layers (e.g., dipole dopant source layer 210 may remain in gaps between semiconductor layers 26). This may affect subsequent fabrication, for example, by leaving insufficient space for a gate electrode between the semiconductor layers 26 and/or cause a transistor including remnants of a dipole dopant source layer to have different electrical characteristics than intended (e.g., different threshold voltage). Further, compositions and thicknesses of dipole dopant source layers 210 may be designed based on a desired amount of threshold voltage tuning. For example, thicker dipole dopant source layers 210 may provide greater threshold voltage changes in the transistors. In some embodiments, dipole dopant source layers 210 have a multilayer structure, where a composition and a thickness of each layer may be designed to achieve desired threshold voltage tuning of the transistors.

In FIG. 4D, an etching process may selectively remove patterning layer 215 with respect to high-k dielectric layers 205A and dipole dopant source layers 210. For example, the etching process etches patterning layer 215 with no (or negligible) etching of high-k dielectric layers 205A and dipole dopant source layers 210. In some embodiments, an etchant of the etching process etches patterning layer 215 (e.g., a dielectric material that includes silicon and oxygen, carbon, hydrogen, nitrogen, or a combination thereof) at a higher rate than high-k dielectric layers 205A (e.g., metal oxide layers having a second composition) and dipole dopant source layers 210 (e.g., metal oxide layers having a first composition). The etching process is a dry etch, a wet etch, other suitable etch, or a combination thereof. In the depicted embodiment, dipole dopant source layers 210 formed on tops of patterning layer 215 may be removed as its underlying support structure provided by patterning layer 215 is removed by the etching.

Figure 4E:
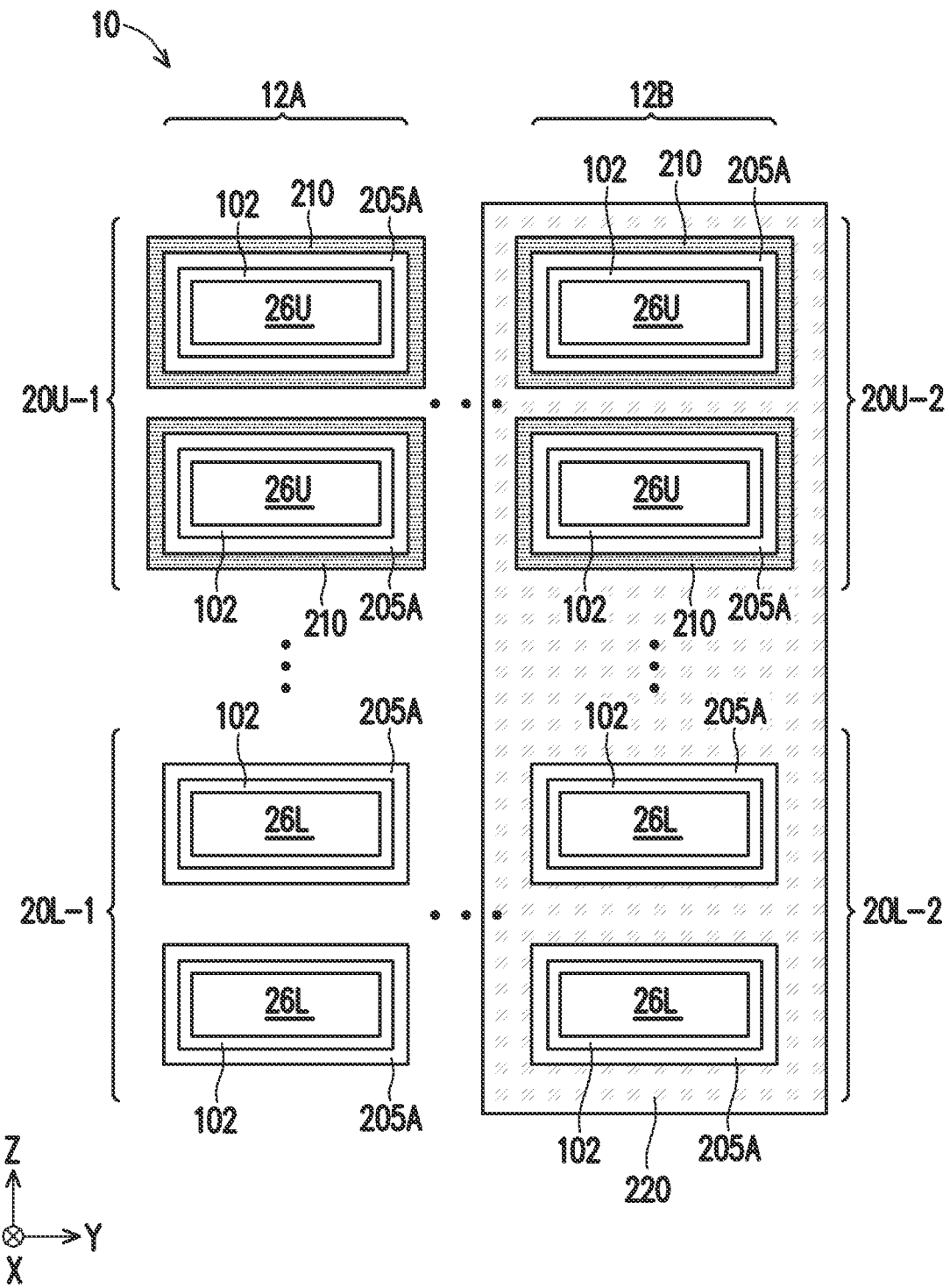

Referring to FIG. 4E, to further adjust threshold voltages of the transistors, a mask 220 (e.g., a hard mask) is formed that will cover some transistors but not other transistors during the thermal drive-in process. For example, mask 220 is formed in device stack 12B, and mask 220 covers dipole dopant source layers 210 of transistor 20U-2 and high-k dielectric layers 205A of transistor 20L-2. In some embodiments, mask 220 is formed by depositing a hard mask material over device stack 12A and device stack 12B and performing a patterning process to remove the hard mask material from device stack 12A, thereby exposing dipole dopant source layers 210 of transistor 20U-1 and high-k dielectric layers 205A of transistor 20L-1. The patterning process may include performing a lithography process to form a patterned resist layer that covers the hard mask material over device stack 12B and exposes the hard mask material over device stack 12A (e.g., the patterned resist layer has an opening therein that overlaps device stack 12A) and performing an etching process to selectively remove the hard mask material. A composition and/or a thickness of mask 220 is configured to block and/or prevent nitrogen from reaching and/or diffusing into high-k dielectric layers 205A of device stack 12B during the thermal drive-in process. Further, the composition of mask 220 is different than a composition of high-k dielectric layers 205A and dipole dopant source layers 210 to enable selective removal/etching thereof. In some embodiments, mask 120 includes metal and oxygen and/or nitrogen (i.e., mask 120 is a metal oxide mask and/or a metal nitride mask). For example, mask 120 may include aluminum and oxygen and/or nitrogen, and mask 120 may be an aluminum oxide mask (e.g., an $Al_2O_3$ layer), an aluminum oxynitride mask (e.g., an AlON layer), an aluminum nitride mask (e.g., an AlN layer), or a combination thereof.

Figure 4F:
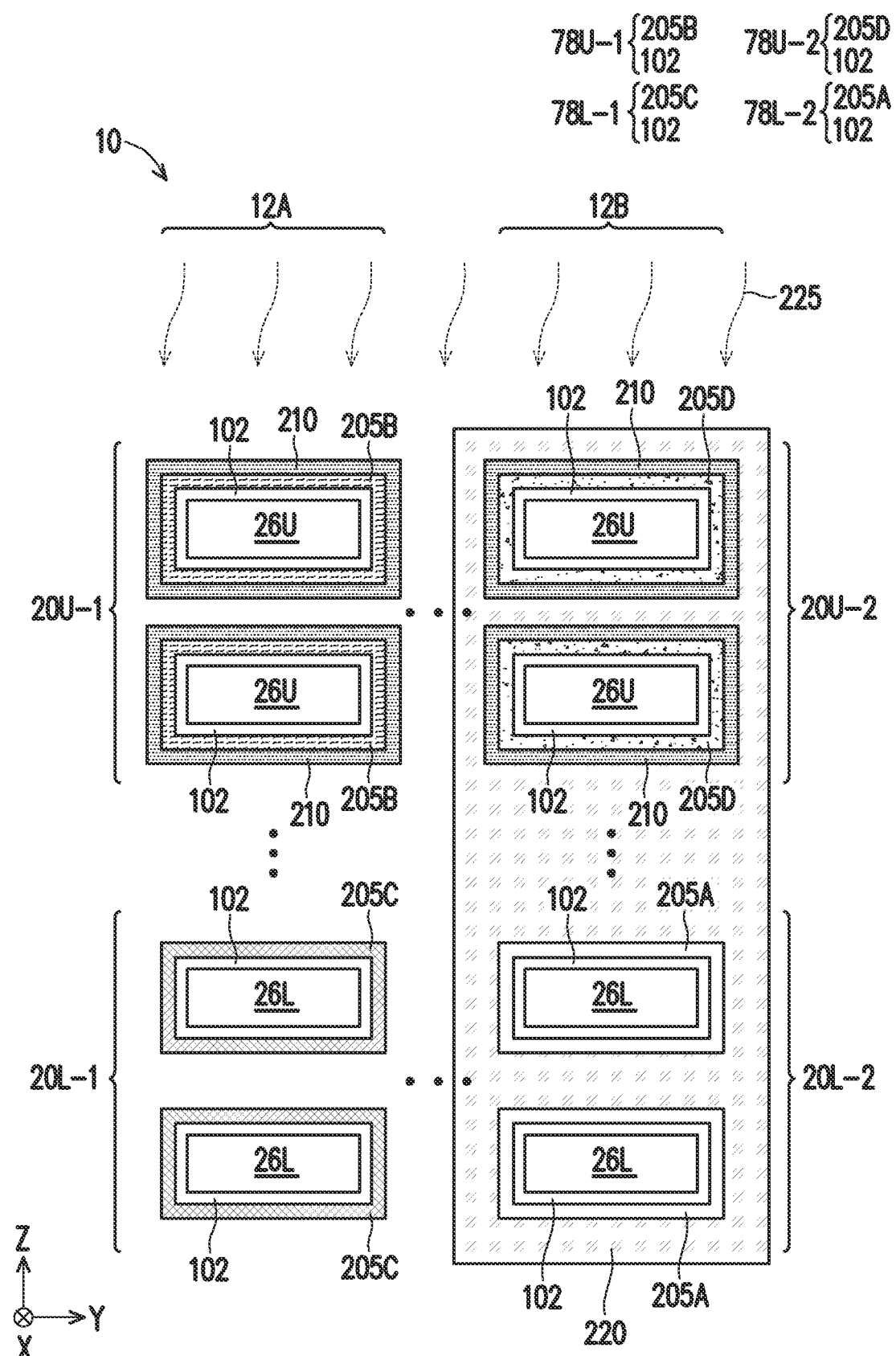

Referring to FIG. 4F, a thermal drive-in process 225 (also referred to as a dipole anneal) is performed in a nitrogen-containing ambient. Thermal drive-in process 225 drives (diffuses) p-dipole dopant from dipole dopant source layers 210 into high-k dielectric layers 205A of upper transistors (e.g., transistor 20U-1 and transistor 20U-2) and drives (diffuses) nitrogen into high-k dielectric layers 205A of unmasked transistors (e.g., transistor 20U-1 and transistor 20L-1). Thermal drive-in process 225 may also diffuse p-dipole dopant from dipole dopant source layers 210 into interfacial layers 102 of upper transistors and/or diffuse nitrogen into interfacial layers 102 of unmasked transistors. Thermal drive-in process 225 may be an annealing process, such as RTA, MSA, μSA, a microwave annealing, a laser annealing, a spike annealing, a soak annealing, a furnace annealing, other suitable annealing process, or a combination thereof. In the depicted embodiment, the nitrogen-containing ambient includes $NH_3$ and $N_2$. For example, thermal drive-in process 225 is an $NH_3/N_2$ soak anneal or an $NH_3/N_2$ spike anneal. Parameters of thermal drive-in process 225 (e.g., drive-in temperature, time, ambient, pressure, etc.) are tuned to provide high-k dielectric layers 205 with desired dipole dopant concentrations and/or profiles and desired nitrogen concentrations and/or profiles. For example, higher temperatures and/or higher times may result in higher dipole dopant concentrations and/or higher nitrogen concentrations in high-k dielectric layers 205A. In some embodiments, a drive-in temperature of thermal drive-in process 225 is about 500° C. to about 1,000° C. In some embodiments, a drive-in time is about 0.2 seconds to about 120 seconds. Thermal drive-in parameters, such as temperature, are selected to ensure thermal drive-in process 225 does not adversely affect existing structures/features of the transistors and is yet sufficient to cause p-dipole dopant to migrate/diffuse into high-k dielectric layers 205A of upper transistors and cause nitrogen to migrate/diffuse into high-k dielectric layers 205A of unmasked transistors.

Because thermal drive-in process 225 diffuses nitrogen and p-dipole dopant into unmasked high-k dielectric layers 205A having dipole dopant source layers 210 formed thereon, nitrogen into unmasked high-k dielectric layers 205A, and p-dipole dopant into masked high-k dielectric layers 205A having dipole dopant source layers 210 formed thereon, high-k dielectric layers 205A of transistor 20U-1 become high-k dielectric layers 205B (i.e., high-k dielectric layers doped with p-dipole dopant and nitrogen), high-k dielectric layers 205A of transistor 20L-1 become high-k dielectric layers 205C (i.e., high-k dielectric layers doped with nitrogen), and high-k dielectric layers 205A of transistor 20U-2 become high-k dielectric layers 205D (i.e., high-k dielectric layers doped with p-dipole dopant), such as depicted in FIG. 4F. Because high-k dielectric layers 205A of transistor 20L-2 are masked and do not have dipole dopant source layers 210 formed thereon, a composition thereof is not changed by thermal drive-in process 225 (i.e., high-k dielectric layers 205A remain undoped). In some embodiments, high-k dielectric layers 205A include a high-k dielectric metal (e.g., Hf, Zr, Ti, Ta, La, other high-k dielectric metal, or a combination thereof) and oxygen; high-k dielectric layers 205B include the high-k dielectric metal, oxygen, nitrogen, and a p-dipole metal (e.g., Al, Ti, Zn, other p-dipole dopant, or a combination thereof); high-k dielectric layers 205C include the high-k dielectric metal, oxygen, and nitrogen; and high-k dielectric layers 205D include the high-k dielectric metal, oxygen, and the p-dipole metal. In such embodiments, high-k dielectric layers 205A do not include (i.e., are free of) nitrogen and the p-dipole dopant, high-k dielectric layers 205C do not include the p-dipole dopant, and high-k dielectric layers 205D do not include nitrogen. In some embodiments, the nitrogen concentrations and/or the dipole dopant concentrations in high-k dielectric layers 205A-205D may have gradient profiles. For example, a nitrogen concentration in high-k dielectric layer 205B and/or high-k dielectric layer 205C may increase from tops thereof to bottoms thereof, which interface with interfacial layers 102 and/or semiconductor layers 26. In another example, a p-dipole concentration in high-k dielectric layer 205B and/or high-k dielectric layer 205D may increase from tops thereof to bottoms thereof, which interface with interfacial layers 102 and/or semiconductor layers 26. The present disclosure contemplates other profiles of nitrogen and/or p-dipole dopant in high-k dielectric layers 205A-205D.

Transistors of stacked device structure 10 are thus provided with different gate dielectrics (i.e., gate dielectrics having different compositions) that adjust their threshold voltages relative to one another. For example, gate dielectric 78U-1 includes high-k dielectric layers 205B and interfacial layers 102, gate dielectric 78L-1 includes high-k dielectric layers 205C and interfacial layers 102, gate dielectric 78U-2 includes high-k dielectric layers 205D and interfacial layers 102, and gate dielectric 78L-2 includes high-k dielectric layers 205A and interfacial layers 102. In some embodiments, the p-dipole dopant and/or nitrogen is also diffused into interfacial layers 102, and the transistors may also have different interfacial layers (i.e., interfacial layers having different compositions). In some embodiments, interfacial layers 102 of gate dielectric 78L-2 may include silicon and oxygen; interfacial layers 102 of gate dielectric 78U-1 may include silicon, oxygen, the p-dipole metal, and nitrogen; interfacial layers 102 of gate dielectric 78L-1 may include silicon, oxygen, and nitrogen; and interfacial layers 102 of gate dielectric 78U-2 may include silicon, oxygen, and the p-dipole metal.

Figure 4G:
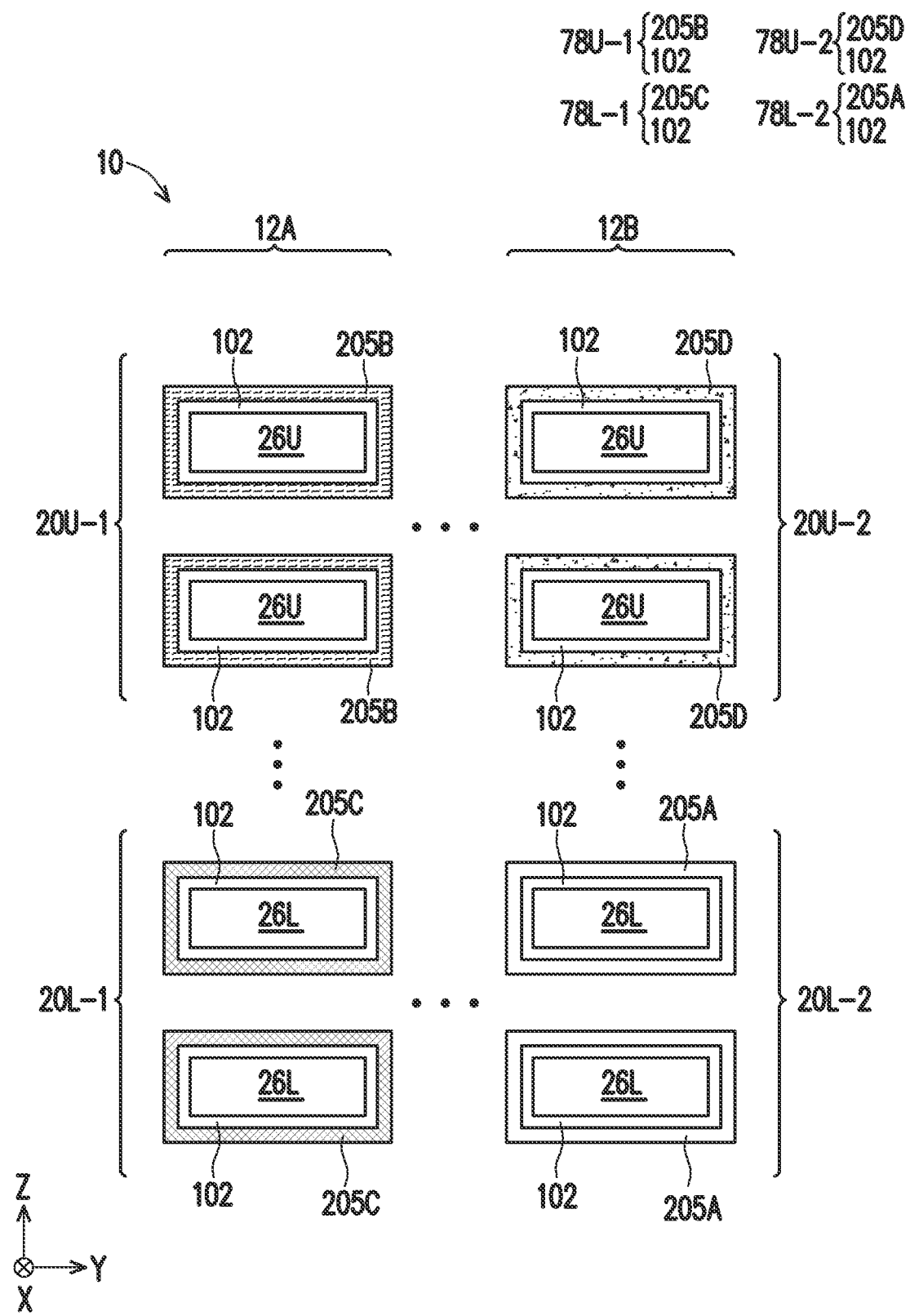

Referring to FIG. 4G, processing includes removing mask 220 and dipole dopant source layers 210 from stacked device structure 10. Because the disclosed dipole engineering process removes dipole dopant source layers 210 and mask 220, the disclosed dipole engineering process provides volume-free threshold voltage tuning of transistors. In other words, the disclosed dipole engineering process modulates threshold voltages of multiple transistors by driving p-dipole dopant, nitrogen, both, or neither into gate dielectrics (e.g., high-k dielectric layers thereof), but material layers used for such threshold voltage modulation do not remain and thus do not consume any volume of final gate stacks of the transistors. Using such process during a gate replacement process maximizes dimensions of the gate openings and/or gaps between semiconductor layers 26 for subsequent gate electrode formation/filling.

In some embodiments, a first etching process may selectively remove mask 220 with respect to high-k dielectric layers (e.g., high-k dielectric layers 205A and high-k dielectric layers 205C) and dipole dopant source layers 210, and a second etching process may selectively remove dipole dopant source layers 210 with respect to high-k dielectric layers 205A-205D. For example, the first etching process etches mask 220 with no (or negligible) etching of high-k dielectric layers 205A, high-k dielectric layers 205C, and dipole dopant source layers 210, and the second etching process etches dipole dopant source layers 210 with no (or negligible) etching of high-k dielectric layers 205A-205D. In some embodiments, an etchant of the first etching process etches mask 220 (e.g., a dielectric material that includes silicon and oxygen, carbon, hydrogen, nitrogen, or a combination thereof) at a higher rate than high-k dielectric layers 205A, high-k dielectric layers 205C, and dipole dopant source layers 210 (e.g., metal oxide layers having different compositions), and an etchant of the second etching process etches dipole dopant source layers 210 (e.g., metal oxide layers having the first composition) at a higher rate than high-k dielectric layers 205A-205D (e.g., metal oxide layers having different compositions, each of which is different than the first composition). The first etching process and/or the second etching process is a dry etch, a wet etch, other suitable etch, or a combination thereof.

Figure 4H:
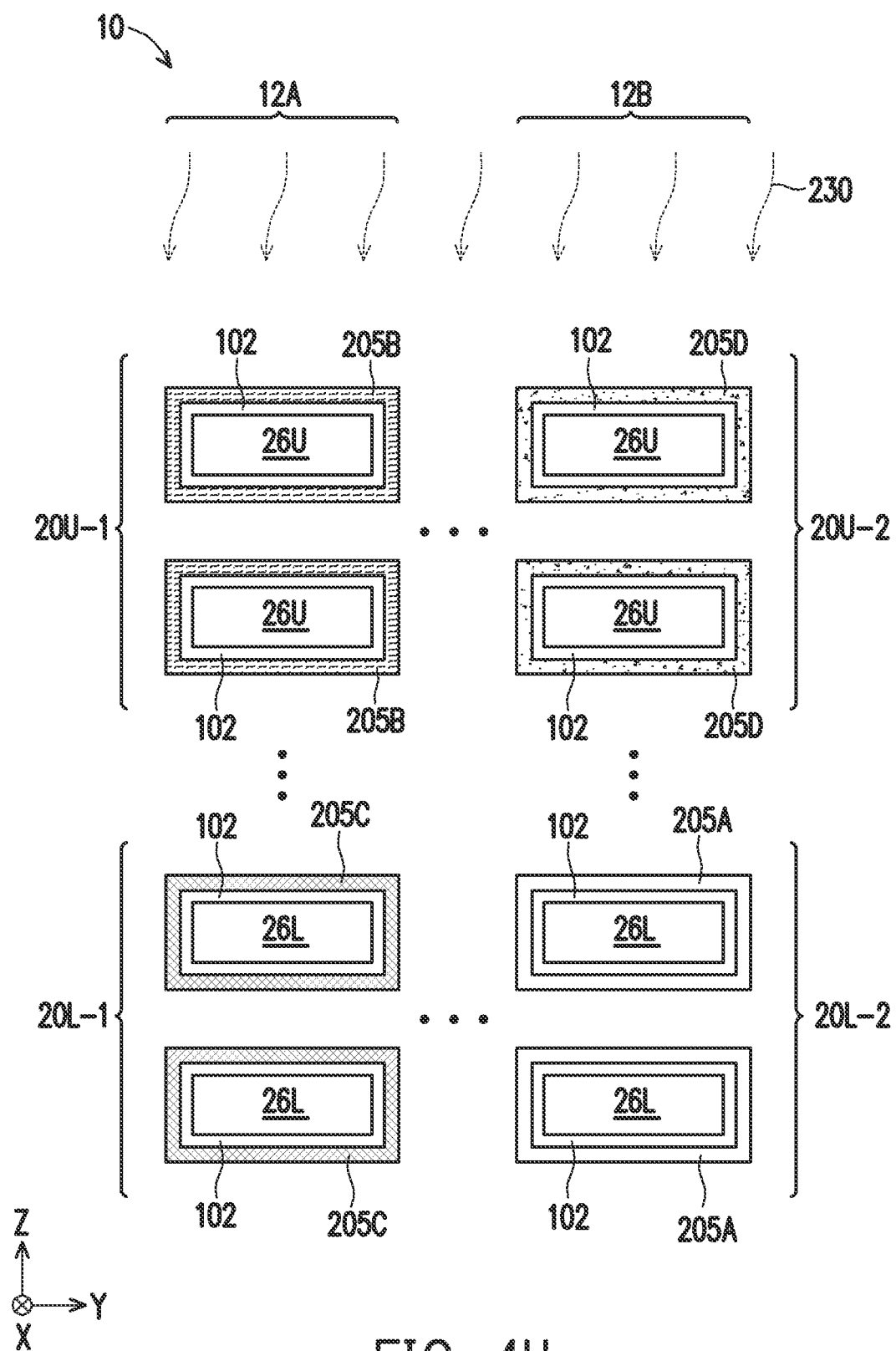

Referring to FIG. 4H, a thermal treatment 230 (also referred to as a post drive-in anneal) is performed to improve gate dielectric quality, such as that of gate dielectric 78U-1, gate dielectric 78U-2, gate dielectric 78L-1, and gate dielectric 78L-2. Thermal treatment 230 may be similar to thermal treatment 130 described above with reference to FIG. 2I. For example, thermal treatment 230 is an annealing process performed in a nitrogen-containing ambient, such as an $N_2$ soak anneal or an $N_2$ spike anneal, as described above.

Figure 4I:
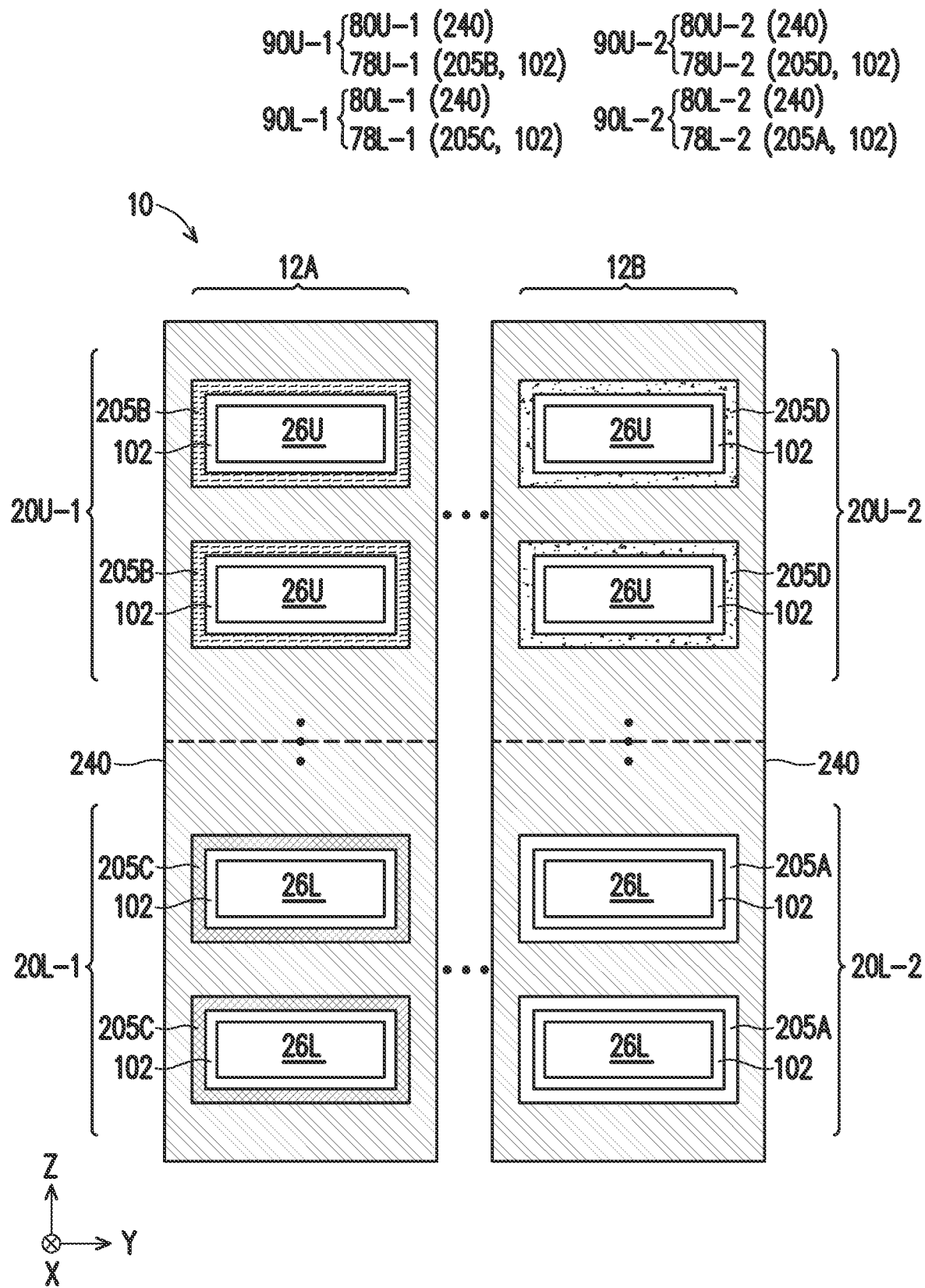

Referring to FIG. 4I, N-WFM layers 240 are formed over high-k dielectric layers 205A-205D. N-WFM layers 240 may be similar to N-WFM layers 140 described above with reference to FIG. 3A and FIG. 3B, and N-WFM layers 240 may be formed in a manner similar to P-WFM layers 135 described above with reference to FIG. 2J. In FIG. 4I, N-WFM layers 240 surround semiconductor layers 26U and semiconductor layers 26L of both device stack 12A and device stack 12B, and N-WFM layers 240 provide gate electrodes, or portions thereof, of upper transistors and lower transistors. For example, gate electrode 80U-1, gate electrode 80L-1, gate electrode 80U-2, and gate electrode 80L-2 each include a respective N-WFM layer 140 or portion thereof. N-WFM layers 140 cover tops of mesas 15'. In some embodiments, N-WFM layers 140 wrap tops of mesas 15'. In the X-Z plane (e.g., FIG. 1A), N-WFM layers 140 may cover tops and bottoms of semiconductor layers 26U, tops and bottoms of semiconductor layers 26L, and tops of mesas 15'. Further, N-WFM layers 140 may be wrapped by high-k dielectric layers 205B and high-k dielectric layers 205D formed over topmost semiconductor layers 26U, such as by portions thereof having u-shaped profiles. In some embodiments, N-WFM layers 140 may be formed over and wrap semiconductor layers 26M. In such embodiments, N-WFM layers 140 may surround middle portions of channel stacks, which may include a respective isolation structure 17 disposed between respective semiconductor layers 26M.

In FIG. 4I, stacked device structure 10 has a first CFET (e.g., device stack 12A) and a second CFET (e.g., device stack 12B). The first CFET has a first p-type GAA transistor (e.g., transistor 20U-1) and a first n-type GAA transistor (e.g., transistor 20L-1), and the second CFET has a second p-type GAA transistor (e.g., transistor 20U-2) and a second n-type GAA transistor (e.g., transistor 20L-2). Gate electrodes of the p-type GAA transistors and the n-type GAA transistors include a same work function material (e.g., N-WFM layers 240), and gate dielectrics of the p-type GAA transistors and the n-type GAA transistors have different compositions. For example, a gate dielectric of the first p-type GAA transistor includes a high-k dielectric layer doped with nitrogen and p-dipole dopant (e.g., high-k dielectric layer 205B), a gate dielectric of the second p-type GAA transistor includes a high-k dielectric layer doped with p-dipole dopant (e.g., high-k dielectric layer 205D), a gate dielectric of the first n-type GAA transistor includes a high-k dielectric layer doped with nitrogen (e.g., high-k dielectric layer 205C), and a gate dielectric of the second n-type GAA transistor includes an undoped high-k dielectric layer (i.e., without p-dipole dopant and nitrogen)(e.g., high-k dielectric layer 205A). The first p-type GAA transistor has a first threshold voltage, the second p-type GAA transistor has a second threshold voltage, the first n-type GAA transistor has a third threshold voltage, and the second n-type GAA transistor has a fourth threshold voltage. The first threshold voltage, the second threshold voltage, the third threshold voltage, and the fourth threshold voltage are different.

Figure 5A:
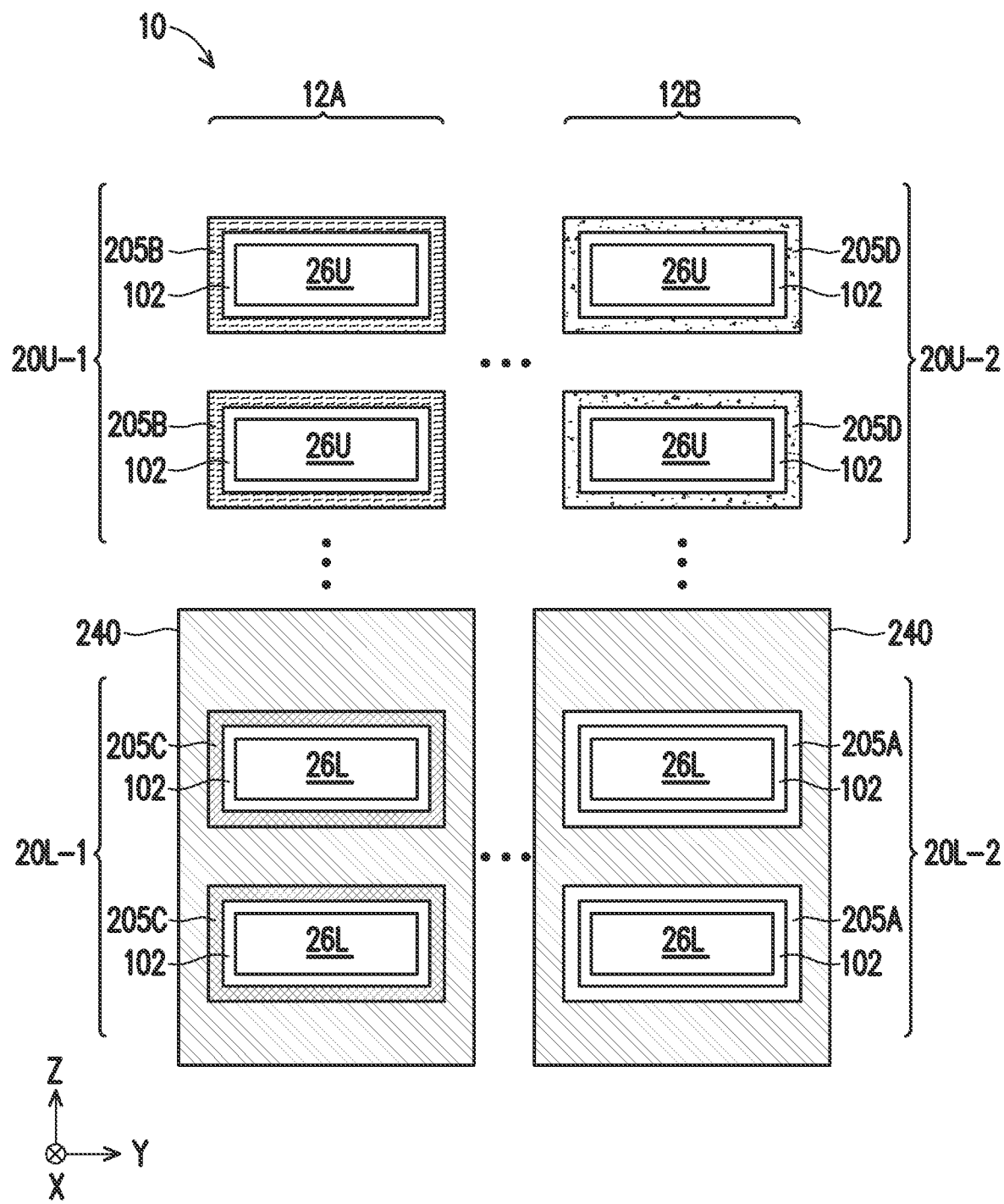
FIG. 5A and FIG. 5B are cross-sectional views of a stacked device structure, such as the stacked device structure of FIGS. 1A-1C, in portion or entirety, at another gate electrode formation stage according to various aspects of the present disclosure.
Figure 5B:
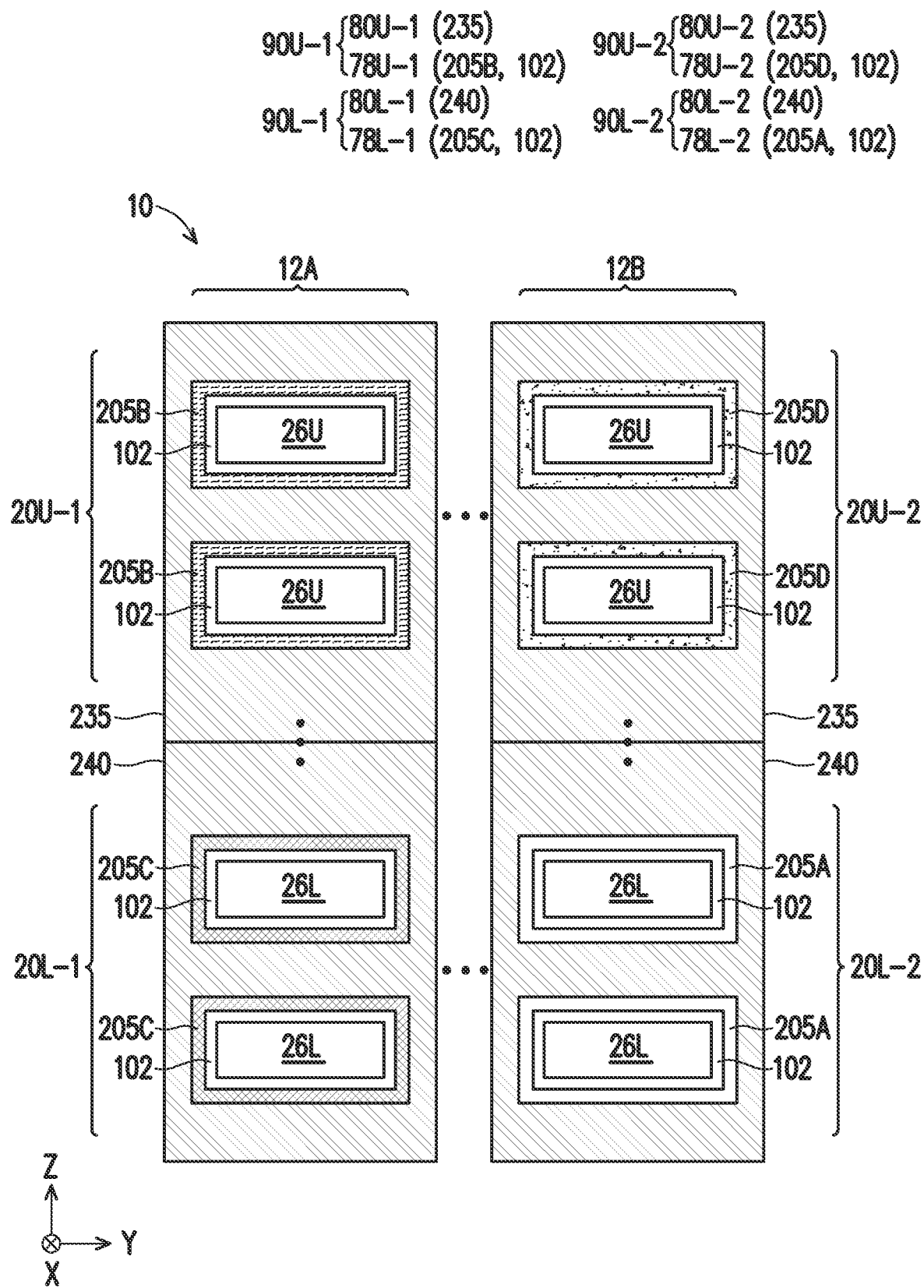

In some embodiments, gate electrodes of p-type transistors and n-type transistors include different work function materials, such as depicted in FIG. 5A and FIG. 5B. FIG. 5A and FIG. 5B are cross-sectional views of a stacked device structure, such as stacked device structure 10 of FIGS. 1A-1C, in portion or entirety, at a gate electrode formation stage according to various aspects of the present disclosure. The cross-sectional views of FIG. 5A and FIG. 5B are taken (cut) along a gate lengthwise direction (e.g., a y-direction), like the cross-sectional views of FIG. 1B and FIG. 1C. In FIG. 5A, stacked device structure 10 has undergone processing associated with FIGS. 4A-4H to provide high-k dielectric layers 205A-205D. Processing then continues with forming N-WFM layers 240 over high-k dielectric layers of lower, n-type transistors (e.g., high-k dielectric layers 205C and high-k dielectric layers 205A) in FIG. 5A and forming P-WFM layers 235 over high-k dielectric layers of upper, p-type transistors (e.g., high-k dielectric layers 205B and high-k dielectric layers 205D) in FIG. 5B. N-WFM layers 240 and P-WFM layers 235 may be formed similar to N-WFM layers 140 and P-WFM layers 135 described above with reference to FIG. 3A and FIG. 3B. P-WFM layers 235 may be similar to P-WFM layers 135 described above with reference to FIG. 2J. FIG. 5A and FIG. 5B have been simplified for the sake of clarity to better understand the inventive concepts of the present disclosure. For example, some features are omitted in FIG. 5A and FIG. 5B, such as semiconductor layers 26M, isolation structures 17 therebetween, mesas 15', substrate isolation structures 28, and substrate 15. Additional features may be added in stacked device structure 10 of FIG. 5A and FIG. 5B, and some of the features described below can be replaced, modified, or eliminated in other embodiments of stacked device structure 10 of FIG. 5A and FIG. 5B.

Figure 6:
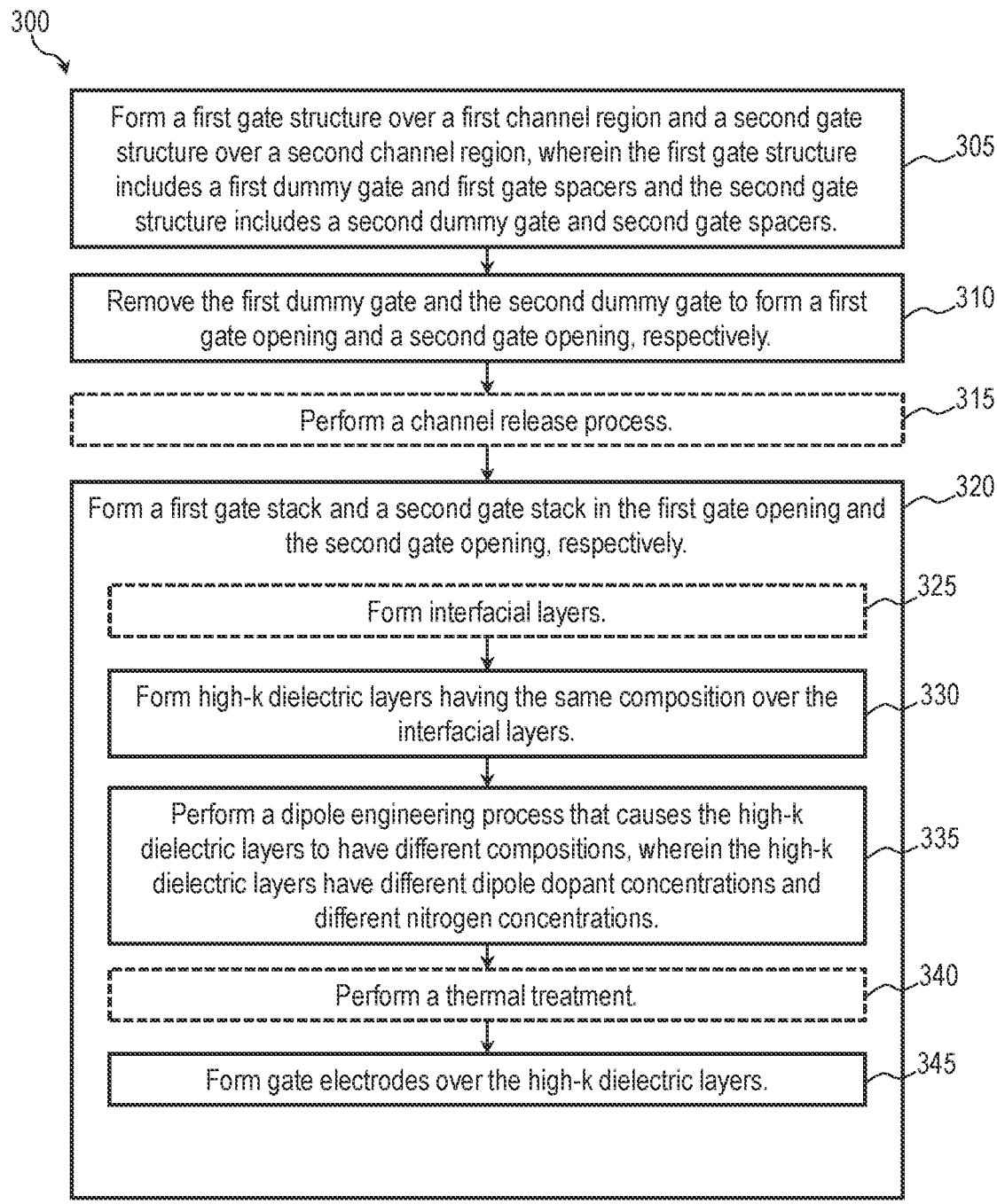
FIG. 6 is a flow chart of a method for fabricating gate stacks of transistors of a stacked device structure, such as gate stacks of transistors of the stacked device structure of FIGS. 1A-1C, according to various aspects of the present disclosure.

Referring to FIG. 6, FIG. 6 is a flow chart of a method 300 for fabricating gate stacks of transistors of a stacked device structure, such as gate stack 90U-1, gate stack 90L-1, gate stack 90U-2, and gate stack 90L-2 of stacked device structure 10 of FIGS. 1A-1C, according to various aspects of the present disclosure. To provide the transistors with different threshold voltages, method 300 provides the gate stacks of the transistors with gate dielectrics (e.g., gate dielectric 78U-1, gate dielectric 78L-1, gate dielectric 78U-2, and gate dielectric 78U-2) having different compositions. For example, the gate dielectrics have different dipole dopant concentrations and different nitrogen concentrations. FIG. 6 has been simplified for the sake of clarity to better understand the inventive concepts of the present disclosure. Additional steps may be provided before, during, and after method 300, and some of the steps described may be moved, replaced, or eliminated for additional embodiments of method 300.

Method 300 at block 305 includes forming a first gate structure over a first channel region and a second gate structure over a second channel region. The first gate structure includes a first dummy gate (e.g., a first polysilicon gate) and first gate spacers (e.g., gate spacers 44), and the second gate structure includes a second dummy gate (e.g., a second polysilicon gate) and second gate spacers (e.g., gate spacers 44). The first gate spacers may be disposed along sidewalls of the first dummy gate, and the second gate spacers may be disposed along sidewalls of the second dummy gate. In some embodiments, where the transistors are GAA transistors, the first channel region and the second channel region may each include an upper semiconductor layer stack and a lower semiconductor layer stack separated by a sacrificial layer or an isolation structure. In some embodiments, where the transistors are FinFET transistors, the first channel region and the second channel region may each include a semiconductor fin extending from a substrate. At block 310, method 300 includes removing the first dummy gate and the second dummy gate to form a first gate opening and a second gate opening, respectively. The first gate opening exposes the first channel region, and the second gate opening exposes the second channel region. In some embodiments, such as where the transistors are GAA transistors, method 300 at block 315 may include performing a channel release process. For example, the upper semiconductor layer stack and the lower semiconductor layer stack may each include first semiconductor layers and second semiconductor layers stacked vertically (e.g., along the z-direction) in an interleaving and/or alternating configuration from a top surface of a substrate, and the first semiconductor layers and the second semiconductor layers have different compositions. The channel release process may include selectively removing the second semiconductor layers, such that the first semiconductor layers (e.g., semiconductor layers 26U, semiconductor layers 26L, and semiconductor layers 26M) are suspended over the substrate. In embodiments where the upper semiconductor layer stack and the lower semiconductor layer stack are separated by the sacrificial layer, the sacrificial layer may be selectively removed and replaced with an isolation structure before or after the channel release process.

Method at block 320 includes forming a first gate stack (e.g., a first high-k/metal gate, such as gate 90A) and a second gate stack (e.g., a second high-k/metal gate, such as gate 90B) in the first gate opening and the second gate opening, respectively. The first gate stack and the second gate stack may be formed by forming interfacial layers (e.g., interfacial layers 102) at block 325, forming high-k dielectric layers having the same composition (e.g., high-k dielectric layers 105A or high-k dielectric layers 205A) over the interfacial layers at block 330, and performing a dipole engineering process (e.g., FIGS. 2B-2H or FIGS. 4B-4G) that causes the high-k dielectric layers to have different compositions (e.g., high-k dielectric layers 105A-105D or high-k dielectric layers 205A-205D). The high-k dielectric layers have different dipole dopant concentrations and different nitrogen concentrations after the dipole engineering process. In some embodiments, the dipole engineering process includes performing a nitrogen-containing thermal drive-in process, which may be an annealing process performed in nitrogen ambient. The nitrogen ambient may include $NH_3$ and $N_2$. Method 300 at block 340 may further include performing a thermal treatment. In some embodiments, the thermal treatment is an annealing process performed in nitrogen ambient. The thermal treatment and the nitrogen-containing thermal drive-in process are performed in different nitrogen ambient. For example, the nitrogen ambient for the thermal treatment may include $N_2$, but not $NH_3$. The first gate stack and the second gate stack may further be formed forming gate electrodes (e.g., gate electrode 80U-1, gate electrode 80L-1, gate electrode 80U-2, and gate electrode 80U-2) over the high-k dielectric layers at block 345. In some embodiments, the gate electrodes include a same work function layer(s) (e.g., P-WFM layers 135 or N-WFM layers 240). In such embodiments, the upper transistors (e.g., p-type transistors) and the lower transistors (e.g., n-type transistors) may have gate electrodes of a same work function material. In some embodiments, the gate electrodes include different work function layers. For example, the upper transistors (e.g., p-type transistors) may have a first work function layer (e.g., P-WFM layers 135 or P-WFM layers 235) over their high-k dielectric layers, and the lower transistors (e.g., n-type transistors) may have a second work function layer (e.g., N-WFM layers 140 or N-WFM layers 240) over their high-k dielectric layers. In some embodiments, the first work function layer and the second work function layer include a same type work function material. In some embodiments, the first work function layer and the second work function layer include different type work function materials.

Referring to FIG. 7, FIG. 7 is a flow chart of a method 400 for fabricating a stacked device structure, such as stacked device structure 10 of FIGS. 1A-1C, according to various aspects of the present disclosure. according to various aspects of the present disclosure. In method 400, upper transistors and lower transistors of the stacked device structure are fabricated monolithically. Method 400 may be referred to as a monolithic CFET process. Method 400 may implement method 300 to provide gate stacks of transistors of the stacked device structure with gate dielectrics (e.g., gate dielectric 78U-1, gate dielectric 78L-1, gate dielectric 78U-2, and gate dielectric 78U-2) having different compositions. For example, the gate dielectrics have different dipole dopant concentrations and different nitrogen concentrations. FIG. 7 has been simplified for the sake of clarity to better understand the inventive concepts of the present disclosure. Additional steps may be provided before, during, and after method 400, and some of the steps described may be moved, replaced, or eliminated for additional embodiments of method 400.

Method 400 at block 405 includes receiving a device precursor having an upper semiconductor stack and a lower semiconductor stack separated by an intermediate layer. The upper semiconductor layer stack and the lower semiconductor layer stack each include first semiconductor layers and second semiconductor layers stacked vertically (e.g., along a z-direction) in an interleaving and/or alternating configuration from a top surface of a substrate. The first semiconductor layers (e.g., semiconductor layers 26) and the second semiconductor layers have different compositions to achieve etching selectivity and/or different oxidation rates during subsequent processing. For example, the first semiconductor layers and the semiconductor layers include different materials, constituent atomic percentages, constituent weight percentages, thicknesses, other characteristics, or a combination thereof to achieve desired etching selectivity. In some embodiments, the first semiconductor layers include silicon, and the second semiconductor layers include silicon germanium.

Method 400 at block 410 includes patterning the device precursor to form a semiconductor fin having an upper semiconductor stack portion and a lower semiconductor stack portion separated by an intermediate layer portion. In some embodiments, a fin fabrication process is performed to pattern the device precursor. The semiconductor fin may extend along an x-direction, having a length in the x-direction, a width in the y-direction, and a height in the z-direction. The lower semiconductor stack portion may be disposed over a substrate portion (e.g., a respective mesa 15') of the semiconductor fin. At block 415, method 400 includes forming substrate isolation structures (e.g., substrate isolation structures 28). The substrate isolation structures may be formed in trenches between the semiconductor fin and other semiconductor fins. The substrate isolation structures may fill lower portions of the trenches and surround portions of the semiconductor fin. Portions of the semiconductor fin that extend from top surfaces of the substrate isolation structures may be referred to as fin active regions. The substrate isolation structures may be formed by depositing a liner layer (e.g., a dielectric layer) that partially fills the trenches, depositing an oxide material over the liner layer that fills remainders of the trenches, performing a planarization process, and recessing and/or etching back the substrate isolation structures, such that the semiconductor fin protrudes therefrom. The planarization process may be performed until reaching and exposing a planarization stop layer. In some embodiments, the planarization process removes mask layers, any of the liner layer, any of the oxide material, any of the liner layer, or a combination thereof that are above and/or over top surfaces of the semiconductor fin. Remainders of the liner layer and the oxide material may form liners and bulk dielectrics, respectively, of the substrate isolation structures.

At block 420 and block 425, method 400 includes forming a first gate structure over the semiconductor fin, forming a second gate structure over the semiconductor fin, and forming source/drain recesses in the semiconductor fin. The first gate structure is formed over a first channel region of the semiconductor fin, the second gate structure is formed over a second channel region of the semiconductor fin, and the source/drain recesses are formed in source/drain regions of the semiconductor fin. The first gate structure includes a first dummy gate (e.g., a first polysilicon gate) and first gate spacers (e.g., gate spacers 44), and the second gate structure includes a second dummy gate (e.g., a second polysilicon gate) and second gate spacers (e.g., gate spacers 44). The first gate spacers may be disposed along sidewalls of the first dummy gate, and the second gate spacers may be disposed along sidewalls of the second dummy gate. The first dummy gate and the second dummy gate extend lengthwise in a direction that is different than (e.g., orthogonal to) the lengthwise direction of the semiconductor fin. For example, the first dummy gate and the second dummy gate extend along the y-direction, having a length in the y-direction, a width in the x-direction, and a height in the z-direction. In the X-Z plane, the first gate structure and the second gate structure may be disposed over tops of the channel regions of the semiconductor fin, and the first gate structure and the second gate structure may be disposed between respective source/drain recesses. In the Y-Z plane, the first dummy gate and the second dummy gate may be disposed on tops and sidewalls of the semiconductor fin, such that the first dummy gate and the second dummy gate wrap the channel regions. The first dummy gate and the second dummy gate may include a dummy gate dielectric, a dummy gate electrode, and a hard mask. The dummy gate dielectric includes a dielectric material, such as silicon oxide, a high-k dielectric material, other suitable dielectric material, or a combination thereof. The dummy gate electrode includes a suitable dummy gate material, such as polysilicon. The hard mask includes suitable hard mask material, such as silicon nitride.

At block 425, the source/drain recesses may be formed by performing an etching process that removes upper semiconductor stack portion, intermediate layer portion, and lower semiconductor stack portion in source/drain regions of the semiconductor fin. The source/drain recesses may expose a mesa (e.g., mesa 15'). The etching process may remove some, but not all, of the mesa, such that the source/drain recesses may extend below tops of the substrate isolation structures. Each source/drain recess has respective sidewalls formed by respective remaining portions of upper semiconductor stack portion, intermediate layer portion, and lower semiconductor stack portion in channel regions of the semiconductor fin and a bottom formed by a respective mesa. The etching process is a dry etch, a wet etch, other suitable etch, or a combination thereof. In some embodiments, the etching process is a multistep etch process.

Method 400 at block 430 includes forming inner spacers (e.g., inner spacers 45). The inner spacers may be formed under the first gate spacers and the second gate spacers along sidewalls of the second semiconductor layers. The inner spacers replace portions of the second semiconductor layers under the first gate spacers and the second gate spacers, separate the first semiconductor layers from one another, and separate bottom first semiconductor layer from the mesa. Forming the inner spacers may include a first etching process, a deposition process, and a second etching process. The first etching process selectively etches the second semiconductor layers with negligible etching of the first semiconductor layers and the mesa. The first etching process is configured to laterally etch the second semiconductor layers to reduce lengths thereof along the x-direction, thereby forming gaps between the first semiconductor layers and between the mesas and the first semiconductor layers. In some embodiments, the gaps laterally extend under the first dummy gate and/or the second dummy gate. The deposition process forms a spacer layer that at least partially fills (and may completely fill) the gaps, and the second etching process selectively etches the spacer layer with negligible etching of the first semiconductor layer and the mesas, such that remainders of the spacer layer form the inner spacers. In some embodiments, the spacer layer (and thus the inner spacer) includes a dielectric material. In some embodiments, the inner spacers have a multilayer structure and/or air gaps.

At block 435, method 400 includes forming epitaxial source/drain stacks in the source/drain recesses. Each epitaxial source/drain stack includes an upper epitaxial source/drain (e.g., a respective epitaxial source/drain 62U) and a lower epitaxial source/drain (e.g., a respective epitaxial source/drain 62L) separated by a source/drain isolation structure (e.g., isolation structure 18). Epitaxial source/drain stacks may be formed by filling a bottom/lower portion of the source/drain recesses with one or more epitaxial semiconductor materials to form the lower epitaxial source/drains adjacent to lower semiconductor stack portions, filling a middle portion of the source/drain recesses with one or more dielectric materials (e.g., CESL 70L and ILD layer 72L) to form isolation structures adjacent to intermediate layer portions, and filling a top/upper portion of the source/drain recesses with one or more epitaxial semiconductor materials to form the upper epitaxial source/drains adjacent to upper semiconductor stack portions in the channel regions. The first semiconductor layers extending between the upper epitaxial source/drains may be referred to as upper semiconductor layers (e.g., semiconductor layers 26U), the first semiconductor layers extending between the lower epitaxial source/drains may be referred to as lower semiconductor layers (e.g., semiconductor layers 26L), and the first semiconductor layers extending between the isolation structures may be referred to as middle semiconductor layers (e.g., semiconductor layers 26M). The lower epitaxial source/drains and the upper epitaxial source/drains are formed by any suitable epitaxial deposition and/or growth process. The isolation structures may be formed by depositing a CESL (e.g., CESL 70L) over the lower epitaxial source/drains, depositing an ILD layer (e.g., ILD layer 72L) over the CESL, and etching back the CESL and/or the ILD layer to expose the first semiconductor layers that will provide upper channels (e.g., semiconductor layers 26U).

Method 400 at block 440 includes forming a dielectric layer (e.g., CESL 70U and ILD layer 72U) over the epitaxial source/drain stacks, the first gate structure, and the second gate structure. Method 400 may proceed with performing a gate replacement process, such as a process that replaces the first dummy gate and the second dummy gate with respective metal gates (e.g., high-k/metal gates). At block 445, method 400 includes removing the first dummy gate and the second dummy gate to form a first gate opening and a second gate opening, respectively. The first gate opening exposes the first channel region, and the second gate opening exposes the second channel region. At block 450, method 400 may include performing a channel release process, which may include selectively removing the second semiconductor layers of the upper semiconductor stack portions and the lower semiconductor stack portions of the first channel region and the second channel region exposed by the first gate opening and the second gate opening. Removing the second semiconductor layers may form gaps/openings between the first semiconductor layers and between the first semiconductor layers and the mesa, such that the first semiconductor layers (e.g., semiconductor layers 26U, semiconductor layers 26L, and semiconductor layers 26M) are suspended over the mesa. In some embodiments, the intermediate layer is a sacrificial layer, and the sacrificial layer is selectively removed and replaced with an isolation structure before or after the channel release process. In some embodiments, the intermediate layer is a sacrificial layer, the sacrificial layer is selectively removed and replaced with an isolation structure before forming the epitaxial source/drain stacks, such as before or after forming the inner spacers. In some embodiments, the intermediate layer is an isolation structure, such as where the upper semiconductor stack and the lower semiconductor stack are bonded and/or attached by one or more isolation layers.

At block 455, method 400 includes forming a first gate stack (e.g., gate 90A) and a second gate stack (e.g., gate 90B) in the first gate opening and the second gate opening, respectively. The first gate stack may include an upper gate stack (e.g., gate stack 90U-1) and a lower gate stack (e.g., gate stack 90L-1) separated by middle, dummy semiconductor layers (e.g., semiconductor layers 26M) and an isolation structure (e.g., isolation structure 17). The second gate stack may include an upper gate stack (e.g., gate stack 90U-2) and a lower gate stack (e.g., gate stack 90L-2) separated by middle, dummy semiconductor layers (e.g., semiconductor layers 26M) and an isolation structure (e.g., isolation structure 17). In some embodiments, method 400 implements block 320 of method 300 to form the first gate stack and the second gate stack, which provides gate dielectrics of the upper gate stack of the first gate stack, the lower gate stack of the first gate stack, the upper gate stack of the second gate stack, and the lower gate stack of the second gate stack with different compositions. For example, the gate dielectrics thereof (e.g., high-k dielectric layers thereof) have different nitrogen concentrations and different dipole dopant concentrations, which provides the stacked device structure with four transistors having different threshold voltages. In some embodiments, method 400 further includes recessing and/or etching back the first gate stack and the second gate stack, such that top surfaces of thereof are lower than top surface of the dielectric layer (e.g., ILD layer 72U and/or CESL 70U), and forming hard masks (e.g., hard masks 92) over the first gate stack and the second gate stack. The hard masks may be formed by depositing a hard mask material that fills recesses formed over the recessed gate stacks (e.g., having sidewalls formed by respective gate spacers and bottoms formed by a respective gate stack) and planarizing the hard mask material.

At block 460, method 400 may include forming interconnects, such as gate contacts and/or source/drain contacts. For example, upper source/drain contacts may be formed in the dielectric layer (e.g., ILD layer 72U and/or CESL 70U) on upper epitaxial source/drains (e.g., epitaxial source/drains 62U) and lower source/drain contacts may be formed on lower epitaxial source/drains (e.g., epitaxial source/drains 62L). In some embodiments, a source/drain via may be formed that electrically connects a respective upper epitaxial source/drain and a respective lower epitaxial source/drain. In such embodiments, the source/drain via may be physically and/or electrically connected to an upper source/drain contact formed on the respective upper epitaxial source/drain and a lower source/drain contact formed on the respective lower epitaxial source/drain. Forming the source/drain contacts may include forming source/drain contact openings in the dielectric layer (or substrate) that expose upper epitaxial source/drain (or lower epitaxial source/drains) and forming at least one electrically conductive layer in the source/drain contact openings. In some embodiments, forming the source/drain contact openings includes forming a patterned mask layer (e.g., an etch mask) over the dielectric layer (or substrate) and etching exposed portions of the dielectric layer (or substrate). In some embodiments, forming at least one electrically conductive layer in the source/drain contact openings includes forming metal silicide layers over the epitaxial source/drains, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of the dielectric layer and/or the gate structures. A source/drain contact may thus include a metal silicide layer, a barrier/liner layer, and a bulk metal layer.

Devices and/or structures described herein, such as stacked device structure 10, device stack 12A, device stack 12B, devices 14U, devices 14L, transistor 20U-1, transistor 20U-2, transistor 20L-1, and transistor 20L-2, etc. may be included in a microprocessor, a memory, other IC device, or a combination thereof. In some embodiments, stacked device structures described herein are a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other components, or a combination thereof.

The present disclosure provides for many different embodiments. Gate stack (e.g., high-k/metal gate) fabrication methods that implement volume-less dipole engineering process are described herein and provide numerous advantages, particularly for stacked device structures. The gate stacks disclosed herein may be implemented in a variety of device types. For example, the gate stacks described herein are suitable for planar field-effect transistors (FETs), multi-gate transistors, such as FinFETs, GAA transistors, omega-gate ($\Omega$-gate) devices, pi-gate (Π-gate) devices, or a combination thereof, as well as strained-semiconductor devices, silicon-on-insulator (SOI) devices, partially-depleted SOI devices, fully-depleted SOI devices, other devices, or a combination thereof. The present disclosure further contemplates that one of ordinary skill may recognize other semiconductor devices, such as capacitors, that can benefit from the material layer stacks and dipole engineering techniques described herein.

An exemplary method includes forming a first semiconductor layer stack having a first upper semiconductor layer over a first lower semiconductor layer and a second semiconductor layer stack having a second upper semiconductor layer over a second lower semiconductor layer. The method further includes forming high-k dielectric layers over the first upper semiconductor layer, the second upper semiconductor layer, the first lower semiconductor layer, and the second lower semiconductor layer. The high-k dielectric layers have a same composition. The method further includes performing a dipole engineering process to cause the high-k dielectric layers to have different compositions. The dipole engineering process includes a nitrogen-containing thermal drive-in process and, after the dipole engineering process, at least two of the high-k dielectric layers have different dipole dopant concentrations and at least two of the high-k dielectric layers have different nitrogen concentrations.

In some embodiments, performing the nitrogen-containing thermal drive-in process includes performing an $NH_3/N_2$ spike anneal. In some embodiments, performing the nitrogen-containing thermal drive-in process includes performing an $NH_3/N_2$ soak anneal. In some embodiments the method further includes further comprising performing a nitrogen-containing thermal treatment after performing the nitrogen-containing thermal drive-in process, wherein the nitrogen-containing thermal treatment and the nitrogen-containing thermal drive-in process are performed in different nitrogen-containing ambient.

In some embodiments, the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer, and performing the nitrogen-containing thermal drive-in process may include diffusing dipole dopant from a dipole dopant source layer into a first two of the first high-k dielectric layer, the second high-k dielectric layer, the third high-k dielectric layer, and the fourth high-k dielectric layer, and diffusing nitrogen into a second two of the first high-k dielectric layer, the second high-k dielectric layer, the third high-k dielectric layer, and the fourth high-k dielectric layer.

In some embodiments, the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer, and performing the dipole engineering process may include forming an n-dipole dopant source layer over the third high-k dielectric layer and the fourth high-k dielectric layer. The dipole engineering process may further include, after forming a mask over the second high-k dielectric layer and the fourth high-k dielectric layer, performing the nitrogen-containing thermal drive-in process to diffuse n-dipole dopant from the n-dipole dopant source layer into the third high-k dielectric layer and the fourth high-k dielectric layer and nitrogen into the first high-k dielectric layer and the third high-k dielectric layer. The dipole engineering process may further include removing the mask and the n-dipole dopant source layer.

In some embodiments, the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer, and performing the dipole engineering process may include forming a p-dipole dopant source layer over the first high-k dielectric layer and the second high-k dielectric layer. The dipole engineering process may further include, after forming a mask over the second high-k dielectric layer and the fourth high-k dielectric layer, performing the nitrogen-containing thermal drive-in process to diffuse p-dipole dopant from the p-dipole dopant source layer into the first high-k dielectric layer and the second high-k dielectric layer and nitrogen into the first high-k dielectric layer and the third high-k dielectric layer. The dipole engineering process may further include removing the mask and the p-dipole dopant source layer.

In some embodiments, the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer, and the method includes forming a work function layer over the first high-k dielectric layer, the second high-k dielectric layer, the third high-k dielectric layer, and the fourth high-k dielectric layer.

In some embodiments, the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer, and the method includes forming a first work function layer over the first high-k dielectric layer and the second high-k dielectric layer, and forming a second work function layer over the third high-k dielectric layer and the fourth high-k dielectric layer. The first work function layer and the second work function layer may include different type work function materials.

Another exemplary method includes forming a first channel stack having a first channel layer over a second channel layer and a second channel stack having a third channel layer over a fourth channel layer. The method further includes forming a first high-k dielectric layer over the first channel layer, a second high-k dielectric layer over the second channel layer, a third high-k dielectric layer over the third channel layer, and a fourth high-k dielectric layer over the fourth channel layer. The method further includes forming a dipole dopant source layer over the first high-k dielectric layer and the third high-k dielectric layer or the second high-k dielectric layer and the fourth high-k dielectric layer. The method further includes, after forming a nitrogen-blocking mask over the second high-k dielectric layer and the fourth high-k dielectric layer, performing a nitrogen-containing thermal drive-in process. The method further includes, after removing the nitrogen-blocking mask and the dipole dopant source layer, forming a work function layer over the first high-k dielectric layer, the second high-k dielectric layer, the third high-k dielectric layer, and the fourth high-k dielectric layer.

In some embodiments, the nitrogen-containing thermal drive-in process is an anneal process performed in an ambient that includes $NH_3$ and $N_2$. In some embodiments, the method further includes performing a nitrogen-containing thermal treatment before forming the work function layer. The nitrogen-containing thermal treatment and the nitrogen-containing thermal drive-in process are performed in different nitrogen-containing ambient.

In some embodiments, the dipole dopant source layer is an n-dipole dopant source layer. In such embodiments, forming the dipole dopant source layer may include forming the n-dipole dopant source layer over the first high-k dielectric layer, the second high-k dielectric layer, the third high-k dielectric layer, and the fourth high-k dielectric layer; forming a patterning layer that covers the n-dipole dopant source layer over the second high-k dielectric layer and the fourth high-k dielectric layer; removing the n-dipole dopant source layer from over the first high-k dielectric layer and the third high-k dielectric layer; and removing the patterning layer.

In some embodiments, the dipole dopant source layer is a p-dipole dopant source layer. In such embodiments, forming the dipole dopant source layer may include forming a patterning layer that covers the second high-k dielectric layer and the fourth high-k dielectric layer; forming the p-dipole dopant source layer over the first high-k dielectric layer and the third high-k dielectric layer; and removing the patterning layer.

In some embodiments, forming the work function layer includes forming a first work function layer over the first high-k dielectric layer and the third high-k dielectric layer and forming a second work function layer over the second high-k dielectric layer and the fourth high-k dielectric layer. In such embodiments, the first work function layer and the second work function layer may include different type work function materials.

An exemplary stacked device structure includes a first transistor stack having a first transistor disposed over a second transistor and a second transistor stack having a third transistor disposed over a fourth transistor. The first transistor has a first gate stack having a first gate dielectric and a first gate electrode. The second transistor has a second gate stack having a second gate dielectric and a second gate electrode. The third transistor has a third gate stack having a third gate dielectric and a third gate electrode. The fourth transistor has a fourth gate stack having a fourth gate dielectric and a fourth gate electrode. The first gate dielectric is different than the third gate dielectric at least in nitrogen concentration and the second gate dielectric is different than the fourth gate dielectric in at least nitrogen concentration.

In some embodiments, the first gate dielectric is different than the second gate dielectric at least in n-dipole dopant concentration and the third gate dielectric is different than the fourth gate dielectric in at least in n-dipole dopant concentration. In some embodiments, the first gate dielectric is different than the second gate dielectric at least in p-dipole dopant concentration and the third gate dielectric is different than the fourth gate dielectric in at least in p-dipole dopant concentration. In some embodiments, the first gate electrode and the second gate electrode include a first work function layer, and the third gate electrode and the fourth gate electrode include a second work function layer. In some embodiments, the first work function layer and the second work function layer may include a same type work function material. In some embodiments, the first work function layer and the second work function layer include different type work function materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first semiconductor layer stack having a first upper semiconductor layer over a first lower semiconductor layer and a second semiconductor layer stack having a second upper semiconductor layer over a second lower semiconductor layer;
   forming high-k dielectric layers over the first upper semiconductor layer, the second upper semiconductor layer, the first lower semiconductor layer, and the second lower semiconductor layer, wherein the high-k dielectric layers have a same composition; and
   performing a dipole engineering process to cause the high-k dielectric layers to have different compositions, wherein the dipole engineering process includes a nitrogen-containing thermal drive-in process and, after the dipole engineering process, at least two of the high-k dielectric layers have different dipole dopant concentrations and at least two of the high-k dielectric layers have different nitrogen concentrations.

2. The method of claim 1, wherein:
   the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer; and
   the performing the nitrogen-containing thermal drive-in process includes:
      diffusing dipole dopant from a dipole dopant source layer into a first two of the first high-k dielectric layer, the second high-k dielectric layer, the third high-k dielectric layer, and the fourth high-k dielectric layer, and
      diffusing nitrogen into a second two of the first high-k dielectric layer, the second high-k dielectric layer, the third high-k dielectric layer, and the fourth high-k dielectric layer.

3. The method of claim 1, wherein the performing the nitrogen-containing thermal drive-in process includes performing an $NH_3/N_2$ spike anneal.

4. The method of claim 1, wherein the performing the nitrogen-containing thermal drive-in process includes performing an $NH_3/N_2$ soak anneal.

5. The method of claim 1, further comprising performing a nitrogen-containing thermal treatment after performing the nitrogen-containing thermal drive-in process, wherein the nitrogen-containing thermal treatment and the nitrogen-containing thermal drive-in process are performed in different nitrogen-containing ambient.

6. The method of claim 1, wherein:
   the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer; and
   the performing the dipole engineering process includes:
      forming an n-dipole dopant source layer over the third high-k dielectric layer and the fourth high-k dielectric layer,
      after forming a mask over the second high-k dielectric layer and the fourth high-k dielectric layer, performing the nitrogen-containing thermal drive-in process to diffuse n-dipole dopant from the n-dipole dopant source layer into the third high-k dielectric layer and the fourth high-k dielectric layer and nitrogen into the first high-k dielectric layer and the third high-k dielectric layer, and removing the mask and the n-dipole dopant source layer.

7. The method of claim 1, wherein:

the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer; and the performing the dipole engineering process includes:
forming a p-dipole dopant source layer over the first high-k dielectric layer and the second high-k dielectric layer, after forming a mask over the second high-k dielectric layer and the fourth high-k dielectric layer, performing the nitrogen-containing thermal drive-in process to diffuse p-dipole dopant from the p-dipole dopant source layer into the first high-k dielectric layer and the second high-k dielectric layer and nitrogen into the first high-k dielectric layer and the third high-k dielectric layer, and removing the mask and the p-dipole dopant source layer.

8. The method of claim 1, wherein:

the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer; and the method further includes forming a work function layer over the first high-k dielectric layer, the second high-k dielectric layer, the third high-k dielectric layer, and the fourth high-k dielectric layer.

9. The method of claim 1, wherein:

the high-k dielectric layers include a first high-k dielectric layer over the first upper semiconductor layer, a second high-k dielectric layer over the second upper semiconductor layer, a third high-k dielectric layer over the first lower semiconductor layer, and a fourth high-k dielectric layer over the second lower semiconductor layer; and the method further includes:
forming a first work function layer over the first high-k dielectric layer and the second high-k dielectric layer, and forming a second work function layer over the third high-k dielectric layer and the fourth high-k dielectric layer, wherein the first work function layer and the second work function layer include different type work function materials.

10. A method comprising:

forming a first channel stack having a first channel layer over a second channel layer and a second channel stack having a third channel layer over a fourth channel layer;

forming a first high-k dielectric layer over the first channel layer, a second high-k dielectric layer over the second channel layer, a third high-k dielectric layer over the third channel layer, and a fourth high-k dielectric layer over the fourth channel layer;

forming a dipole dopant source layer over the first high-k dielectric layer and the third high-k dielectric layer or the second high-k dielectric layer and the fourth high-k dielectric layer;

after forming a nitrogen-blocking mask over the second high-k dielectric layer and the fourth high-k dielectric layer, performing a nitrogen-containing thermal drive-in process; and after removing the nitrogen-blocking mask and the dipole dopant source layer, forming a work function layer over the first high-k dielectric layer, the second high-k dielectric layer, the third high-k dielectric layer, and the fourth high-k dielectric layer.

11. The method of claim 10, further comprising performing a nitrogen-containing thermal treatment before forming the work function layer, wherein the nitrogen-containing thermal treatment and the nitrogen-containing thermal drive-in process are performed in different nitrogen-containing ambient.

12. The method of claim 10, wherein the dipole dopant source layer is an n-dipole dopant source layer and the forming the dipole dopant source layer includes:

forming the n-dipole dopant source layer over the first high-k dielectric layer, the second high-k dielectric layer, the third high-k dielectric layer, and the fourth high-k dielectric layer;

forming a patterning layer that covers the n-dipole dopant source layer over the second high-k dielectric layer and the fourth high-k dielectric layer;

removing the n-dipole dopant source layer from over the first high-k dielectric layer and the third high-k dielectric layer; and removing the patterning layer.

13. The method of claim 10, wherein the dipole dopant source layer is a p-dipole dopant source layer and the forming the dipole dopant source layer includes:

forming a patterning layer that covers the second high-k dielectric layer and the fourth high-k dielectric layer;

forming the p-dipole dopant source layer over the first high-k dielectric layer and the third high-k dielectric layer; and removing the patterning layer.

14. The method of claim 10, wherein the forming the work function layer includes:

forming a first work function layer over the first high-k dielectric layer and the third high-k dielectric layer; and forming a second work function layer over the second high-k dielectric layer and the fourth high-k dielectric layer, wherein the first work function layer and the second work function layer include different type work function materials.

15. The method of claim 10, wherein the nitrogen-containing thermal drive-in process is an anneal process performed in an ambient that includes $NH_3$ and $N_2$.

16. A method comprising:

forming a first gate dielectric over a first channel layer of a first upper transistor, a second gate dielectric over a second channel layer of a first lower transistor, a third gate dielectric over a third channel layer of a second upper transistor, and a fourth gate dielectric over a fourth channel layer of a second lower transistor, wherein the first upper transistor is disposed above the first lower transistor and the second upper transistor is disposed above the second lower transistor;

forming a dipole dopant source layer over the first gate dielectric and the third gate dielectric or the second gate dielectric and the fourth gate dielectric;

after forming a mask over the second gate dielectric and the fourth gate dielectric, performing an anneal process in a nitrogen ambient; and after removing the mask and the dipole dopant source layer, forming a work function layer over the first gate dielectric, the second gate dielectric, the third gate dielectric, and the fourth gate dielectric.

17. The method of claim 16, wherein the anneal process is a first anneal process, the nitrogen ambient is a first nitrogen ambient, and the method further includes, after removing the mask and the dipole dopant source layer and before forming the work function layer, performing a second anneal process in a second nitrogen ambient, wherein the second nitrogen ambient is different than the first nitrogen ambient.

18. The method of claim 17, wherein the first nitrogen ambient includes $NH_3$ and $N_2$ and the second nitrogen ambient includes $N_2$ but not $NH_3$.

19. The method of claim 16, wherein the forming the dipole dopant source layer over the first gate dielectric and the third gate dielectric or the second gate dielectric and the fourth gate dielectric includes:

forming a metal oxide layer over the first gate dielectric, the second gate dielectric, the third gate dielectric, and the fourth gate dielectric; and removing the metal oxide layer from over the first gate dielectric and the third gate dielectric or from over the second gate dielectric and the fourth gate dielectric.

20. The method of claim 16, further comprising removing a first dummy gate to expose the first channel layer and the second channel layer and removing a second dummy gate to expose the third channel layer and the fourth channel layer.

\* \* \* \* \*